(12) United States Patent
Musashi et al.

(10) Patent No.: US 10,978,625 B2
(45) Date of Patent: *Apr. 13, 2021

(54) METHOD FOR FORMING LIGHT-TRANSMISSIVE MEMBER, METHOD FOR PRODUCING LIGHT EMITTING DEVICE, AND LIGHT EMITTING DEVICE

(71) Applicant: NICHIA CORPORATION, Anan (JP)

(72) Inventors: Naoki Musashi, Anan (JP); Takayoshi Wakaki, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,653

(22) Filed: May 24, 2019

(65) Prior Publication Data

US 2019/0363226 A1 Nov. 28, 2019

(30) Foreign Application Priority Data

May 25, 2018 (JP) .............................. JP2018-100288

(51) Int. Cl.
*H01L 33/56* (2010.01)
*H01L 33/52* (2010.01)
*G03F 7/20* (2006.01)

(52) U.S. Cl.
CPC .......... *H01L 33/52* (2013.01); *G03F 7/70016* (2013.01); *H01L 2933/005* (2013.01)

(58) Field of Classification Search
CPC ......... H01L 33/52; H01L 33/58; H01L 33/54; H01L 33/56; H01L 33/486; H01L 2933/0033; H01L 33/44; H01L 2933/0058; H01L 2933/0041; H01L 2933/0091; H01L 25/0753; H01L 2933/005; H01L 33/505; H01L 2933/0083; H01L 33/62; H01L 24/95–97; H01L 2224/95–97; G03F 7/70016; G03F 1/22

See application file for complete search history.

(56) References Cited

U.S. PATENT DOCUMENTS

| | | | |
|---|---|---|---|
| 8,852,694 B2 | 10/2014 | Crosby et al. | |
| 8,852,695 B2 | 10/2014 | Huang et al. | |
| 9,810,381 B2 * | 11/2017 | Togawa | ................... F21V 7/00 |
| 2003/0024103 A1 | 2/2003 | Kiguchi et al. | |
| 2007/0212802 A1 * | 9/2007 | Lee | ......................... H01L 33/54 |
| | | | 438/22 |

(Continued)

FOREIGN PATENT DOCUMENTS

| | | | |
|---|---|---|---|
| JP | 2004-123816 A | 4/2004 | |
| JP | 2005-254033 A | 9/2005 | |

(Continued)

*Primary Examiner* — Bitew A Dinke
(74) *Attorney, Agent, or Firm* — Foley & Lardner LLP

(57) ABSTRACT

A method for forming a light-transmissive member includes irradiating a principal surface of a cured resin body containing a silicone resin with ultraviolet rays through a photomask comprising one or more light-blocking regions and one or more light-transmissive regions, so as to cause a height of one or more first regions of the principal surface, which correspond to the one or more light-blocking regions of the photomask, to be different than a height of one or more second regions of the principal surface, which correspond to the one or more light-transmissive regions of the photomask.

21 Claims, 31 Drawing Sheets

(56) References Cited

U.S. PATENT DOCUMENTS

| | | |
|---|---|---|
| 2008/0076882 A1 | 3/2008 | Ozai |
| 2009/0052048 A1 | 2/2009 | Hamada |
| 2012/0235177 A1* | 9/2012 | Naka .................. H01L 33/508 257/88 |
| 2013/0187176 A1 | 7/2013 | Ko et al. |
| 2013/0221389 A1* | 8/2013 | Yamamuro ............ H01L 33/50 257/98 |
| 2014/0008685 A1 | 1/2014 | Basin et al. |
| 2015/0147828 A1* | 5/2015 | Akimoto ............ H01L 33/0008 438/7 |
| 2015/0191693 A1 | 7/2015 | Ameringer et al. |
| 2016/0093781 A1* | 3/2016 | Tamaki ................. H01L 24/97 257/98 |
| 2016/0229132 A1 | 8/2016 | Risser |
| 2016/0351760 A1* | 12/2016 | Hayashi ................ H01L 33/48 |
| 2016/0351762 A1* | 12/2016 | Sato ...................... H01L 33/54 |
| 2017/0062671 A1* | 3/2017 | Hashimoto ........... H01L 33/005 |
| 2017/0067620 A1 | 3/2017 | Sano et al. |
| 2017/0125649 A1* | 5/2017 | Sato ...................... H01L 33/58 |
| 2017/0152419 A1 | 6/2017 | Rantala et al. |
| 2017/0222106 A1* | 8/2017 | Nakabayashi ......... H01L 33/54 |
| 2018/0040775 A1* | 2/2018 | Wakamatsu .......... H01L 33/38 |
| 2018/0123005 A1* | 5/2018 | Ozeki ................... H01L 33/60 |
| 2019/0051800 A1 | 2/2019 | Lin et al. |
| 2019/0198738 A1* | 6/2019 | Nakabayashi ........ H01L 33/486 |
| 2019/0259926 A1* | 8/2019 | Musashi ................ H01L 33/58 |
| 2019/0305177 A1* | 10/2019 | Takamatsu ............ H01L 33/60 |
| 2020/0010747 A1* | 1/2020 | French ................. C09K 3/1018 |
| 2020/0109285 A1* | 4/2020 | Chen .................... C08K 5/5397 |

FOREIGN PATENT DOCUMENTS

| | | |
|---|---|---|
| JP | 2007-227926 A | 9/2007 |
| JP | 2008-074982 A | 4/2008 |
| JP | 2009-173748 A | 8/2009 |
| JP | 2002-261048 A | 9/2009 |
| JP | 201159196 A * | 3/2011 |
| JP | 2011059196 A * | 3/2011 |
| JP | 5374021 B2 | 12/2013 |
| JP | 2014-509089 | 4/2014 |
| JP | 2015-028991 A | 2/2015 |
| JP | 2015-028992 A | 2/2015 |
| JP | 2015-527428 A | 9/2015 |
| JP | 2015-192066 A | 11/2015 |
| JP | 2015-192103 A | 11/2015 |
| JP | 2016-001639 A | 1/2016 |
| JP | 2016-047927 A | 4/2016 |
| JP | 2016-194573 A | 11/2016 |
| JP | 2017-032806 A | 2/2017 |
| JP | 2017-054102 A | 3/2017 |
| JP | 2017-525834 A | 9/2017 |
| JP | 2018-041858 A | 3/2018 |
| WO | WO-2006/046699 A1 | 5/2006 |
| WO | WO-2017/080461 A1 | 5/2017 |

* cited by examiner

METHOD FOR FORMING LIGHT-TRANSMISSIVE MEMBER, METHOD FOR PRODUCING LIGHT EMITTING DEVICE, AND LIGHT EMITTING DEVICE

CROSS-REFERENCE TO RELATED APPLICATION

This application claims priority to Japanese Patent Application No. 2018-100288, filed on May 25, 2018, the disclosure of which is hereby incorporated by reference in its entirety.

BACKGROUND

The present disclosure relates to a method for forming a light-transmissive member, a method for producing a light emitting device, and a light emitting device.

As a technology for forming a microscopic concave and convex pattern, an imprint method of transferring a surface shape of a die having a microscopic concave and convex pattern to a layer formed of a resin material is known. The target to which such a shape is transferred by the imprint method is formed of a thermoplastic resin or an ultraviolet-curable resin. In the case of the former, the die is pressed onto a thermoplastic resin target, the thermoplastic resin target is heated to be cured, and the thermoplastic resin target is separated from the die. In the case of the latter, a die that transmits ultraviolet rays is pressed onto an ultraviolet-curable resin target, the ultraviolet-curable resin target is irradiated with ultraviolet rays through the die to be cured, and the ultraviolet-curable resin target is separated from the die.

As disclosed in Japanese Patent Publication No. 2017-032806, the imprint method is used to, for example, form an antireflection film for a display device. The imprint method is also used to produce a thin film polarizer or the like. The imprint method is used to form a resist pattern used for etching. Japanese Patent Publication No. 2016-001639 describes that the imprint method is usable to form a mask used to form a frustum, conical or pyramid shape at a surface of a semiconductor stack body including an n-type semiconductor layer and a p-type semiconductor layer. As can be seen, the imprint method is expected to be used to form a concave and convex pattern in order to improve the light extraction efficiency in a light emitting element such as a light emitting diode (LED) or the like, an organic EL light emitting device and the like.

SUMMARY

With the imprint method, a microscopic concave and convex pattern is formed. However, the target at which such a pattern may be formed is currently limited to a thermoplastic resin or an ultraviolet-curable resin in an uncured state.

In one general aspect, a method for forming a light-transmissive member disclosed herein comprises a step of irradiating a principal surface of a cured resin body containing a silicone resin with ultraviolet rays through a photomask including one or more light-blocking regions and a light-transmissive region to cause first regions, of the principal surface, that corresponds to the light-blocking regions of the photomask, and a second region, of the principal surface, that corresponds to the light-transmissive region of the photomask, to have different heights from each other.

In another general aspect, a method for producing a light emitting device disclosed herein comprises a step (a) comprising preparing a light emitting body comprising a light emitting element having a top surface and a light-transmissive resin body formed by curing an uncured silicone resin starting material, the resin body having a principal surface and covering at least the top surface of the light emitting element; and a step (b) comprising forming a light-transmissive member covering at least the top surface of the light emitting element, the light-transmissive member comprising concave and convex pattern at a surface thereof. The step (b) comprises a step (b1) comprising irradiating the principal surface of the resin body with ultraviolet rays through a photomask including one or more light-blocking regions and a light-transmissive region to cause first regions, of the principal surface, that corresponds to the light-blocking regions of the photomask, and a second region, of the principal surface, that corresponds to the light-transmissive region of the photomask, to have different heights from each other.

In still another general aspect, a method for producing a light emitting device disclosed herein comprises a step (a) comprising preparing a light emitting element having a top surface and including a positive electrode and a negative electrode at the opposite side of the top surface; and a step (b) comprising forming a light-transmissive member covering at least the top surface of the light emitting element, the light-transmissive member comprising a concave and convex pattern at a surface thereof. The step (b) comprises a step (b1) of irradiating a surface of a light-transmissive resin body, formed by curing an uncured silicone resin starting material, with ultraviolet rays through a photomask including one or more light-blocking regions and a light-transmissive region to cause first regions, of the surface, that corresponds to the light-blocking regions of the photomask, and a second region, of the surface, that corresponds to the light-transmissive region of the photomask, to have different heights from each other.

In still another general aspect, a method for producing a light emitting device disclosed herein comprises a step (a) comprising preparing a light emitting element having a top surface and including a positive electrode and a negative electrode at the opposite side of the top surface; and a step (b) comprising forming a light-transmissive member covering at least the top surface of the light emitting element, the light-transmissive member comprising a concave and convex pattern at a surface thereof. The step (b) comprises a step (b1) comprising irradiating a principal surface of a light-transmissive sheet, formed by curing an uncured silicone resin starting material, with ultraviolet rays through a photomask including one or more light-blocking regions and a light-transmissive region to cause first regions, of the principal surface, that corresponds to the light-blocking regions of the photomask, and a second region, of the principal surface, that corresponds to the light-transmissive region of the photomask, to have different heights from each other; and a step (b2) comprising locating the light-transmissive sheet irradiated with the ultraviolet rays on the side of the top surface of the light emitting element.

In still another general aspect, a light emitting device disclosed herein comprises a light emitting element having a top surface; and a light-transmissive member covering at least the top surface of the light emitting element, the light-transmissive member having a principal surface located above the top surface of the light emitting element. The principal surface of the light-transmissive member comprises a concave and convex pattern. An absorption, derived from Si—OH, appearing in an absorption spectrum by the light-transmissive member, in a wave number range greater than 3700 cm$^{-1}$ and less than 3000 cm$^{-1}$ is larger than an absorption in the wave number range of an absorption spectrum by a silicone resin; and absorption peaks, derived from by Si—CH$_3$, appearing in the absorption spectrum by the light-transmissive member, at a wave number of 2960 cm$^{-1}$ or in the vicinity thereof and at a wave number of 800 cm$^{-1}$ or in the vicinity thereof are respectively lower than absorption peaks appearing in the absorption spectrum by the silicone resin, at a wave number of 2960 cm$^{-1}$ or in the vicinity thereof and at a wave number of 800 cm$^{-1}$ or in the vicinity thereof, the absorption spectra being obtained by infrared spectroscopy.

In still another general aspect, a light emitting device disclosed herein comprises a light emitting element having a top surface; and a light-transmissive member covering at least the top surface of the light emitting element, the light-transmissive member having a principal surface located above the top surface of the light emitting element. The principal surface of the light-transmissive member comprises a concave and convex pattern. A tackiness of the principal surface of the light-transmissive member is lower than a tackiness of a silicone resin.

According to the above aspects, novel methods for forming a microscopic concave and convex pattern are provided.

DETAILED DESCRIPTION

Figure 1:
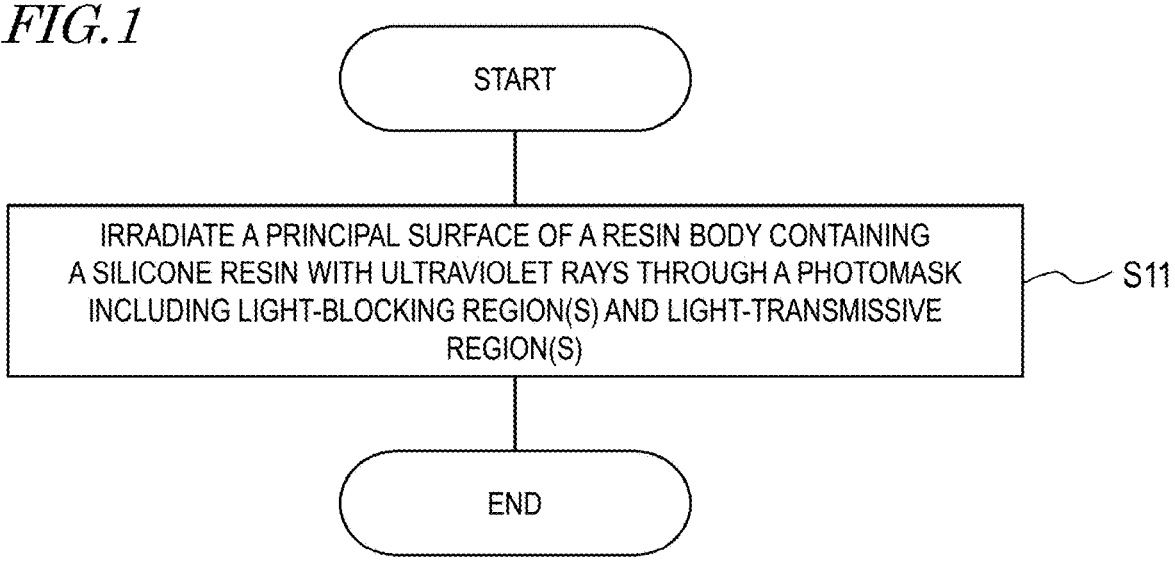
FIG. 1 is a flowchart showing an overview of a method for forming a light-transmissive member in embodiment 1 according to the present disclosure.

Hereinafter, embodiments of the present disclosure will be described in detail with reference to the attached drawings. The following embodiments are illustrative, and the method for forming a light-transmissive member and the method for producing a light emitting device according to the present disclosure are not limited to any of the following embodiments. For example, the numerical values, shapes, materials, steps, the order of the steps, and the like shown in the embodiments are merely examples, and may be modified in various manners as long as no technological contradiction occurs.

In the drawings, the sizes, shapes and the like of the components may be emphasized for clear illustration, and may not reflect the sizes, shapes and size relationship of components of the actual light-transmissive member, light emitting device and production device. Some of the components may be omitted in order to avoid the drawings from being excessively complicated.

In the following description, components having substantially the same functions will be represented by the same reference numeral, and the descriptions thereof may be omitted. In the following description, terms showing specific directions or positions (e.g., "top", "above", "bottom", "below", "right", "left" and terms including these terms) may be used. These terms are merely used to show relative directions or positions in referenced drawing, for easier understanding. The components merely need to be arranged in the directional and positional relationship as described by use of the terms "top", "above", "below", "bottom" and the like with reference to a drawing in the present disclosure. In any drawing other than those in the present disclosure, an actual product, an actual production device or the like, the components do not need to be located as exactly shown in a drawing in the present disclosure. In the present disclosure, the term "parallel" encompasses a case in which two straight lines, sides, planes or the like make an angle in the range of approximately 0°±5° unless otherwise specified. In the present disclosure, the terms "vertical" and "perpendicular" encompass a case in which two straight lines, sides, planes or the make an angle in the range of approximately 90°±5° unless otherwise specified.

Embodiment 1

Figure 2:
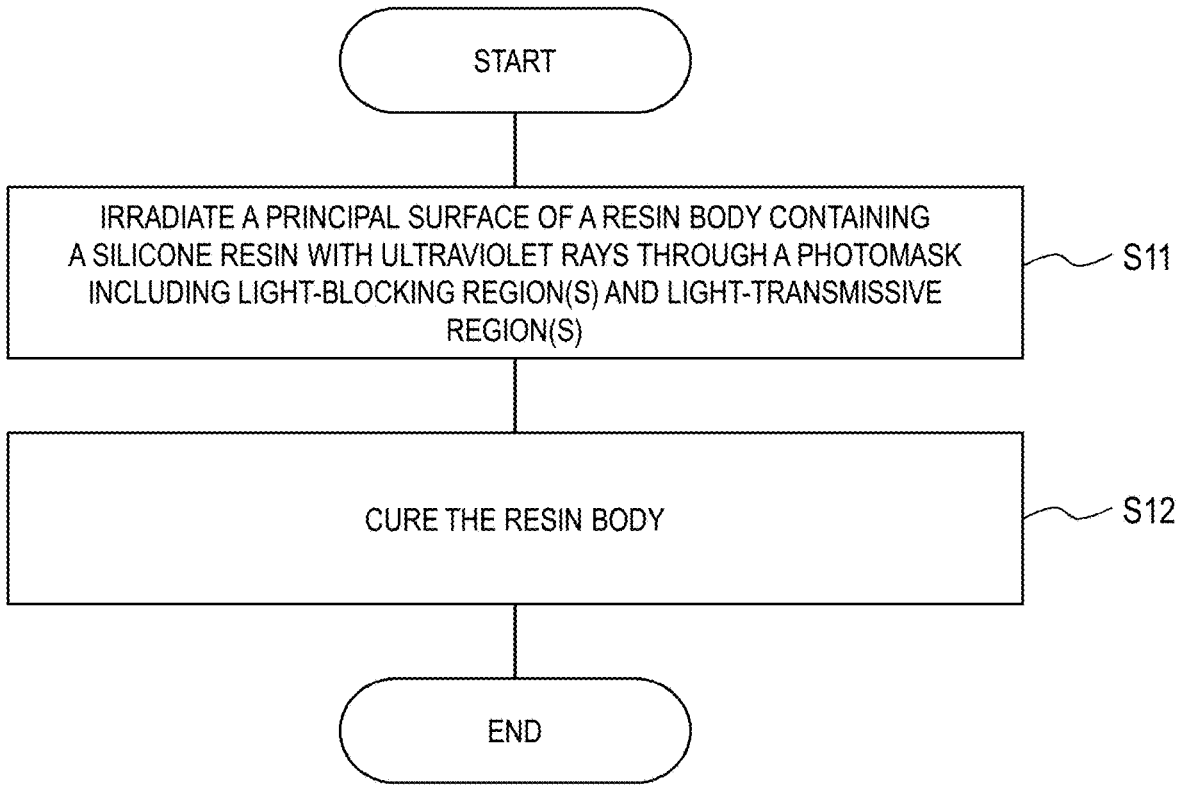
FIG. 2 is a flowchart showing another example of method for forming the light-transmissive member in embodiment 1.

FIG. 1 and FIG. 2 are flowcharts showing an overview of a method for forming a light-transmissive member in embodiment 1 according to the present disclosure. The method for forming the light-transmissive member shown in FIG. 1 generally includes a step of irradiating a principal surface of a resin body containing a silicone resin with ultraviolet rays through a photomask including light-blocking region(s) and light-transmissive region(s) (step S11). As described below, a part of the principal surface of the resin body containing a silicone resin may be selectively irradiated with ultraviolet rays, whereby the height of the region, of the principal surface, irradiated with the ultraviolet rays, and the height of the region, of the principal surface, not irradiated with the ultraviolet rays, are made different from each other. Namely, a concave and convex pattern may be formed at the principal surface of the resin body basically in a non-contact manner.

The resin body as a target to be irradiated with the ultraviolet rays is basically in a cured state, more specifically, in a fully cured state (such a state is also referred to a "C-staged state" or a "totally cured state"). Alternatively, as in embodiments below, the target to be irradiated with the ultraviolet rays may be a resin in a preliminarily cured state (such a state is also referred to as a "B-staged state" or a "semi-cured state"). The flowchart shown in FIG. 1 is of an example in which the fully cured resin body is used. In this case, no further curing step is needed after the resin body is irradiated with the ultraviolet rays. The resin body may be fully cured after once being semi-cured, and then irradiated with the ultraviolet rays. By contrast, the flowchart shown in FIG. 2 is of an example in which the semi-cured resin body is used. In this case, a step of curing the resin body (step S12) is conducted after the resin body is irradiated with the ultraviolet rays, unlike in the example shown in FIG. 1. In the case in which the preliminarily cured resin body is used as shown in FIG. 2, the curing step is performed after the step of irradiating the principal surface of the resin body with the ultraviolet rays. In the case in which the fully cured resin body is used, no further curing step is needed after the step of irradiating the principal surface of the resin body with the ultraviolet rays. In this specification, the term "cure" refers to "fully cure" unless otherwise specified.

Hereinafter, a method for forming a light-transmissive member in this embodiment will be described in detail with reference to the drawings.

Figure 3:
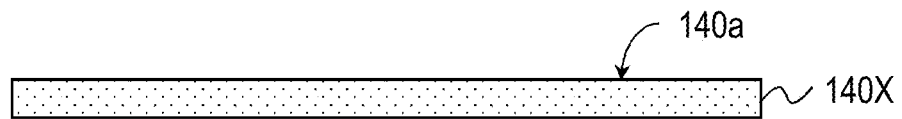
FIG. 3 is a schematic cross-sectional view showing an illustrative method for forming the light-transmissive member in embodiment 1.

First, as shown in FIG. 3, a resin body 140X is prepared. In the example shown in FIG. 3, the resin body 140X is generally plate-like, and has a flat principal surface 140a. The resin body 140X is a plate-like member in this example. Alternatively, the resin body 140X is not limited to being plate-like, and may have any shape. The principal surface 140a, which is a top surface of the resin body 140X in FIG. 3, may be flat or curved. The resin body 140X may have a thickness of, for example, about 10 μm or greater and about 500 μm or less.

The resin body 140X is light-transmissive, and after being provided with a concave and convex pattern, may be arranged on the light output side of a light emitting element, a light emitting device or the like as an optical member such as a protective member, a light diffusion member or the like. In this specification, the terms "light-transmissive" and "light transmission" are also interpreted as being capable of diffusing incident light, and is not limited to being "transparent".

The resin body 140X contains a silicone resin. The silicone resin in the resin body 140X contains an organic polysiloxane including at least one phenyl group in a molecule. Alternatively, the silicone resin in the resin body 140X contains an organic polysiloxane including a D unit, in which two methyl groups are bonded with a silicon atom. The resin body 140X may contain these two types of organic polysiloxane. The silicone resin in the resin body 140X may contain, for example, an organic polysiloxane including a phenyl group and also a D unit. The silicone resin composition used to form the resin body 140X may contain modified silicone having a group other than a methyl group or a phenyl group introduced thereto.

The resin body 140X is not limited to being substantially formed of a silicone resin, and may be a composite material containing a material other than the silicone resin. For example, the resin body 140X may include a silicone resin-containing material as a matrix and also include a light-scattering filler dispersed therein. The light-scattering filler may be formed of particles of an inorganic material or an organic material having a refractive index higher than a refractive index of the matrix. Examples of the light-scattering filler include particles of titanium dioxide, zirconium dioxide, potassium titanate, aluminum oxide, aluminum nitride, boron nitride, mullite, niobium oxide, barium sulfate, silicon oxide, various types of rare-earth oxides (e.g., yttrium oxide, gadolinium oxide, etc.), and the like. The matrix of the resin body 140X may contain a resin other than a silicone resin.

The resin body 140X may include a wavelength converting member dispersed in the resin. In the case of including a wavelength converting member, the resin body 140X absorbs at least a part of incident light and emits light having a wavelength different from a wavelength of the incident light. The wavelength converting member is typically formed of particles of a phosphor or the like. The phosphor may be a known material. Examples of the phosphor include a YAG-based phosphor; fluoride-based phosphors such as a KSF-based phosphor and the like; nitride-based phosphors such as CASN and the like; a β-SiAlON phosphor; and the like. The YAG-based phosphor is an example of wavelength converting substance that converts blue light into yellow light. The KSF-based phosphor and CASN are examples of wavelength converting substance that converts blue light into red light. The β-SiAlON phosphor is an example of wavelength converting substance that converts blue light into green light. The phosphor may be a quantum dot phosphor.

The resin body 140X may be purchased or formed. The resin body 140X may be formed by curing a silicone resin starting material containing a silicone resin put on a support. For example, the silicone resin starting material molded to have a predetermined shape such as a plate-like shape or the like may be kept at a temperature of 150° C. for 4 hours, so that a cured resin body is formed. Transfer molding, compression molding or the like may be used to form the resin body 140X. In order to form a resin body in a cured state, the silicon resin starting material is heated at a temperature of, preferably, in the range of 100° C. or higher and 200° C. or lower, and more preferably, in the range of 120° C. or higher and 180° C. or lower. The heating is performed for, preferably, 60 minutes or longer and 480 minutes or shorter, and more preferably, 120 minutes or longer and 300 minutes or shorter. These heating conditions are the same regardless of whether a resin body in a fully cured state is to be formed from an uncured silicone resin starting material or a resin body in a fully cured state is to be formed from a preliminarily cured silicone resin starting material.

The silicone resin in the resin body 140X may be in a preliminarily cured state. For example, a silicone resin starting material containing a silicone resin may be put on a support plate such as a substrate or the like by coating such as spraying, casting, potting or the like or by screen printing, and then kept at, for example, 150° C. for 0.5 hours, so that a preliminarily cured resin body is formed. In order to form a resin body in a preliminarily cured state, the silicon resin starting material is heated at a temperature of, preferably, in the range of 80° C. or higher and 200° C. or lower, and more preferably, in the range of 120° C. or higher and 180° C. or lower. The heating is performed for, preferably, 0.1 minutes or longer and 120 minutes or shorter, and more preferably, 15 minutes or longer and 45 minutes or shorter.

Figure 4:
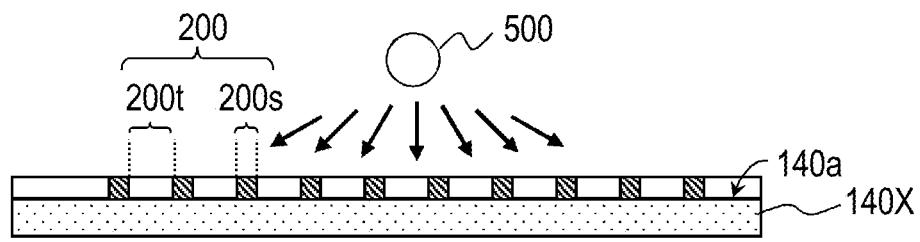
FIG. 4 is a schematic cross-sectional view showing the illustrative method for forming the light-transmissive member in embodiment 1.

Next, as shown in FIG. 4, the principal surface 140a of the resin body 140X is irradiated with ultraviolet rays through a photomask by an ultraviolet ray irradiation device 500 (step S11 in FIG. 1 or step S11 in FIG. 2). In this step, as shown in FIG. 4, a photomask 200 including one or more light-blocking regions 200s and at least one light-transmissive region 200t is used. In FIG. 4, the light-blocking regions 200s of the photomask 200 are represented by hatching. In FIG. 4, the light-transmissive region(s) 200t of the photomask 200 are white. In this example, the resin body 140X is irradiated with the ultraviolet rays in a state in which the photomask 200 is put on the principal surface 140a. Namely, FIG. 4 shows a case in which the photomask 200 and the resin body 140X are in contact with each other. It is not indispensable that the photomask 200 and the resin body 140X are in contact with each other. Namely, the photomask 200 and the resin body 140X may be separated from each other, or another light-transmissive member may be provided between the photomask 200 and the resin body 140X.

Figure 5:
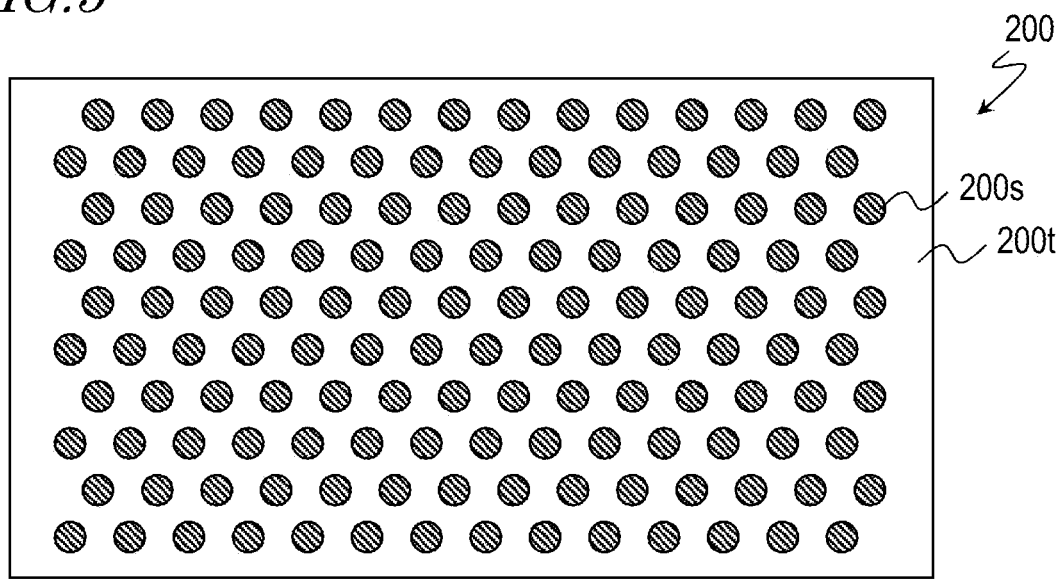
FIG. 5 is a schematic plan view showing an example of photomask 200.

FIG. 5 shows an example of photomask 200. In this example, the photomask 200 includes a plurality of circular light-blocking regions 200s. In the structure shown in FIG. 5, the plurality of circular light-blocking regions 200s are arranged two-dimensionally such that centers of the light-blocking regions 200s are located at lattice points of a triangular lattice. The photomask 200 may be formed in a manner similar to that of a known reticle (or photomask) used in a semiconductor process. For example, the photomask 200 may be formed as follows. A light-blocking film such as a chromium film or the like is formed on a surface of a glass (typically, quartz glass) sheet, a polymer film or the like, and then is patterned by, for example, photolithography to form the light-blocking regions 200s. Namely, the light-transmissive region(s) 200t are regions, of the glass sheet, the polymer film or the like acting as a support, on which the light-blocking layer of chromium or the like is not formed. The light-transmissive regions 200t are formed to transmit ultraviolet rays.

Referring to FIG. 5, the pitch of the light-blocking regions 200s, namely, the distance between centers of two light-blocking regions 200s adjacent each other, is, for example, in the range of 0.1 μm or longer and 3000 μm or shorter, preferably, in the range of 2 μm or longer and 100 μm or shorter, and more preferably, in the range of 3 μm or longer and 30 μm or shorter. The radius of each of the light-blocking regions 200s is, for example, in the range of 0.05 μm or longer and 1000 μm or shorter, preferably, in the range of 1 μm or longer and 50 μm or shorter, and more preferably, in the range of 2 μm or longer and 10 μm or shorter. Needless to say, neither the positional arrangement nor the shape of each of the light-blocking regions 200s is limited to the example shown in FIG. 5. The light-blocking regions 200s may be arranged in any manner and may have any shape. The distance between the centers of two light-blocking regions 200s adjacent each other may be the same in the entirety of the photomask 200. Alternatively, the distance between the centers of two light-blocking regions 200s adjacent each other may be optionally changed in accordance with the desired luminance distribution characteristic or the like. The plurality of light-blocking regions 200s may all have the same shape. Alternatively, the plurality of light-blocking regions 200s may include light-blocking regions 200s having a different shape or size. The plurality of light-blocking regions 200s may each have any shape or any size in accordance with the desired luminance distribution characteristic.

In FIG. 5, the photomask 200 have a rectangular external shape. The photomask 200 is not limited to having such an external shape and may be, for example, square. The size of the photomask 200 may be matched to the size of the resin body 140X. The photomask 200 is not limited to having such a size, and may have an area size larger than that of the principal surface 140a of the resin body 140X or an area size smaller than that of the principal surface 140a of the resin body 140X. In the former case, a plurality of the resin bodies 140X may be irradiated with ultraviolet rays through a single photomask 200. In the latter case, the principal surface 140a may be irradiated with ultraviolet rays a plurality of times by a step and repeat method.

The amount of irradiation in the step of irradiation with the ultraviolet rays is, for example, 20 J/cm$^2$ or greater. There is no specific limitation on the wavelength of the ultraviolet rays directed toward the resin body 140X. An ultraviolet ray irradiation device that emits ultraviolet rays having a spectrum in the wavelength range of, for example, UVA (400 to 315 nm) to UVC (280 to 140 nm) is usable. In this example, a light source that emits light having a main peak emission wavelength of 365 nm is used.

Figure 6:
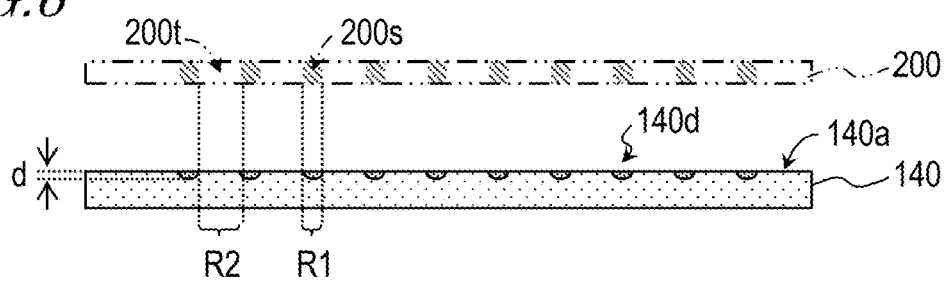
FIG. 6 is a schematic cross-sectional view showing an example of light-transmissive member 140.

As schematically shown in FIG. 6, first regions R1, of the principal surface 140a, that correspond to the light-blocking regions 200s, and second region(s) R2, of the principal surface 140a, that correspond to the light-transmissive region(s) 200t, are caused to have different heights from each other by the irradiation with the ultraviolet rays, so that the light-transmissive member 140 including a plurality of concave portions 140d at the principal surface 140a is formed. The first regions R1 are regions of the principal surface 140a that are covered with the light-blocking regions 200s and thus are blocked against the ultraviolet rays. The second region(s) R2 are region of the principal surface 140a that are irradiated with the ultraviolet rays through the light-transmissive region(s) 200t. In the case in which the resin body 140X contains a silicone resin in a preliminarily cured state, the resin body 140X is heated to be cured (step S12 in FIG. 2) after the step of irradiating the resin body 140X with the ultraviolet rays, so that the light-transmissive member 140 including the plurality of concave portions 140d is formed. In FIG. 6, the concave portions 140d are shown larger than the actual size thereof, for the sake of convenience.

The concave portions 140d formed by the irradiation with the ultraviolet rays through the photomask 200 are formed as a result of the thickness of the first regions R1 of the resin body 140X being decreased. Alternatively, the concave portions 140d are formed as a result of the thickness of the second region(s) R2 of the resin body 140X being increased and thus the first regions R1 becoming relatively low. The height of the regions irradiated with the ultraviolet rays and the height of the regions not irradiated with the ultraviolet rays are made different from each other (concave portions and convex portions are formed). As described below by way of examples, height difference d in the direction normal to the principal surface 140a between the first regions R1 and the second regions R2 may be 0.1 μm or greater. Height difference d is, for example, less than 10 μm.

Figure 7:
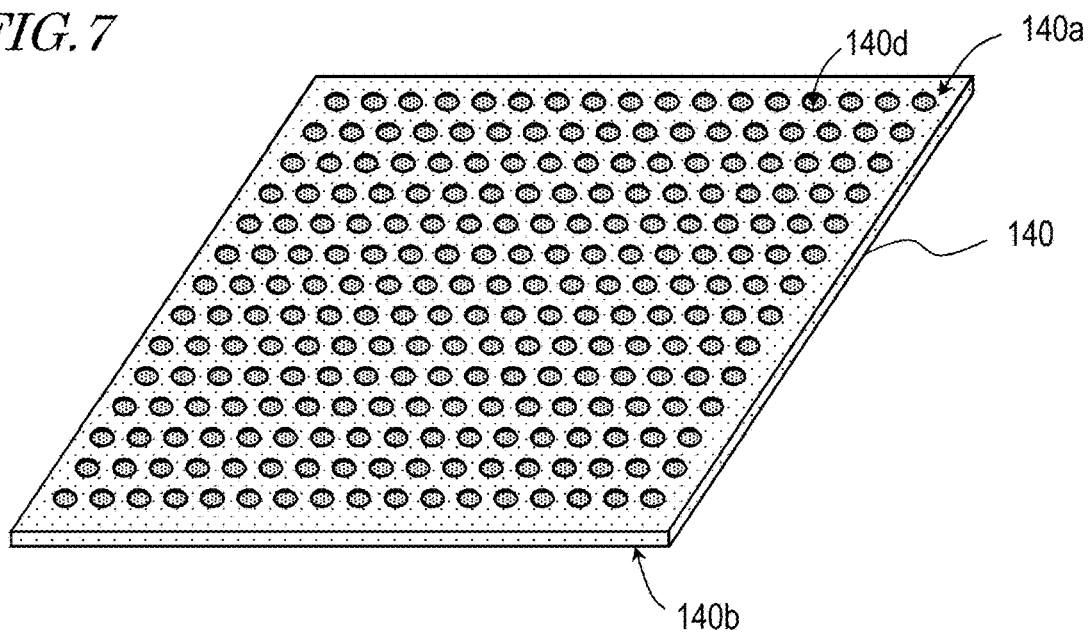
FIG. 7 is a perspective view showing an example of light-transmissive member 140.

FIG. 7 schematically shows an example of light-transmissive member 140. In this example, the light-blocking regions 200s of the photomask 200 are arrayed such that the centers thereof are located at lattice points of a triangular lattice. In correspondence with this, as shown in FIG. 7, the convex portions 140d are also arrayed such that centers thereof are located at lattice points of a triangular lattice. In FIG. 7, the concave portions 140d are shown larger than the actual size thereof for the sake of convenience like in FIG. 6. In the other figures in the present disclosure, the concave portions 140d may be shown larger than the actual size thereof for the sake of convenience.

The light-transmissive member 140 typically has a light transmittance of, for example, 60% or higher with respect to light having a peak emission wavelength of a light emitting element such as an LED or the like, or a light emitting device, that may be located on the principal surface 140a side of the light-transmissive member 140 or located on a principal surface 140b side that is opposite to the principal surface 140a (in this example, the principal surface 140b is a bottom surface of the light-transmissive member 140). The light transmittance of the light-transmissive member 140 with respect to the light having the above-described peak emission wavelength is advantageously 70% or higher, and more advantageously 80% or higher. The light-transmissive member 140 may have a haze value of 50% or higher. The haze value may be measured by a measurement method conformed to JIS K7136:2000.

As described above, in the embodiment according to the present disclosure, the principal surface 140a of the resin body 140X is provided with a shape such as a concave and convex pattern or the like basically in a non-contact manner with no use of a molding tool such a die or the like. In the embodiment according to the present disclosure, there is no need to press a die onto the target to be provided with the shape, unlike by the general imprint method. Therefore, the target to be provided with the shape is prevented from being damaged due to the physical contact. In addition, etching is not needed to form the pattern. Therefore, no damage occurs due to the etching. The silicone resin in the light-transmissive member 140 is basically in a cured state (fully cured state). Therefore, even if the light-transmissive member 140 is exposed to a high temperature environment of about 300° C., the shape of the concave portions 140d formed at the principal surface 140a can be maintained. Therefore, the light-transmissive member 140, after being formed, can be put into a process performed in a high temperature environment.

Embodiment 2

Figure 8:
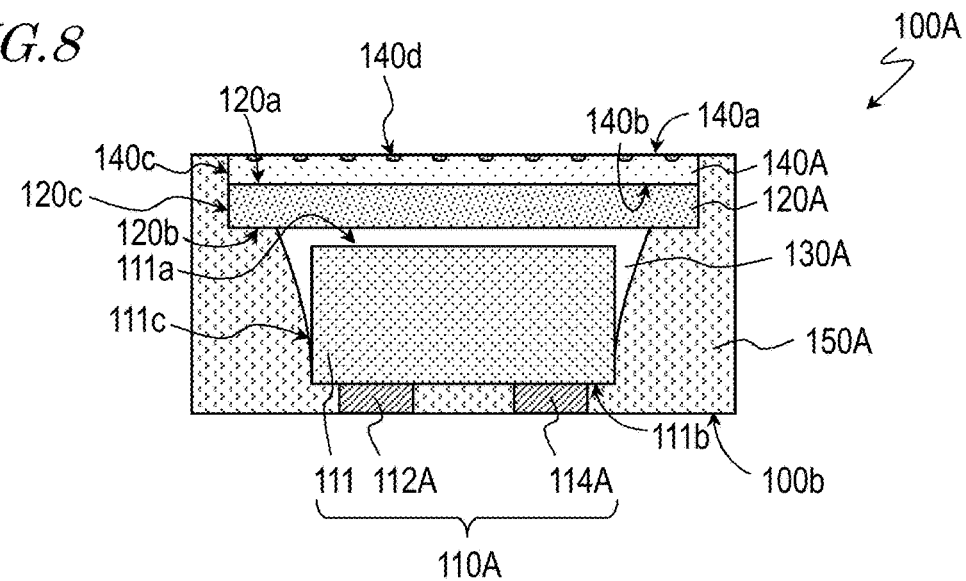
FIG. 8 is a cross-sectional view schematically showing a structure of an illustrative light emitting device produced by a production method in embodiment 2 according to the present disclosure.

FIG. 8 schematically shows a cross-section of an illustrative light emitting device produced by a production method in embodiment 2 according to the present disclosure. The light emitting device 100A shown in FIG. 8 includes a light emitting element 110A, a wavelength converting member 120A, a light guide member 130A, a light-transmissive member 140A, and a light-reflective member 150A.

The light emitting element 110A is, for example, an LED. In this example, the light emitting element 110A includes a main body 111, and also includes a positive electrode 112A and a negative electrode 114A located on the side of a bottom surface of the light emitting element 110A. In the structure shown in FIG. 8, a top surface of the light emitting element 110A matches a top surface 111a of the main body 111, and the positive electrode 112A and the negative electrode 114A are located on a bottom surface 111b of the main body 111 opposite to the top surface 111a.

The main body 111 includes, for example, a support substrate formed of sapphire, gallium nitride or the like, and a semiconductor stack structure provided on the support substrate. The semiconductor stack structure includes an active layer, and also includes an n-type semiconductor layer and a p-type semiconductor layer holding the active layer therebetween. The semiconductor stack structure may contain a nitride semiconductor capable of emitting light in the range of ultraviolet to visible light ($In_xAl_yGa_{1-x-y}N$, $0 \leq x$, $0 \leq y$, $x+y \leq 1$). The positive electrode 112A and the negative electrode 114A have a function of supplying a predetermined electric current to the semiconductor stack structure. As shown in FIG. 8, a bottom surface of the positive electrode 112A and a bottom surface of the negative electrode 114A are exposed from a bottom surface 100b of the light emitting device 100A. Therefore, the light emitting device 100A is considered to have a structure suitable to be mounted with a flip-chip connection.

In the structure shown in FIG. 8, the light emitting device 100A includes a stack structure, including the wavelength converting member 120A and the light-transmissive member 140A, above the top surface 111a of the main body 111. The wavelength converting member 120A has a top surface 120a, a bottom surface 120b and a side surface 120c located between the top surface 120a and the bottom surface 120b. The light-transmissive member 140A has a top surface 140a, a bottom surface 140b and a side surface 140c located between the top surface 140a and the bottom surface 140b. As shown in FIG. 8, in this example, the side surface 120c of the wavelength converting member 120A and the side surface 140c of the light-transmissive member 140A are covered with the light-reflective member 150A. The light guide member 130A may include a portion located between the bottom surface 120b of the wavelength converting member 120A and the top surface 111a of the main body 111, and another portion of the light guide member 130A covers at least a part of a side surface 111c of the main body 111. The side surface 111c of the main body 111 is located between the top surface 111a and a bottom surface 111b of the main body 111.

In this example, the light-transmissive member 140A is plate-shaped, like the light-transmissive member 140 in embodiment 1. As schematically shown in FIG. 8, for example, the top surface 140a located above the top surface of the light emitting element 110A includes a plurality of concave portions 140d. The light-transmissive member 140A has a thickness of, for example, in the range of 5 μm or greater and 100 μm or less. The plurality of concave portions 140d have a depth of, for example, 0.1 μm or greater. As described below, the plurality of concave portions 140d may be formed in the light-transmissive member 140A by a method substantially the same as that in embodiment 1. As described below by way of examples, the light-transmissive member 140A has a tacky property of, for example, 50% or lower of a tacky property of a surface of a silicone resin not irradiated with ultraviolet rays intentionally. The tacky property is found by a probe method as described below.

The light-transmissive member 140A has a light transmittance of, typically, 60% or higher with respect to light having a peak emission wavelength of the light emitting element 110A. From the point of view of effective use of the light, the light transmittance of the light-transmissive member 140A with respect to the light having the peak emission wavelength of the light emitting element 110A is advantageously 70% or higher, and more advantageously 80% or higher.

In this example, the wavelength converting member 120A is plate-shaped, like the light-transmissive member 140A. The wavelength converting member 120A includes, for example, a matrix of a silicone resin or the like and a wavelength converting material such as a phosphor or the like. The wavelength converting member 120A absorbs at least a part of light from the light emitting element 110A and emits light having a wavelength different from a wavelength of the light incident from the light emitting element 110A.

The light-reflective member 150A has a shape enclosing the wavelength converting member 120A, the light-transmissive member 140A and the light guide member 130A, and covers at least the side surface 111c of the main body 111. In the example shown in FIG. 8, a part of the light-reflective member 150A covers a region of the bottom surface 111b of the main body 111 that excludes the positive electrode 112A and the negative electrode 114A. In this specification, the term "cover" encompasses a case in which a covered member and a covering member are in direct contact with each other and also a case in which, for example, another member is located between the covered member and the covering member and thus the covered member and the covering member are not in direct contact with each other. In this specification, the term "light-reflective" indicates that the reflectance with respect to the light having a peak emission wavelength of the light emitting element is 60% or higher. The reflectance of the light-reflective member 150A with respect to the light having the peak emission wavelength of the light emitting element 110A is advantageously 70% or higher, and more advantageously 80% or higher. It is advantageous that the light-reflective member 150A is white.

Figure 9:
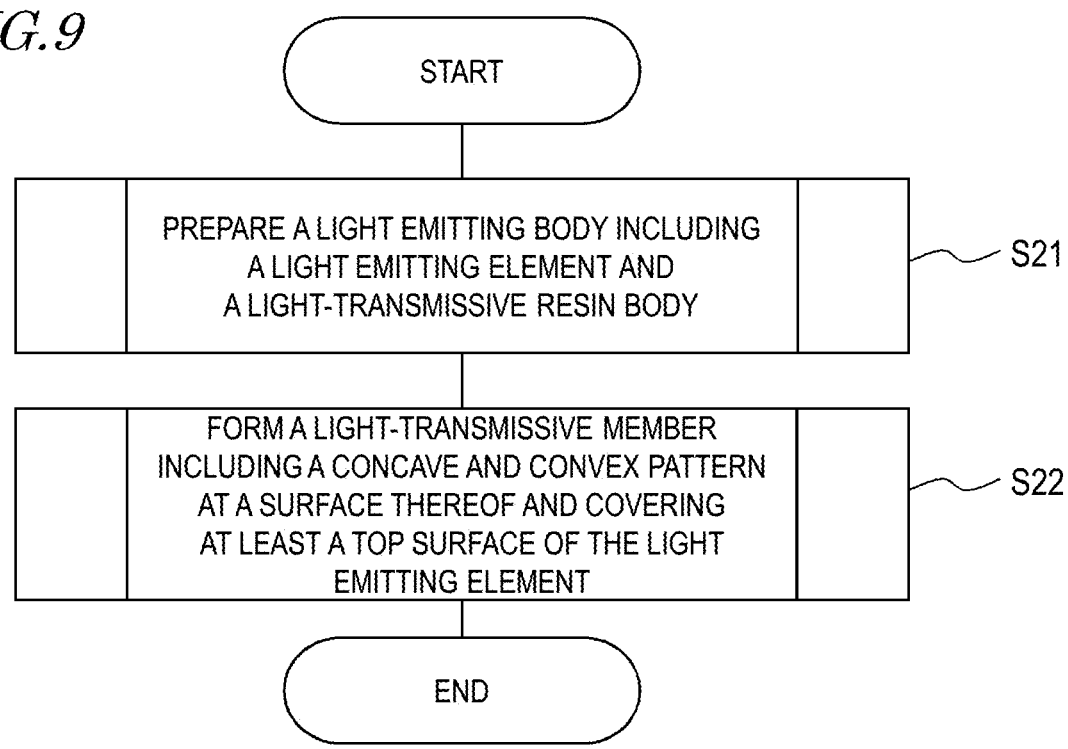
FIG. 9 is a flowchart showing an example of method for producing the light emitting device in embodiment 2.
Figure 10:
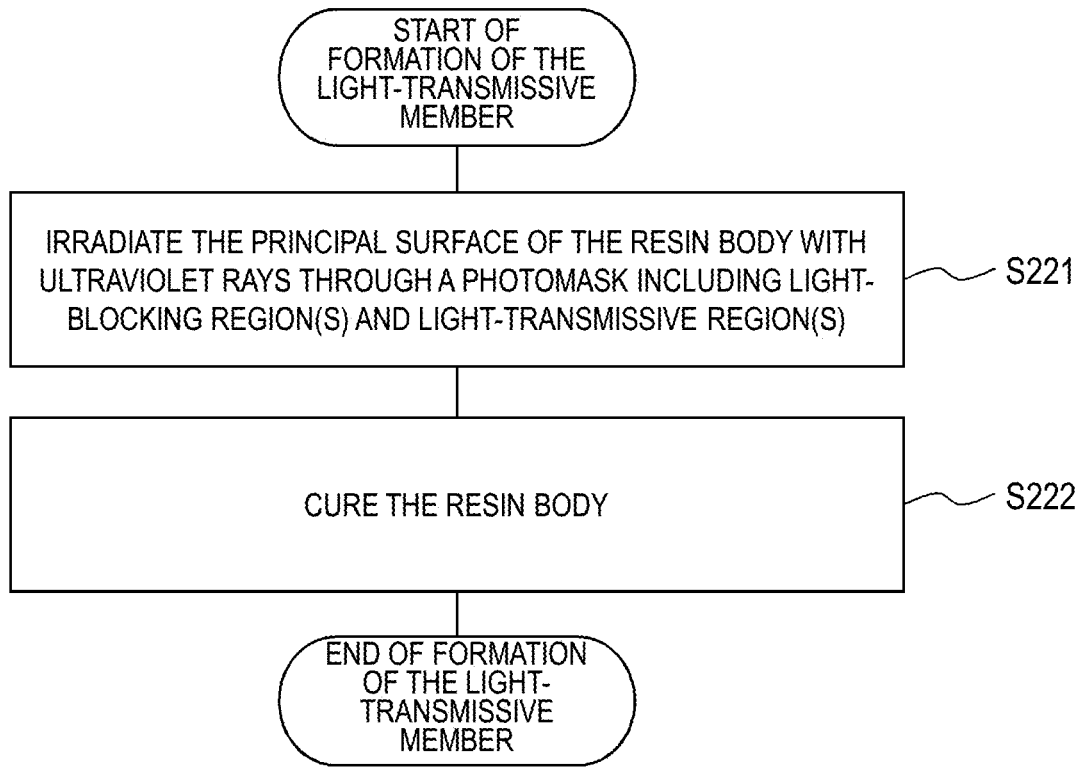
FIG. 10 shows steps that may be included in step S22 shown in FIG. 9.

FIG. 9 is a flowchart showing an example of method for producing the light emitting device in embodiment 2 according to the present disclosure. The production method shown in FIG. 9 generally includes a step of preparing a light emitting body including a light emitting element and a light-transmissive resin body (step S21) and a step of forming a light-transmissive member including a concave and convex pattern at a surface thereof and covering at least a top surface of the light emitting element (step S22). In the example described herein, the step of forming the light-transmissive member includes a step of irradiating a principal surface of the resin body with ultraviolet rays through a photomask including one or more light-blocking regions and light-transmissive regions (step S221). The resin body as a target to be irradiated with the ultraviolet rays is, for example, a resin sheet formed by curing a silicone resin starting material or a resin sheet of a silicone resin starting material in a preliminarily cured state. When necessary, as shown in FIG. 10, a step of curing the resin body (step S222) is performed after the irradiation with the ultraviolet rays. Hereinafter, with reference to the drawings, an illustrative method for forming the light emitting device 100A shown in FIG. 8 will be described in detail.

[Step of Preparing the Light Emitting Body]

Figure 11:
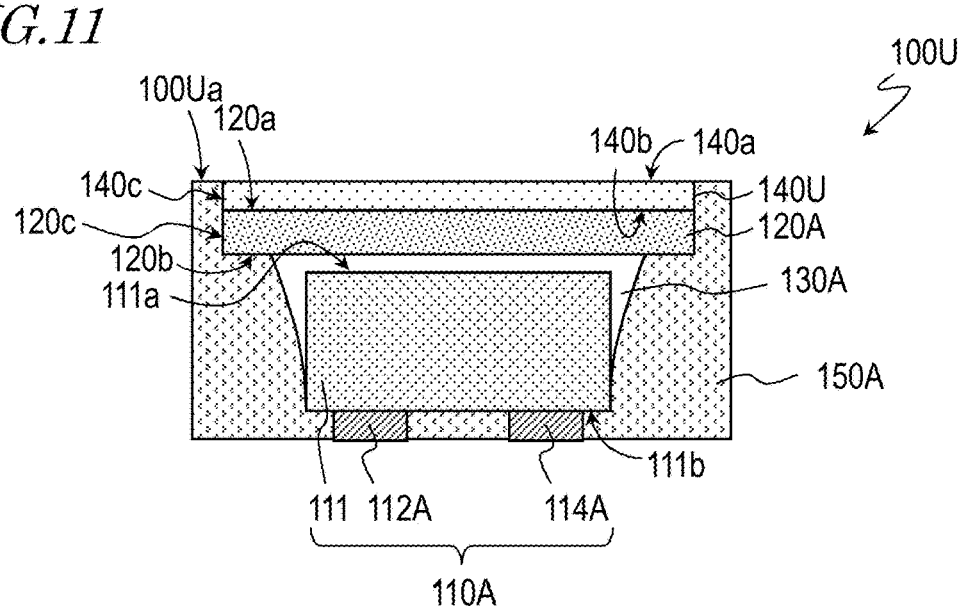
FIG. 11 is a schematic cross-sectional view showing an illustrative structure of a light emitting body 100U including a light emitting element 110A and a light-transmissive resin body 140U.

First, a light emitting body including a light emitting element and a light-transmissive resin body is prepared (step S21 in FIG. 9). In this example, as shown in FIG. 11, a light emitting body 100U including the light emitting element 110A and a sheet-like resin body 140U located above the top surface of the light emitting element 110A is prepared. FIG. 11 schematically shows a cross-section of the light emitting body 100U taken along a line perpendicular to a top surface 100Ua of the light emitting body 100U.

The light emitting body 100U shown in FIG. 11 includes the wavelength converting member 120A, the light guide member 130A and the light-reflective member 150A in addition to the light emitting element 110A and the resin body 140U. As shown in FIG. 11, the light emitting body 100U includes a stack structure including the wavelength converting member 120A and the resin body 140U. The light-reflective member 150A covers the side surface 140c of the resin body 140U and the side surface 120c of the wavelength converting member 120A. The light emitting body 100U may be purchased or formed. The light emitting body 100U shown in FIG. 11 is formed as follows, for example.

Figure 12:
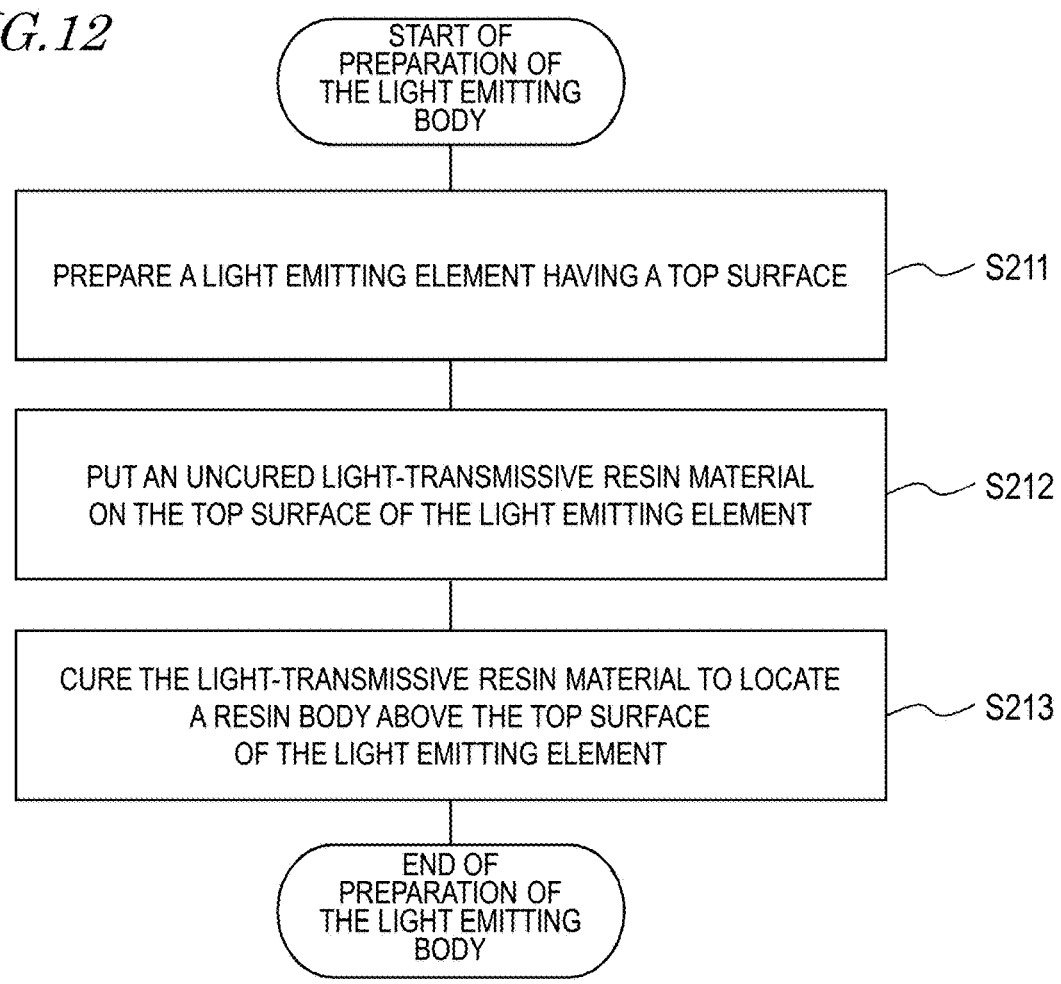
FIG. 12 shows steps that may be included in step S21 shown in FIG. 9.

FIG. 12 is a flowchart showing an illustrative method for preparing the light emitting body 100U. The method for preparing the light emitting body 100U includes, for example, a step of preparing a light emitting element having a top surface (step S211), a step of applying an uncured light-transmissive resin material on the top surface of the light emitting element (step S212) and a step of curing the light-transmissive resin material to locate a resin body above the top surface of the light emitting element (step S213).

First, the light emitting element 110A having the top surface and also including the positive electrode 112A and the negative electrode 114A on the bottom surface 111b opposite to the top surface is prepared (step S211 in FIG. 12). The light emitting element 110A may be purchased.

Figure 13:
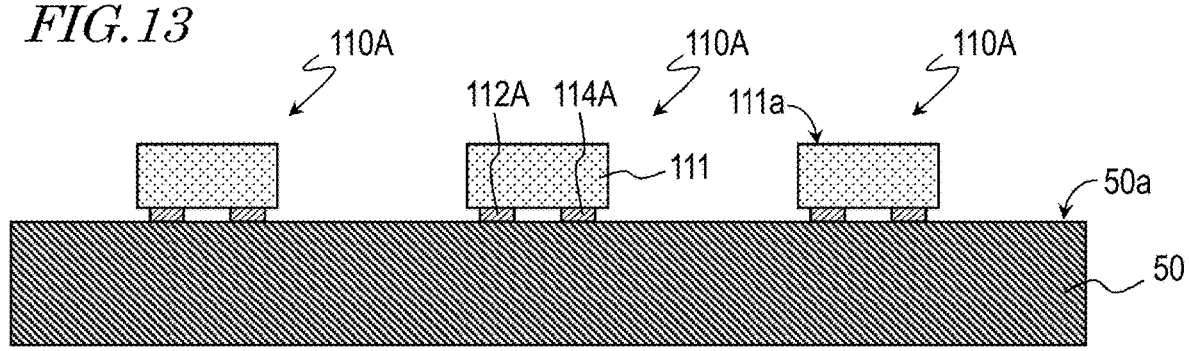
FIG. 13 is a schematic cross-sectional view showing an illustrative method for forming the light emitting body 100U.

Next, a support body 50 formed of a heat-resistant adhesive sheet, substrate or the like is prepared. The light emitting element 110A is located on the support body 50 such that the positive electrode 112A and the negative electrode 114A face the support body 50. In this example, as shown in FIG. 13, a plurality of the light emitting elements 110A are temporarily secured to a top surface 50a of the support body 50. For the sake of simplicity, FIG. 13 shows three light emitting elements 110A arrayed in a left-right direction on the paper of FIG. 13. Needless to say, the light emitting elements 110A may be arrayed two-dimensionally on the top surface 50a.

Figure 14:
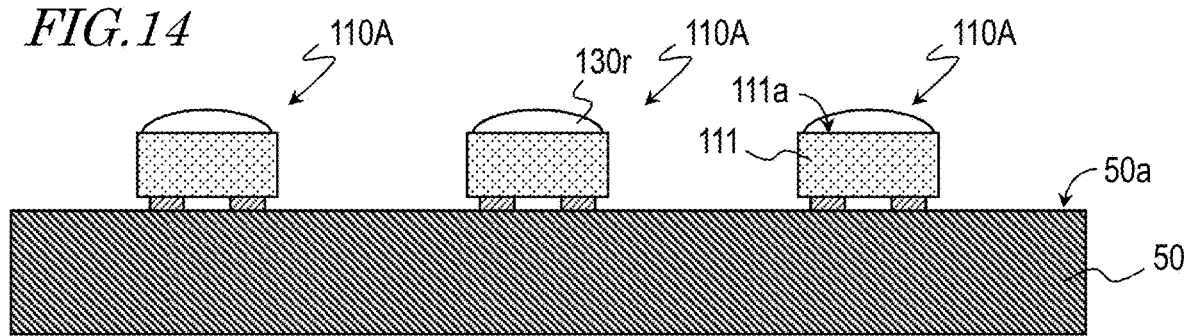
FIG. 14 is a schematic cross-sectional view showing the illustrative method for forming the light emitting body 100U.

Next, as shown in FIG. 14, a light-transmissive first resin material 130r is put on the top surface 111a serving as the top surface of each of the light emitting elements 110A by a dispenser or the like (step S212 in FIG. 12). The first resin material 130r may contain, as a matrix, a material containing silicone resin, silicone modified resin, epoxy resin, phenol resin, polycarbonate resin, acrylic resin, trimethylpentene resin or polynorbornene resin, or a combination of at least two of these materials.

Figure 15:
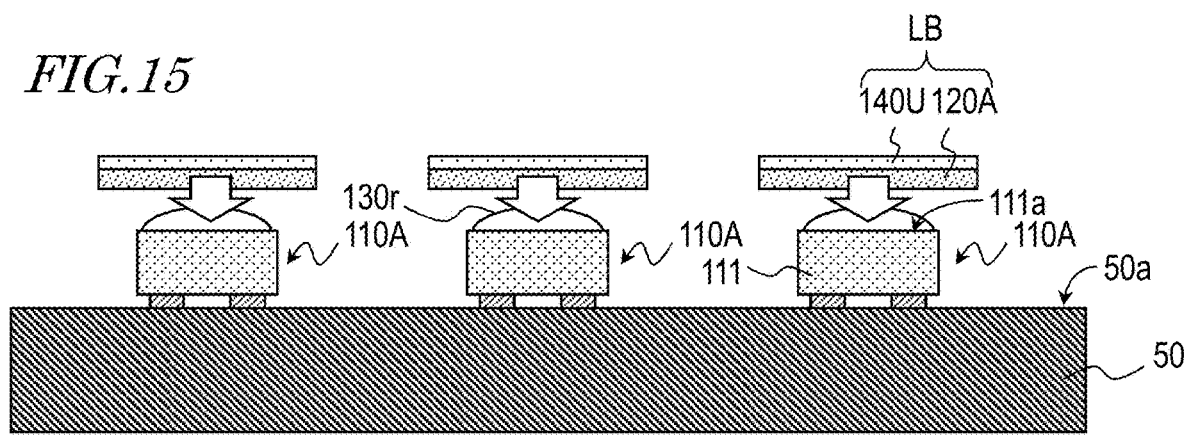
FIG. 15 is a schematic cross-sectional view showing the illustrative method for forming the light emitting body 100U.
Figure 16:
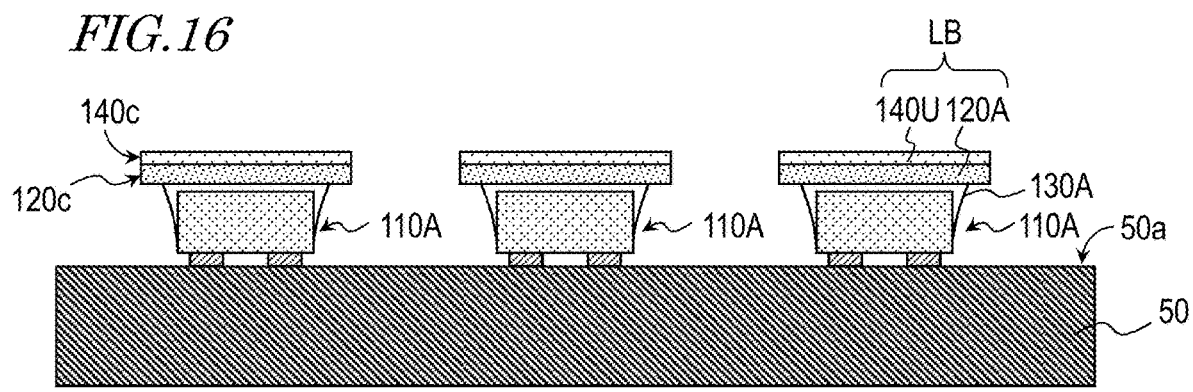
FIG. 16 is a schematic cross-sectional view showing the illustrative method for forming the light emitting body 100U.

Next, as schematically shown in FIG. 15, the wavelength converting member 120A and the resin body 140U are located on the first resin material 130r, and the first resin material 130r is cured. In this example, a stack sheet including the wavelength converting member 120A and the resin body 140U is prepared and cut into a stack sheet piece LB having a predetermined size. Then, the stack sheet piece LB is located on the first resin material 130r of each light emitting element 110A. After the stack sheet piece LB is located, the first resin material 130r is cured. As a result, as shown in FIG. 16, the light guide member 130A is formed, and the resin body 140U is located above the top surface of the light emitting element 110A (step S213 in FIG. 12). After the first resin material 130r is cured, the side surface 120c of the wavelength converting member 120A and the side surface 140c of the resin body 140U may be trimmed by a dicing saw or the like. As a result, a plurality of the light emitting bodies 100U each including the light emitting element 110A and the resin body 140U covering at least the top surface of the light emitting element 110A are formed.

The stack sheet piece LB may be prepared as follows, for example. A resin in a resin material having, for example, particles of a phosphor dispersed therein is put into a B-staged state to form a phosphor sheet. The phosphor sheet and a light-transmissive resin sheet are prepared and heated to be bonded together. The resultant assembly is cut by an ultrasonic cutter or the like into a piece of a predetermined size. The phosphor sheet may be formed of a second resin material containing a phosphor, a resin material such as a silicone resin or the like, filler particles and a solvent. Usable as the phosphor is a known phosphor such as a YAG-based phosphor, a KSF-based phosphor, CASN and a β-SiAlON phosphor or the like described above.

The light-transmissive resin sheet may be formed by, for example, putting an uncured silicone resin starting material containing a silicone resin as a matrix into a preliminarily cured state, namely, a B-staged state. The light-transmissive resin sheet may be formed by fully curing an uncured silicone resin starting material. The silicone resin starting material may additionally contain a light-scattering filler or the like. The silicone resin as the matrix typically contains an organic polysiloxane including at least one phenyl group in a molecule, and/or an organic polysiloxane including a D unit. The stack sheet including the phosphor sheet and the light-transmissive resin sheet may alternatively be formed by applying the second resin material on a principal surface of the light-transmissive sheet by coating such as spraying, casting, potting or the like, and curing the second resin material. Still alternatively, the stack sheet or the stack sheet piece LB may be purchased. The phosphor sheet and/or the light-transmissive sheet may be purchased. In the process of curing the first resin material 130r, the silicone resin in the light-transmissive resin sheet may be cured.

Figure 17:
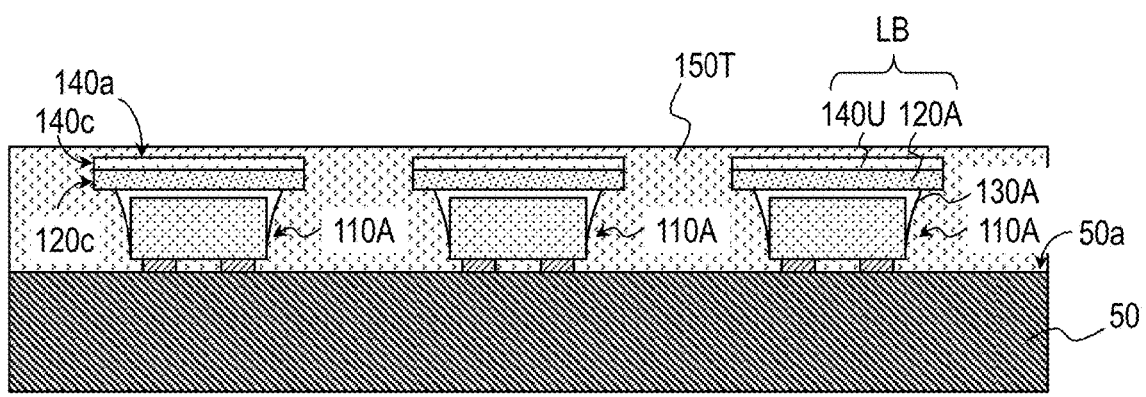
FIG. 17 is a schematic cross-sectional view showing the illustrative method for forming the light emitting body 100U.

After the light guide member 130A is formed, a light-reflective member covering the side surface 111c of the main body 111, which corresponds to a side surface of the light emitting element 110A, is formed. For example, as shown in FIG. 17, the components on the support body 50 are covered with a light-reflective resin layer 150T.

The light-reflective resin layer 150T may be formed as follows, for example. A third resin material having particles of a light-reflective filler dispersed therein is put on the top surface 50a of the support body 50, and the third resin material is cured. The third resin material may contain, as a matrix, silicone resin, phenol resin, epoxy resin, BT resin, polyphthalamide (PPA) or the like. The particles of the light-reflective filler may be the light-scattering particles described above such as titanium oxide particles or the like. The light-reflective resin layer 150T may be formed by, for example, transfer molding. In the state shown in FIG. 17, the top surface 140a of the resin body 140U is covered with the light-reflective resin layer 150T. In the case in which the light-transmissive resin sheet used to form the stack sheet piece LB is in a B-staged state, the silicone resin in the light-transmissive resin sheet may be fully cured in the process of forming the light-reflective resin layer 150T.

Figure 18:
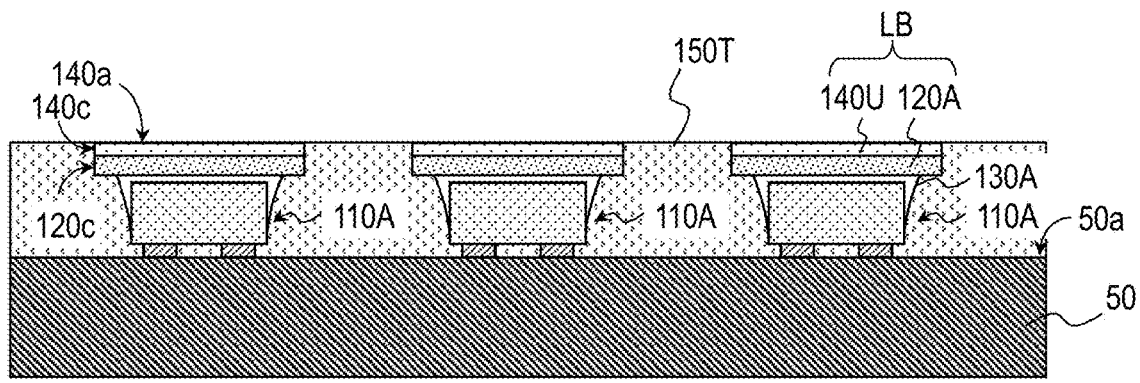
FIG. 18 is a schematic cross-sectional view showing the illustrative method for forming the light emitting body 100U.

Next, as shown in FIG. 18, a part of the light-reflective resin layer 150T is removed from the side of a top surface thereof by grinding or the like to expose the top surface 140a of the resin body 140U from the ground surface. As a result of the grinding, a plurality of components each having substantially the same structure as that of the light emitting body 100U shown in FIG. 11 are formed on the top surface 50a of the support body 50. In this step, a part of the resin body 140U may be removed together with the part of the light-reflective resin layer 150T. In this case, the top surface 140a exposed by the grinding is considered to be different from the pre-grinding top surface 140a in a strict sense. Nonetheless, such a newly formed surface is interpreted as being encompassed in the top surface 140a in this embodiment.

[Step of Forming the Light-Transmissive Member]

After the light emitting body 100U is prepared, the light-transmissive member 140A having a concave and convex pattern at the surface thereof and covering the top surface of the light emitting element 110A is formed (step S22 in FIG. 9). In this embodiment, a surface of a resin body, in this example, the top surface 140a of the resin body 140U, is irradiated with ultraviolet rays through a photomask to form a plurality of concave portions at the top surface 140a.

Figure 19:
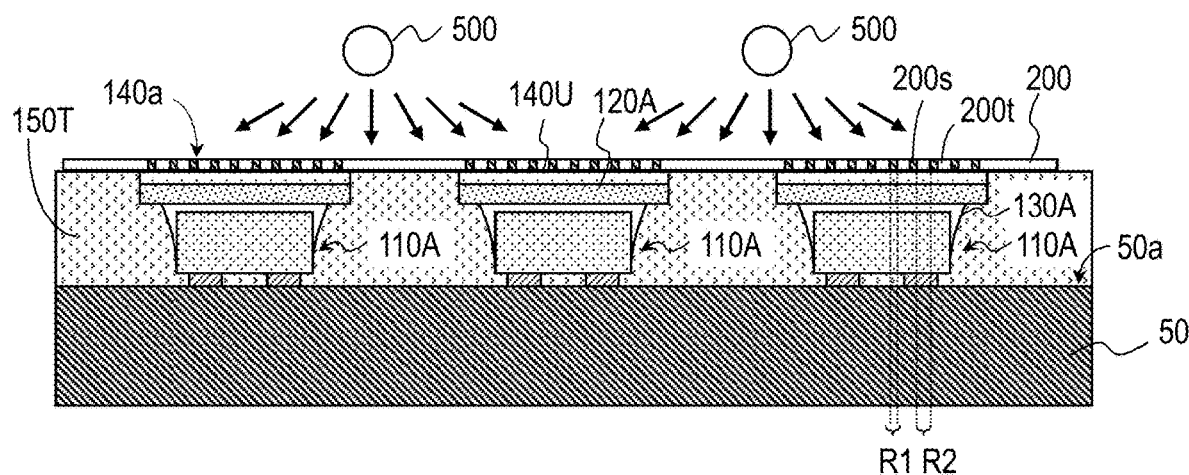
FIG. 19 is a schematic cross-sectional view showing a method for producing a light emitting device in embodiment 2 according to the present disclosure.

For example, as shown in FIG. 19, the photomask 200 is arranged at the top surface 140a side of the resin body 140U. In this state, the top surface 140a of the resin body 140U (corresponding to, for example, the principal surface 140a of the resin body 140X) is irradiated with ultraviolet rays through the photomask 200 by the ultraviolet ray irradiation device 500 (step 221 in FIG. 10). The step of forming the concave portions at the surface of the resin body may be performed in substantially the same manner as described above with reference to FIG. 4 through FIG. 6 regarding the formation of the plurality of concave portions 140d at the top surface 140a of the resin body 140X by irradiating a part of the top surface 140a with the ultraviolet rays.

Like in the example shown in FIG. 4, the photomask 200 includes the light-blocking regions 200s and one or more light-transmissive regions 200t. Like in the example shown in FIG. 6, the height of the first regions R1 of the top surface 140a that have been covered with the light-blocking regions 200s and the height of the second regions R2 of the top surface 140a that have been just below the light-transmissive regions 200t are made different from each other by the irradiation with the ultraviolet rays through the photomask 200. In other words, the top surface 140a of the resin body 140U is partially irradiated with the ultraviolet rays, so that the plurality of concave portions 140d are formed at positions corresponding to the light-blocking regions 200s of the photomask 200. As described above, the photomask 200 may or may not be in contact with the top surface 140a of the resin body 140U.

Figure 20:
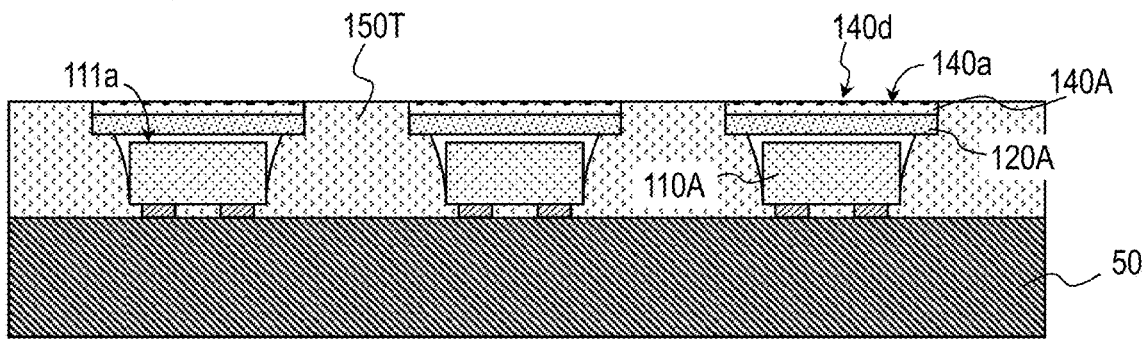
FIG. 20 is a schematic cross-sectional view showing the method for producing the light emitting device in embodiment 2.

As a result of the irradiation with the ultraviolet rays, as shown in FIG. 20, an assemblage of a plurality of components each including the plurality of concave portions formed at a surface of a resin body, in this example, at the top surface 140a of the resin body 140U, is formed. Namely, the light-transmissive members 140A each including the plurality of concave portions 140d and covering the top surface of the light emitting element 110A are formed. In the case in which the resin body 140U is in a preliminarily cured state, the resin body 140U is cured by heating (step S222 in FIG. 10) after, for example, the irradiation with the ultraviolet rays. For example, the components formed on the support body 50 may be kept at a temperature of 150° C. for 4 hours, so that the silicone resin in the resin body 140U is put into a fully cured state. The components formed on the support body 50 may be heated when necessary, and step S222 shown in FIG. 10 may be omitted.

Figure 21:
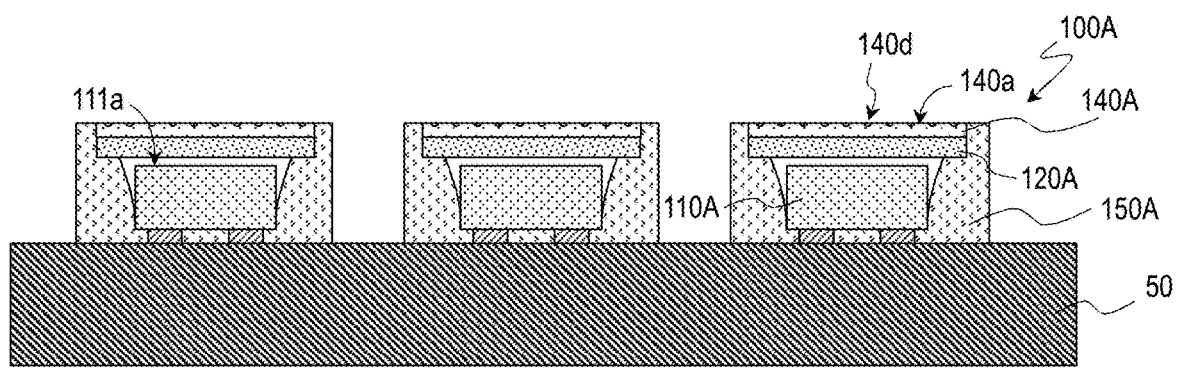
FIG. 21 is a schematic cross-sectional view showing the method for producing the light emitting device in embodiment 2.

Next, the components on the support body 50 are cut into a desired shape by a dicing saw or the like. For example, as shown in FIG. 21, the light-reflective resin layer 150T is cut at a position between two light emitting elements 110A adjacent to each other. As a result of the steps of grinding and cutting the light-reflective resin layer 150T, the light-reflective members 150A are formed as shown in FIG. 21. Then, the components on the support body 50 are separated from the support body 50. As a result, the light emitting device 100A shown in FIG. 8 is produced.

In the above-described example, an assemblage of components each including the light emitting element 110A and the resin body 140U is irradiated with the ultraviolet rays and then divided into the plurality of light emitting devices 100A. Alternatively, as described below, the assemblage of the components may be divided into the plurality of light emitting bodies 100U, and then each light emitting body 100U may be irradiated with the ultraviolet rays.

Figure 22:
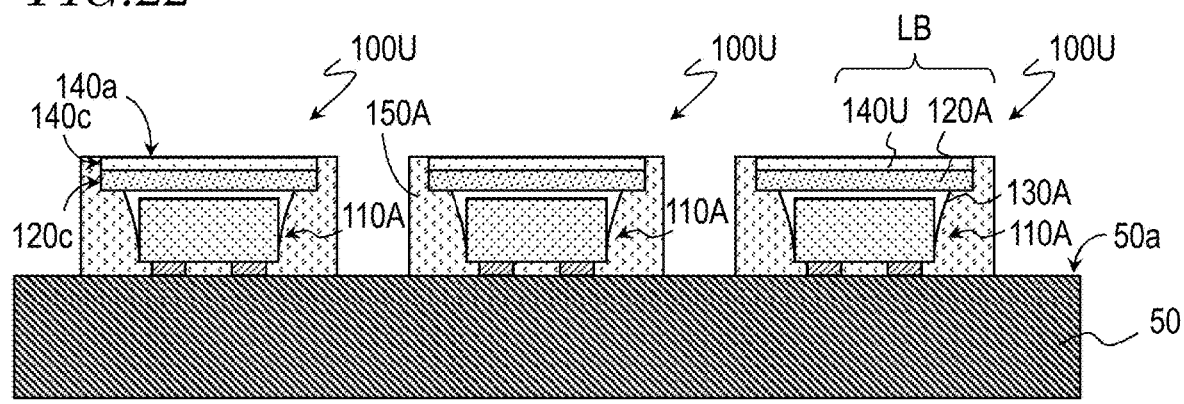
FIG. 22 is a schematic cross-sectional view showing another illustrative method for forming the light emitting body 100U.

As described above with reference to FIG. 18, the top surface 140a of the resin body 140U is exposed from the light-reflective resin layer 150T by, for example, grinding, and then the assemblage of the components on the support body 50 is put into a desired shape by a dicing saw or the like. For example, the post-grinding light-reflective resin layer 150T may be cut at a position between two light emitting elements 110A adjacent to each other, so that the light-reflective members 150A are formed as shown in FIG. 22. After this, the components on the support body 50 are separated from the support body 50. As a result, the light emitting body 100U shown in FIG. 11 is formed.

After such an individual light emitting body 100U is formed, the light-transmissive member covering the top surface of the light emitting element 110A is formed (step S22 in FIG. 9). As schematically shown in, for example, FIG. 23, the light emitting body 100U is located on a support body 60 formed of a heat-resistant adhesive sheet, substrate or the like. In a state in which the photomask 200 is located on or above the top surface 100Ua of the light emitting body 100U, the top surface 140a of the resin body 140U (corresponding to, for example, the principal surface 140a of the resin body 140X) is irradiated with ultraviolet rays through the photomask 200 by the ultraviolet ray irradiation device 500 (step S221 in FIG. 10). In this example also, it is not indispensable that the photomask 200 is in contact with the top surface 140a of the resin body 140U. The ultraviolet rays may be directed to a plurality of the resin bodies 140U of the light emitting bodies 100U at the same time or may be directed to each of the light emitting bodies 100U separately.

Figure 24:
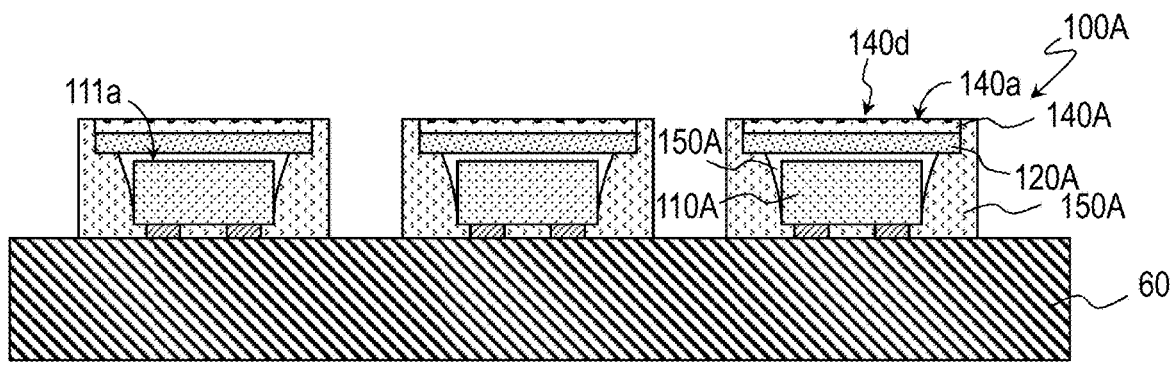
FIG. 24 is a schematic cross-sectional view showing the another example of method for producing the light emitting device in embodiment 2.

As a result of the irradiation with the ultraviolet rays through the photomask 200, the plurality of concave portions 140d are formed at the top surface 140a of the resin body 140U, and the light-transmissive member 140A covering the top surface of the light emitting element 110A is formed. In the case in which the resin body 140U is in a preliminarily cured state, the resin body 140U is cured by heating (step S222 in FIG. 10). A plurality of the light emitting devices 100A are produced on the support body 60 as shown in FIG. 24 by the above-described steps.

In embodiment 2 according to the present disclosure, the surface 140a of the light-transmissive member 140A covering the light emitting element 110A may be provided with a microscopic concave and convex pattern to improve the light extraction efficiency. In the case in which the light-transmissive member 140A is located on the light output side of the light emitting element 110A as in the light emitting device 100A described above, it is advantageous that the light-transmissive member 140A is formed of a thermosetting resin in consideration of the deterioration caused by the light from the light emitting element 110A. In an embodiment according to the present disclosure, the top surface of the thermosetting resin is provided with the concave and convex pattern basically in a non-contact manner. This is advantageous to improve the light extraction efficiency. In addition, after the component substantially usable as the light emitting device (the component is, for example, the light emitting body 100U) is formed, the concave and convex pattern may be provided on the surface of the component. Japanese Patent Publication No. 2016-001639 does not conceive that the light emitting element is covered with a resin material and that a concave and convex pattern is formed at a surface of the resin in a preliminarily cured state or in a cured state.

In the above-described example, the stack sheet piece LB is located on the first resin material 130r put on the top surface of the light emitting element 110A, and then the first resin material 130r is cured to form the stack sheet piece LB above the light emitting element 110A in a fixed state. At this point, the light guide member 130A is formed of the first resin material 130r. The light guide member 130A has a function of reflecting light emitted from the side surface 111c of the main body 111, which is the side surface of the light emitting element 110A, upward with respect to the light emitting device 100A. Therefore, the formation of the light guide member 130A improves the light extraction efficiency.

In the above-described example, the light emitting device 100A includes the light-reflective member 150A enclosing the light guide member 130A and covering a region of the bottom surface 111b of the main body 111 excluding the positive electrode 112A and the negative electrode 114A. Therefore, light from the side surface or the bottom surface 100b of the light emitting device 100A is suppressed from leaking, and thus the light extraction efficiency is further improved.

In the above-described example, the resin body 140U is once buried in the light-reflective resin layer 150T, then the top surface 140a of the resin body 140U is exposed from the light-reflective resin layer 150T, and after this, the concave and convex pattern is formed at the top surface 140a. Conventionally, with a production method by which a light-transmissive member such as the resin body 140U is buried in a light-reflective resin layer 150T, it is difficult to form a concave and convex pattern at the surface of the light-transmissive member exposed at the ground surface after being once buried. By contrast, in an embodiment according to the present disclosure, the surface of the resin body 140U in a preliminarily cured state or a cured state is provided with a shape. Therefore, after a light emitting device usable as a product is produced, the light-transmissive member may be provided with a shape. Thus, it is expected to improve the light extraction efficiency of the light emitting device.

As described above with reference to FIG. 8, in this example, the positive electrode 112A and the negative electrode 114A are exposed from the bottom surface 100b of the light emitting device 100A. The light emitting device 100A may be mounted on a wiring board or the like by, for example, reflow. In this embodiment, like in embodiment 1, even if the light-transmissive member 140A can be exposed to a high temperature environment, the shape of the concave portions 140d is maintained. Namely, embodiments according to the present disclosure is advantageously applicable to a process performed at a high temperature such as reflow or the like. For example, after the light emitting device 100A is heated at a temperature of 300° C. for 40 minutes, the depth of the concave portions 140d may change by 25% or less. The change in the depth of the concave portions 140d may be defined by $|Dq-Dp|/Dp$, where Dp is the average value of the depth of the concave portions 140d at any ten positions before the heating, and Dq is the average value of the depth of the concave portions 140d at any ten positions after the heating.

Figure 25:
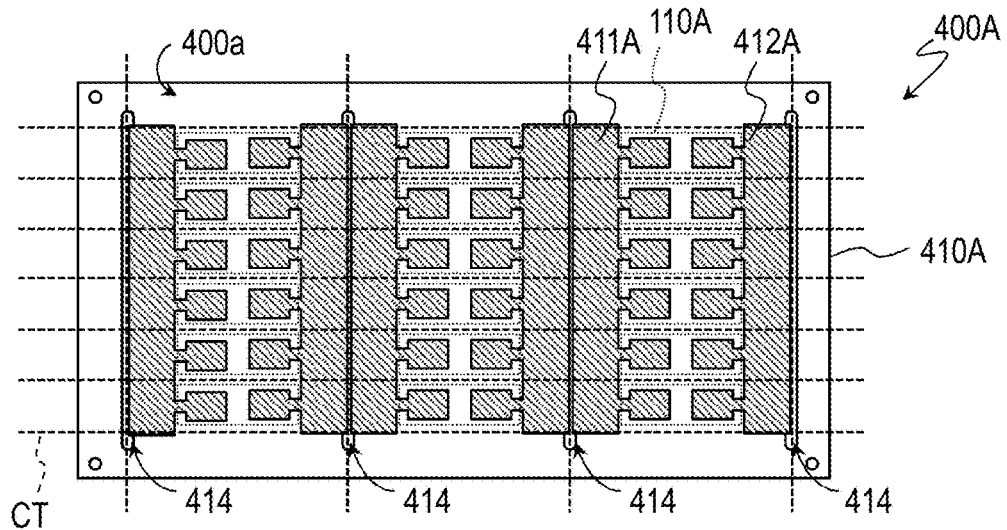
FIG. 25 is a schematic plan view showing an example of composite substrate 400A including a base plate 410A, and a first conductive portion 411A and a second conductive portion 412A provided on the base plate 410A.

Instead of the support body 50 described above, a composite substrate 400A shown in FIG. 25 may be used. The composite substrate 400A includes a base plate 410A and also includes a first conductive portion 411A and a second conductive portion 412A provided on the base plate 410A. FIG. 25 shows an example of external appearance of the composite substrate 400A as seen from a top surface 400a thereof. As schematically shown in FIG. 25, the base plate 410A includes through-holes 414. Although not shown in FIG. 25, a part of the first conductive portion 411A and a part of the second conductive portion 412A extend to a bottom surface of the base plate 410A, opposite to the top surface 400a, via the through-holes 414.

In the case in which the composite substrate 400A including the base plate 410A is used, for example, the plurality of light emitting elements 110A are secured to the top surface 400a of the composite substrate 400A by flip-chip connection, instead of being temporarily secured to the support body 50 (see FIG. 13). At this point, the positive electrode 112A and the negative electrode 114A of each light emitting element 110A are respectively connected with the first conductive portion 411A and the second conductive portion 412A of the composite substrate 400A by a joining member such as solder or the like. In FIG. 25, the rectangles enclosed by the thin dashed line indicate the areas where the light emitting elements 110A are located. After the light guide member 130A are formed and the light-transmissive resin body 140U are located, the components on the top surface 400a of the composite substrate 400A are covered with the light-reflective resin layer 150T in substantially the same manner as in the step described above with reference to FIG. 17.

After the top surface 140a of the resin body 140U is exposed from the light-reflective resin layer 150T by grinding or the like, the plurality of concave portions 140d are formed at the top surface 140a in substantially the same manner as in the example described above with reference to FIG. 19. Then, the light-reflective resin layer 150T and the composite substrate 400A are cut simultaneously by a dicing saw or the like at positions represented by the thick dashed lines CT in FIG. 25. As a result, a plurality of light emitting devices 100B are produced.

Figure 26:
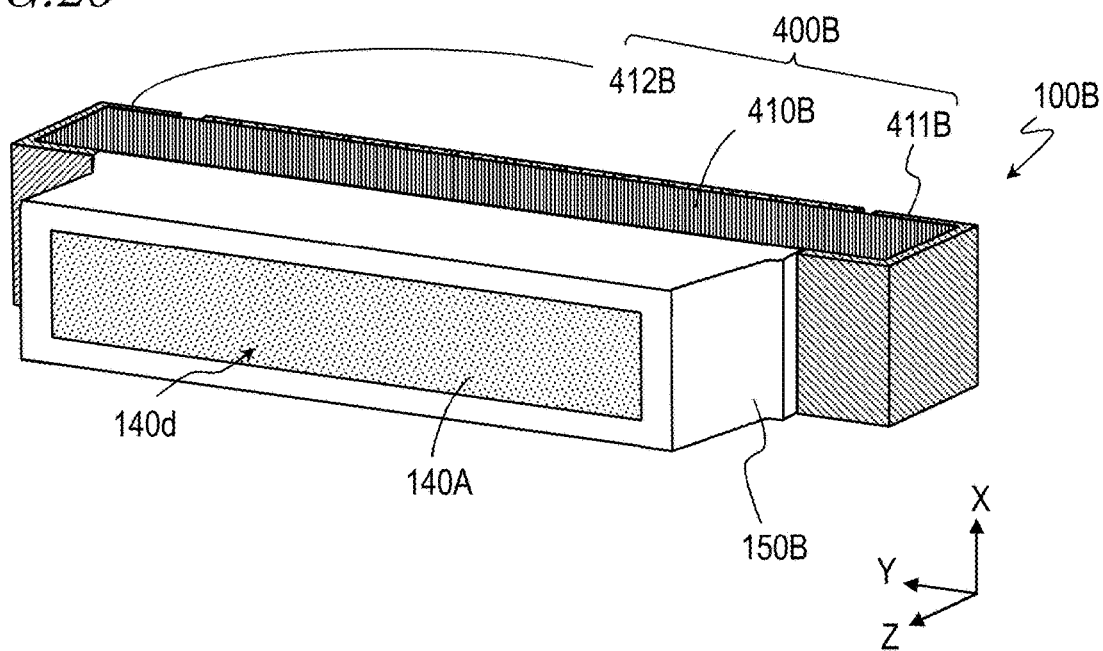
FIG. 26 is a perspective view showing an example of external appearance of a light emitting device 100B.
Figure 27:
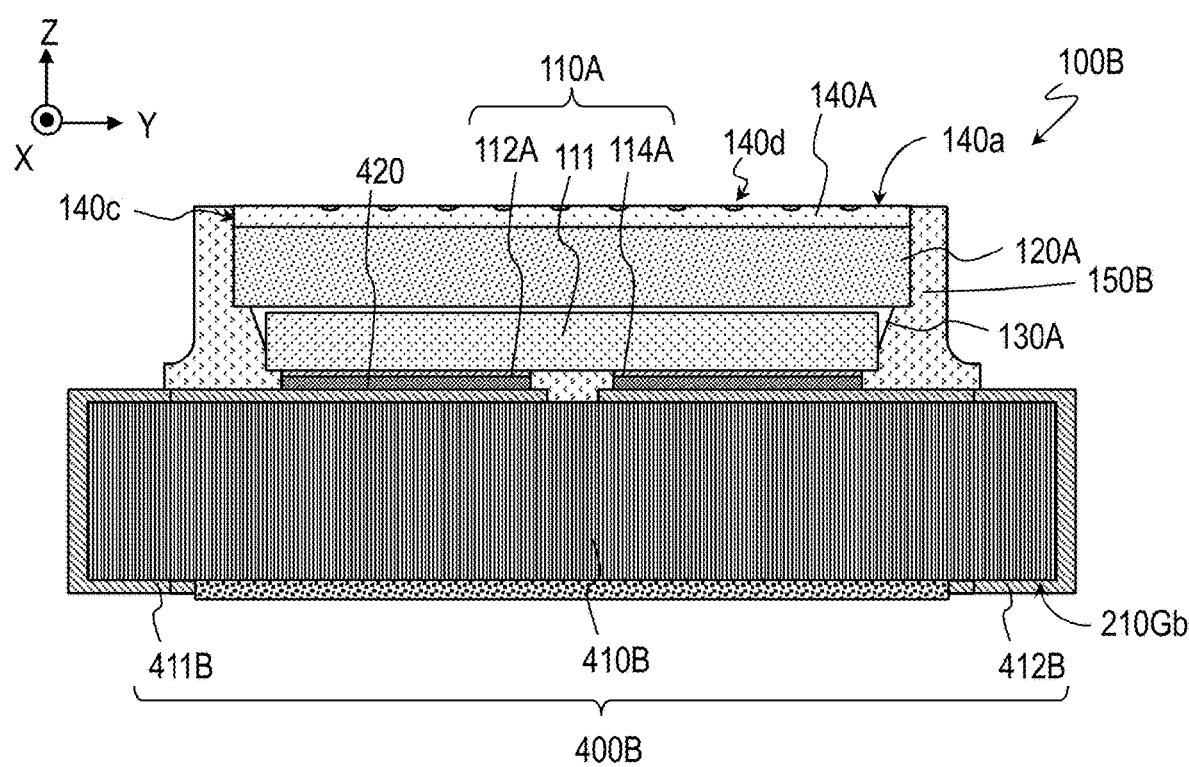
FIG. 27 is a schematic cross-sectional view of the light emitting device 100B shown in FIG. 26 taken along a plane parallel to a YZ plane in FIG. 26 at approximately the center of the light emitting device 100B.

FIG. 26 shows an example of external appearance of one light emitting device 100B. FIG. 27 schematically shows a cross-section of the light emitting device 100B taken along a plane parallel to a YZ plane in FIG. 26, at approximately the center of the light emitting device 100B. As shown in FIG. 26 and FIG. 27, the light emitting device 100B includes a light-reflective member 150B covering the side surface 140c of the light-transmissive member 140A and also includes a composite substrate 400B. The composite substrate 400B includes a base plate 410B, a first conductive portion 411B and a second conductive portion 412B. As shown in FIG. 27, the first conductive portion 411B and the second conductive portion 412B are respectively electrically connected with the positive electrode 112A and the negative electrode 114A of the light emitting element 110A via joining members 420. In the structure shown in FIG. 27, the light-reflective member 150B reaches the composite substrate 400B and covers the joining members 420.

The base plate 410B, the first conductive portion 411B and the second conductive portion 412B are respectively a part of the base plate 410A, a part of the first conductive portion 411A and a part of the second conductive portion 412A shown in FIG. 25. In the structure shown in FIG. 26 and FIG. 27, the light emitting device 100B is longer in a Y-axis direction than in an X-axis direction, and is used as a so-called side view-type light emitting device.

Figure 28:
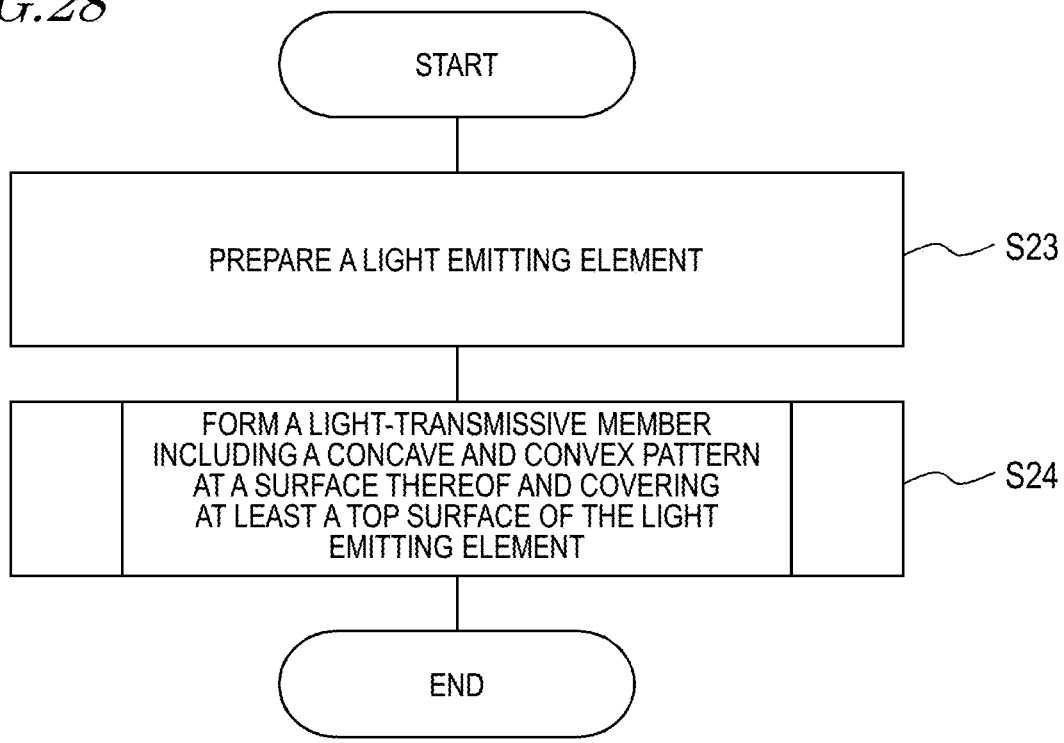
FIG. 28 is a flowchart showing still another example of method for producing the light emitting device in embodiment 2.
Figure 29:
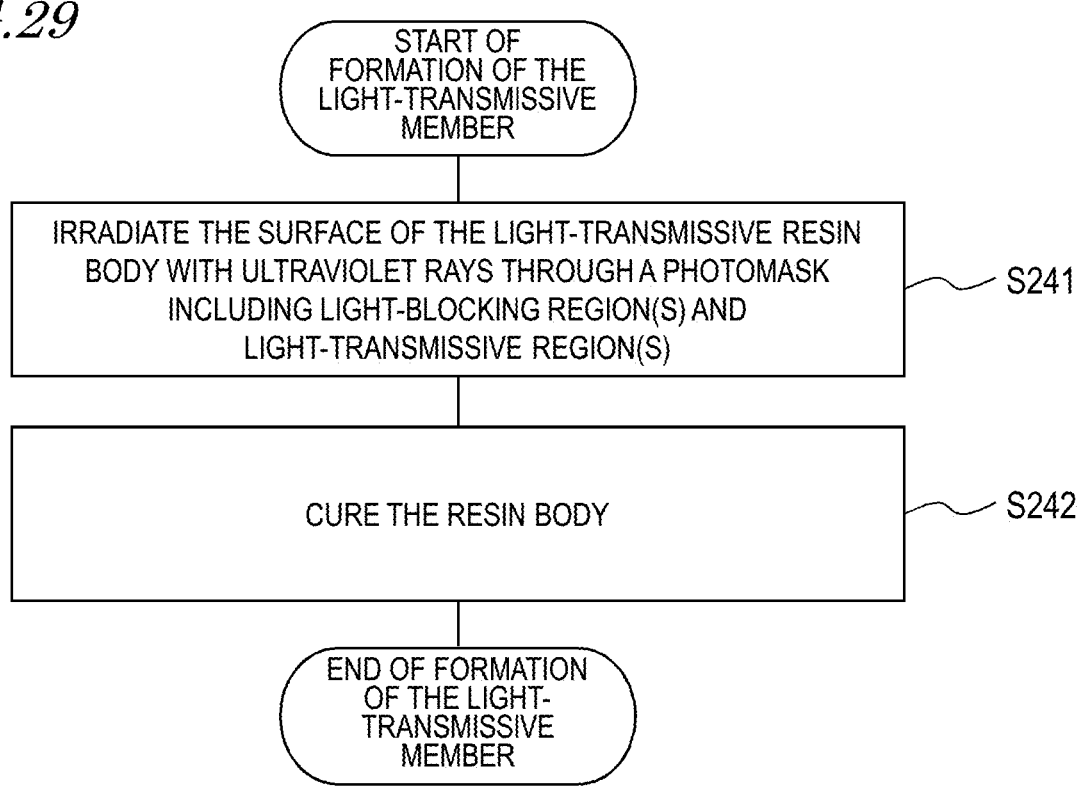
FIG. 29 shows steps that may be included in step 24 shown in FIG. 28.

The light emitting device 100A shown in FIG. 8 may also be produced as described below. FIG. 28 is a flowchart showing still another example of method for producing a light emitting device in embodiment 2 according to the present disclosure. The method for producing the light emitting device shown in FIG. 28 generally includes a step of preparing a light emitting element (step S23) and a step of forming a light-transmissive member including a concave and convex pattern at a surface thereof and covering at least a top surface of the light emitting element (step S24). In this example, as shown in FIG. 29, the step of forming the light-transmissive member (step S24 in FIG. 28) includes a step of irradiating the surface of the light-transmissive resin body with ultraviolet rays through a photomask including one or more light-blocking regions and light-transmissive regions (step S241). The resin body as a target to be irradiated with the ultraviolet rays through the photomask is a resin sheet including a light-transmissive portion formed by, for example, curing a silicone resin starting material. After the step of the irradiation with the ultraviolet rays, a step of curing the resin (step S242) may be performed when necessary.

Figure 30:
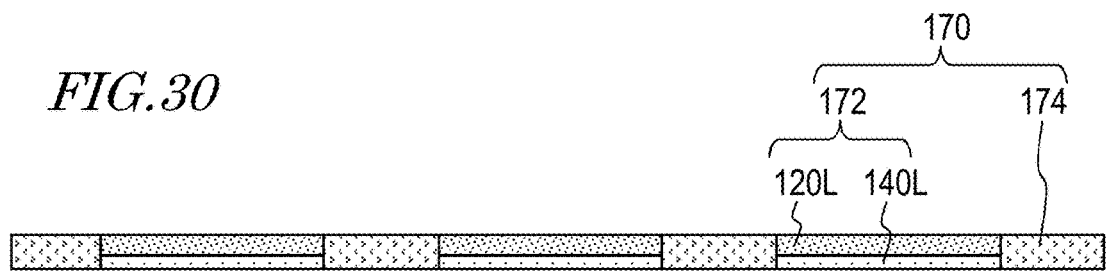
FIG. 30 is a schematic cross-sectional view showing still another example of method for producing the light emitting device in embodiment 2.

First, as shown in FIG. 30, a first resin layer 170 including a light-transmissive portion 172 is prepared. The resin layer 170 may include two or more light-transmissive portions 172. In the structure shown in FIG. 30, the resin layer 170 includes a light-reflective resin portion 174, and the light-transmissive portions 172 are separated from each other by the light-reflective resin portion 174. In this example, the light-transmissive portions 172 each include a light-transmissive layer 140L and a wavelength converting layer 120L. The resin layer 170 may be formed as follows, for example.

First, a light-reflective resin sheet is prepared. The light-reflective resin sheet may be formed of the third resin material described above. The light-reflective resin sheet may be formed of, for example, a silicone resin having particles of titanium dioxide and particles of silicon oxide dispersed therein at a content of about 60% by weight. The light-reflective sheet may be formed by compression molding, transfer molding, injection molding, printing or spraying.

Next, through-holes are formed in the light-reflective resin sheet by punching or the like. The through-holes are, for example, rectangular as seen in a plan view. After being formed, the through-holes are filled with, for example, the second resin material described above containing an uncured silicone resin as a matrix by potting, printing, spraying or the like. At this point, the particles of a phosphor in the second resin material filling the through-holes may be precipitated to cure the second resin material, so that a light-transmissive portion having different phosphor concentrations in the thickness direction is formed. For example, a light-transmissive portion in which the particles of the phosphor are more densely distributed in a region closer to a bottom surface thereof may be formed. Alternatively, a transparent resin material may be located inside of the through-holes and cured, and then the second resin material may be located on the transparent resin material to fill the through-holes.

In the case in which the particles of the phosphor are precipitated, and the resin sheet is put upside down after the second resin material is cured, the resin layer 170, as shown in FIG. 30, including the light-reflective resin portion 174 and the plurality of light-transmissive portions 172 is formed. In the structure shown in FIG. 30, the light-transmissive layer 140L included in each light-transmissive portion 172 has a lower concentration of the particles of the phosphor than that of the wavelength converting layer 120L also included in the light-transmissive portion 172. FIG. 30 shows the wavelength converting layer 120L and the light-transmissive layer 140L as being clearly separated from each other along a border. However, no clear border may be recognized between the wavelength converting layer 120L and the light-transmissive layer 140L. The silicone resin in the light-transmissive portion 172 may be in a preliminarily cured state.

Figure 31:
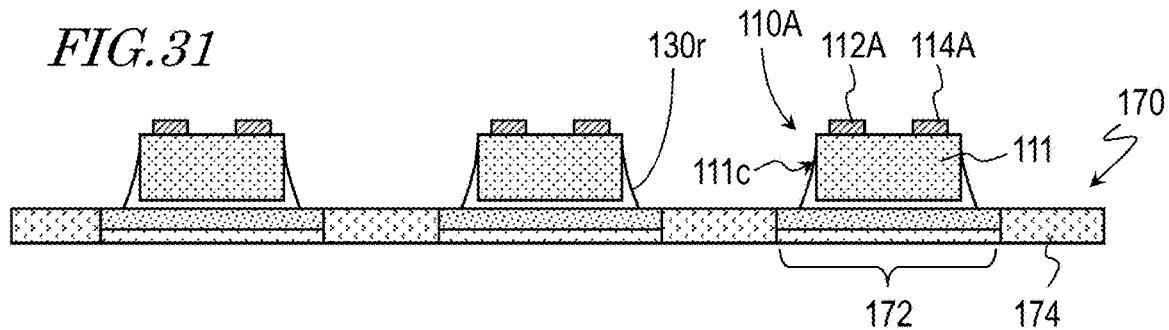
FIG. 31 is a schematic cross-sectional view showing the still another example of method for producing the light emitting device in embodiment 2.

Next, the light-transmissive first resin material 130r is put on regions of the resin layer 170 in which the light-transmissive layers 172 are located, by a dispenser or the like. Then, the light emitting element 110A is prepared (step S23 in FIG. 28), and as shown in FIG. 31, is located on the first resin material 130r such that the positive electrode 112A and the negative electrode 114A are located opposite to the resin layer 170. As a result, the first resin material 130r is located on at least a part of the side surface 111c of the main body 111. The first resin material 130r is cured to form the light guide member 130A of the first resin material 130r.

Figure 32:
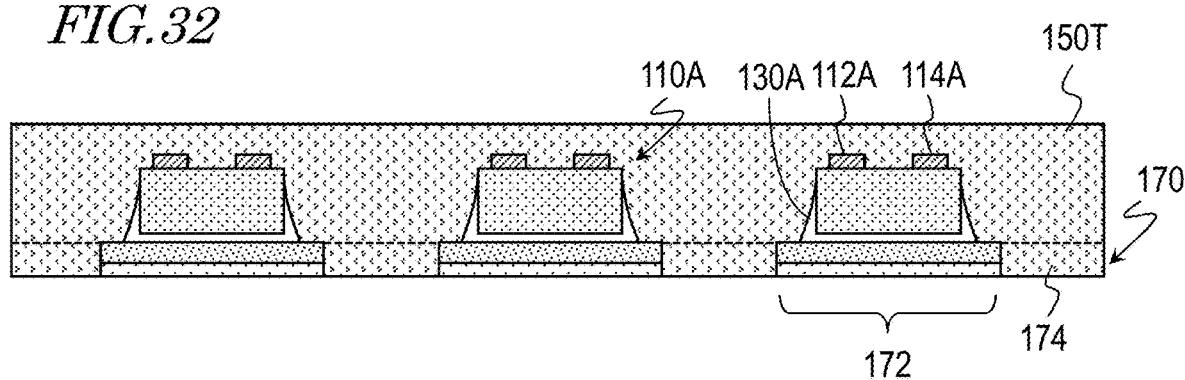
FIG. 32 is a schematic cross-sectional view showing the still another example of method for producing the light emitting device in embodiment 2.

Next, as shown in FIG. 32, the light-reflective resin layer 150T is formed as a second resin layer covering the components on the resin layer 170. The light-reflective resin layer 150T may be formed of the material used to form the light-reflective resin sheet described above, namely, the third resin material described above, like the light-reflective resin portion 174 of the resin layer 170. The light-reflective resin layer 150T may be formed by, for example, transfer molding.

Figure 33:
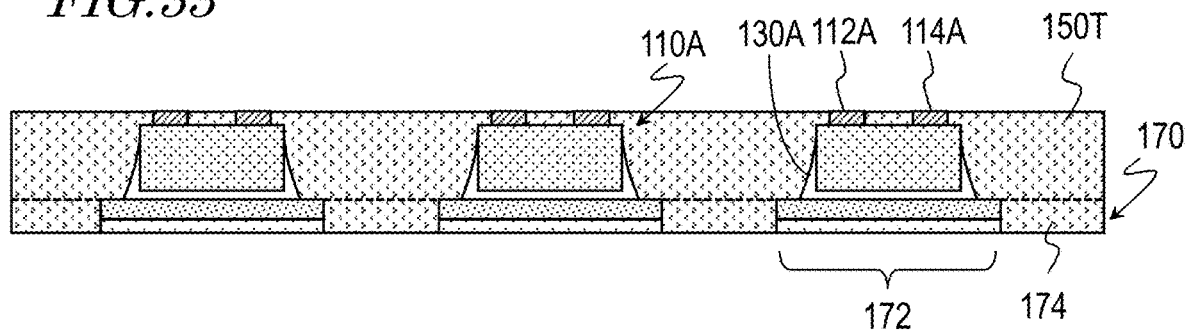
FIG. 33 is a schematic cross-sectional view showing the still another example of method for producing the light emitting device in embodiment 2.

Next, a part of the light-reflective resin layer 150T is removed from the side of the top surface thereof by grinding or the like to, as shown in FIG. 33, expose the positive electrode 112A and the negative electrode 114A of each of the light emitting elements 110A from the ground surface.

Figure 34:
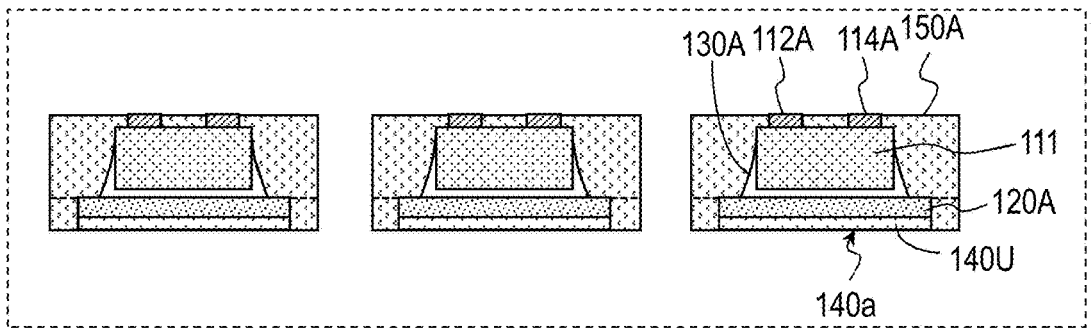
FIG. 34 is a schematic cross-sectional view showing the still another example of method for producing the light emitting device in embodiment 2.

Then, the resin layer 170 and the light-reflective resin layer 150T are cut by a dicing saw or the like at a position between two light emitting elements 110A adjacent to each other. As a result, the light-reflective member 150A is formed of the light-reflective resin portion 174 and the light-reflective resin layer 150T. As shown in FIG. 34, a plurality of light emitting bodies, each having substantially the same structure as that of the light emitting body 100U shown in FIG. 11, are formed. In this example, the light-transmissive layer 140L and the wavelength converting layer 120L of the light-transmissive portion 172 of the resin layer 170 respectively correspond to the light-transmissive resin body 140U and the wavelength converting member 120A.

Next, the light-transmissive member 140A covering at least the top surface of the light emitting element 110A is formed of the resin body 140U. The step of forming the light-transmissive member 140A may be performed in substantially the same manner as described above with reference to, for example, FIG. 23 and FIG. 24.

Figure 23:
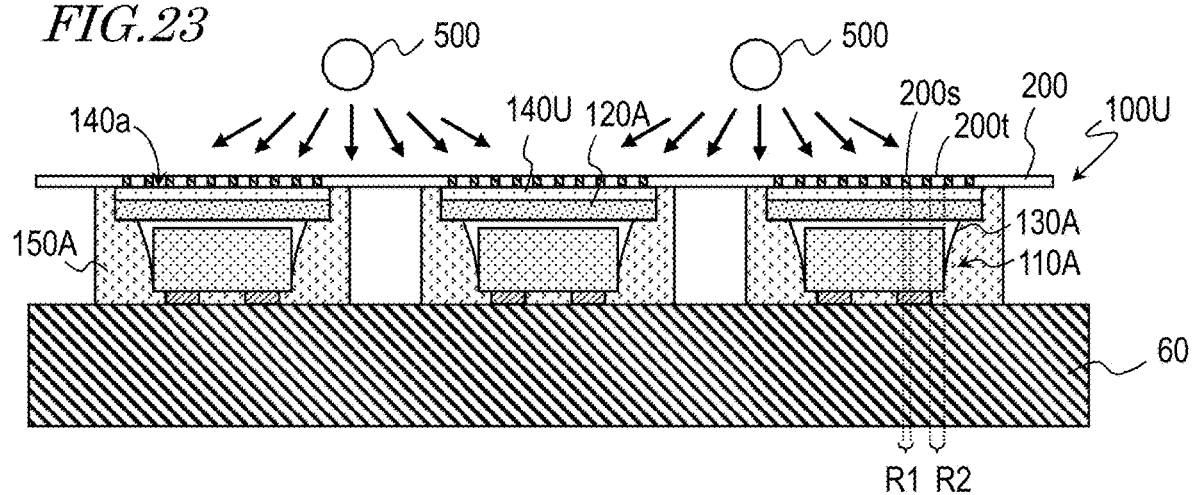
FIG. 23 is a schematic cross-sectional view showing another example of method for producing the light emitting device in embodiment 2.

For example, first, as shown in FIG. 23, the light emitting body 100U is located on the support body 60, and the photomask 200 is located on the top surface 100Ua. The top surface 140a of the resin body 140 is irradiated with ultraviolet rays through the photomask 200 (step S241 in FIG. 29). This step may also be performed in substantially the same manner as described above with reference to FIG. 6 regarding the irradiation of the principal surface 140a of the resin body 140X with the ultraviolet rays. As a result of the irradiation with the ultraviolet rays, a plurality of concave portions 140d are formed at the top surface 140a. As a result, the light-transmissive member 140A including the concave and convex pattern at the top surface thereof and covering the top surface of the light emitting element 110A is formed (step 24 in FIG. 28).

Alternatively, the plurality of concave portions 140d may be formed at the surface of the light-transmissive portions 172 of the resin layer 170 in substantially the same manner as described above with reference to FIG. 4 through FIG. 6. In the case in which the silicone resin in the resin body 140U is in a B-staged state, the resin body 140U may be cured by, for example, heating (step S242 in FIG. 29) after the concave portions 140d are formed, so that the light emitting device 100A including the light-transmissive member 140A is produced.

The step of the irradiation with the ultraviolet rays may be performed before the assemblage is divided into individual light emitting bodies, namely, at the stage of the assemblage including the plurality of light emitting bodies each having substantially the same structure as that of the light emitting body 100U. As shown in FIG. 33, after the positive electrode 112A and the negative electrode 114A are exposed from the light-reflective resin layer 150T but before the light-reflective resin layer 150T is cut, namely, in a state in which the plurality of light emitting bodies are integrally held by the light-reflective resin layer 150T, the step of the irradiation with the ultraviolet rays may be performed. After this, the light-reflective resin layer 150T may be cut, so that the plurality of light emitting devices 100A are produced.

Modification of Embodiment 2

Figure 35:
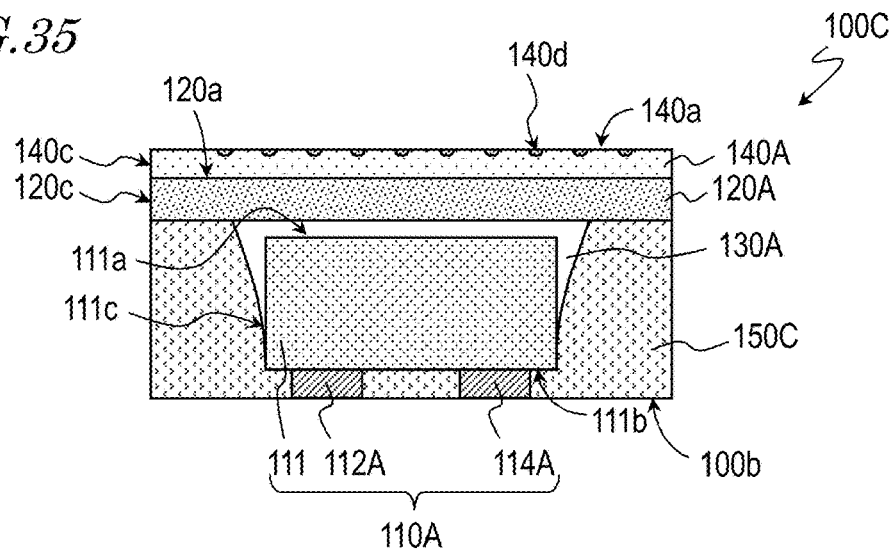
FIG. 35 is a cross-sectional view schematically showing still another example of light emitting device produced by the production method in embodiment 2.

FIG. 35 shows still another example of light emitting device produced by a production method in embodiment 2. A light emitting device 100C shown in FIG. 35 includes the light emitting element 110A, the wavelength converting member 120A, the light guide member 130A and the light-transmissive member 140A like in the example described above with reference to FIG. 8 and also includes a light-reflective member 150C. The light-reflective member 150C is substantially the same as the light-transmissive member 150A of the light emitting device 100A shown in FIG. 8 in that the light-reflective member 150C encloses the side surface of the light emitting element 110A and covers a region of the bottom surface 111b of the main body 111 excluding the positive electrode 112A and the negative electrode 114A. In this example, the light-reflective member 150C does not cover the side surface 120c of the wavelength converting member 120A or the side surface 140c of the light-transmissive member 140A, unlike the light-reflective member 150A of the light emitting device 100A.

Figure 36:
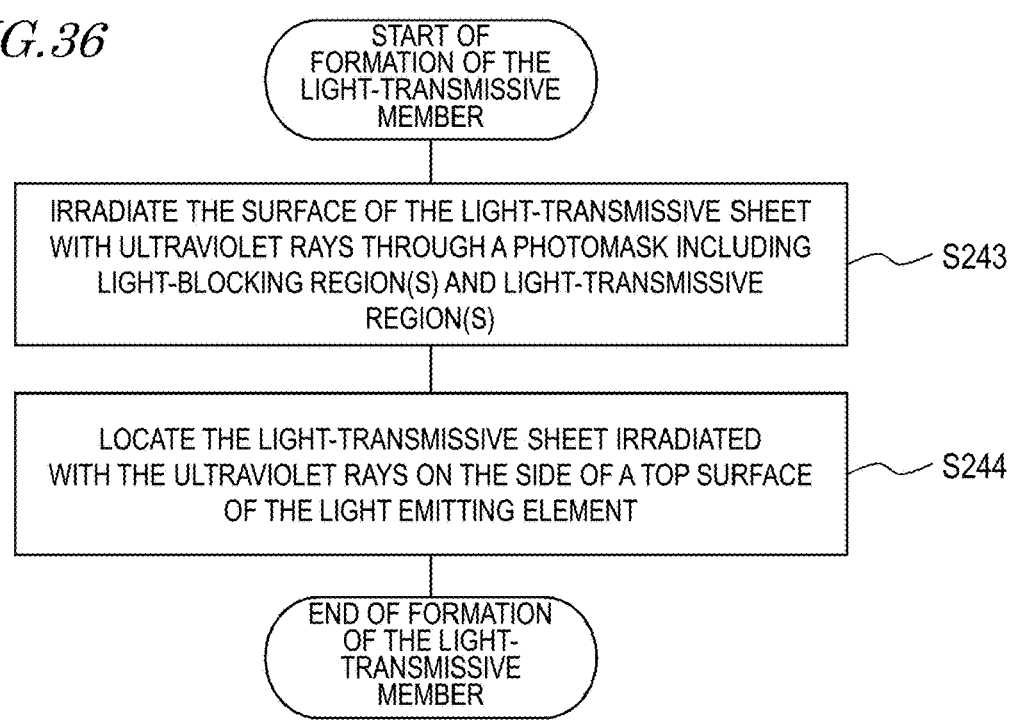
FIG. 36 shows another example of steps that may be included in step S24 shown in FIG. 28.

In general, the light emitting device 100C shown in FIG. 35 may be produced by the steps of the flowchart shown in FIG. 28, like in the example described above with reference to FIG. 30 through FIG. 34. It should be noted that as shown in FIG. 36, the step of forming the light-transmissive member 140A includes a step of irradiating the principal surface of the light-transmissive sheet with ultraviolet rays through a photomask including one or more light-blocking regions and light-transmissive regions (step S243) and a step of locating the light-transmissive sheet irradiated with the ultraviolet rays on the side of the top surface of the light emitting element (step S244). The light-transmissive sheet as a target to be irradiated with the ultraviolet rays through the photomask is typically formed by curing an uncured silicone resin starting material. Hereinafter, an illustrative method for producing the light emitting device 100C will be described in detail with reference to the drawings.

Figure 37:
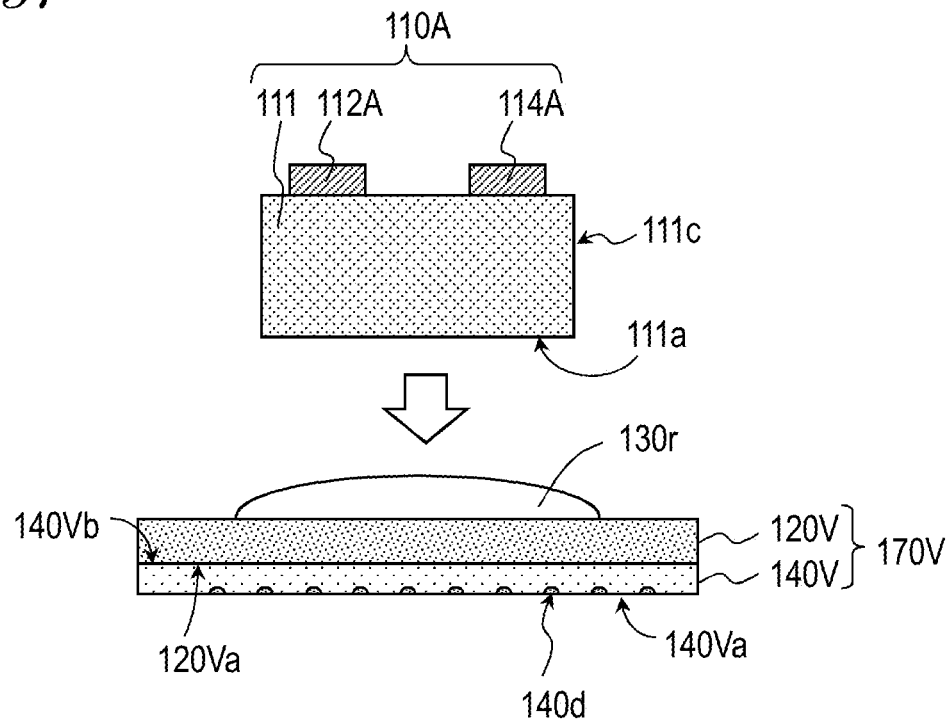
FIG. 37 is a schematic cross-sectional view showing still another example of method for producing the light emitting device in embodiment 2.

First, the light emitting element 110A is prepared (step S23 in FIG. 28). The light-transmissive member 140A covering at least the top surface of the light emitting element 110A is formed (step S24 in FIG. 28). In this example, the light-transmissive member 140A is formed as follows. First, a stack sheet piece 170V, as shown in FIG. 37, including a wavelength converting layer 120V and a light-transmissive layer 140V is prepared. In this example, the light-transmissive layer 140V has a principal surface 140Va and a principal surface 140Vb. The principal surface 140Vb faces one principal surface 120Va of the wavelength converting layer 120V. As schematically shown in FIG. 37, the light-transmissive layer 140V includes a plurality of concave portions 140d at the principal surface 140Va. The stack sheet piece 170V may be formed in, for example, substantially the same manner as the stack sheet piece LB described above.

First, a light-transmissive resin sheet having a principal surface (hereinafter, may be referred to simply as the "light-transmissive sheet") is prepared. The light-transmissive sheet may be formed by, for example, curing an uncured silicone resin starting material. The resin body 140X described above is an example of the light-transmissive sheet. The light-transmissive sheet may be in a B-staged state.

After the light-transmissive sheet is prepared, the photomask 200 is located on or above the principal surface of the light-transmissive sheet. The principal surface of the light-transmissive sheet is irradiated with ultraviolet rays through the photomask 200 by, for example, the ultraviolet ray irradiation device 500 (step S243 in FIG. 36). As a result of the irradiation with the ultraviolet rays through the photomask 200, the heights of the first regions R1, of the principal surface of the light-transmissive sheet, that correspond to the light-blocking regions 200s of the photomask 200, and the height of the second region(s) R2, of the principal surface of the light-transmissive sheet, that correspond to the light-transmissive region(s) 200t of the photomask 200, are made different from each other. Thus, the plurality of concave portions 140d are formed at the principal surface of the light-transmissive sheet. The step of forming the concave portions at the principal surface of the light-transmissive sheet may be performed in substantially the same manner as described above with reference to FIG. 4 through FIG. 6 regarding the formation of the plurality of concave portions 140d at the principal surface 140a of the resin body 140X.

As a result of these steps, the light-transmissive sheet including the plurality of concave portions 140d at the principal surface 140a, like the light-transmissive member 140 shown in FIG. 7, is formed. The light-transmissive sheet irradiated with the ultraviolet rays is cut into a predetermined size when necessary. In this example, the light-transmissive sheet has, for example, a rectangular external shape as seen in a plan view. Then, the wavelength converting layer 120V is formed at a principal surface of the light-transmissive sheet opposite to the principal surface 140a. As a result of the formation of the wavelength converting layer 120V, the stack sheet piece 170V including the above-described light-transmissive sheet as the light-transmissive layer 140V is formed.

The wavelength converting layer 120V may be formed by substantially the same technique as for the formation of the stack sheet piece LB. For example, a resin in a resin material having particles of a phosphor dispersed therein is put into a B-staged state to form a phosphor sheet, and the phosphor sheet is located on the principal surface of the light-transmissive sheet opposite to the principal surface 140a. The phosphor sheet and the light-transmissive sheet are heated to be bonded together. Thus, the stack sheet piece 170V including the wavelength converting layer 120V and the light-transmissive layer 140V is formed. Alternatively, the second resin material may be put on the principal surface of the light-transmissive sheet opposite to the principal surface 140a and then cured to form the wavelength converting layer 120V. The stack sheet piece 170V may be purchased. The plurality of concave portions 140d may be formed after the wavelength converting layer 120V is formed on one of the principal surfaces of the light-transmissive layer 140V. For example, after the wavelength converting layer 120V is formed on one of the principal surfaces of the light-transmissive layer 140V, the plurality of concave portions 140d may be formed on the principal surface of the light-transmissive layer 140V opposite to the wavelength converting layer 120V.

Figure 38:
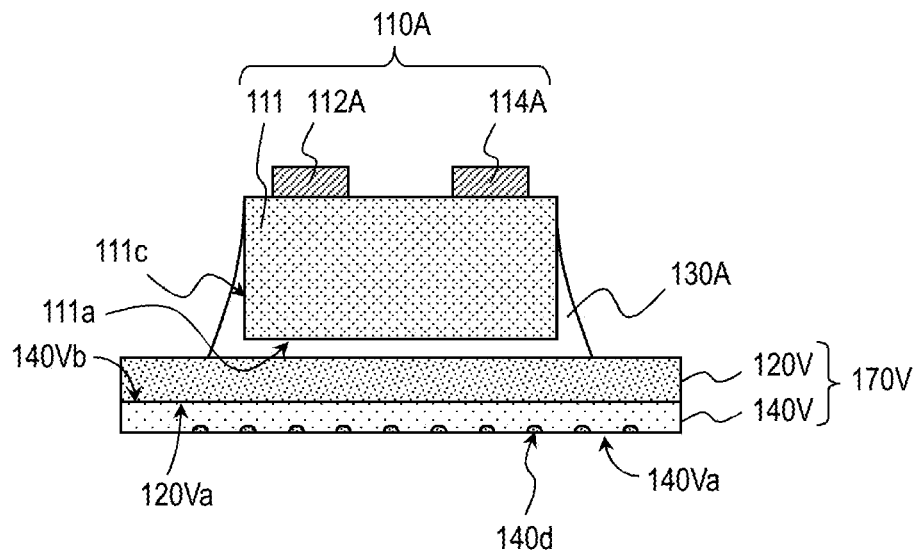
FIG. 38 is a schematic cross-sectional view showing the still another example of method for producing the light emitting device in embodiment 2.

Then, the light-transmissive sheet irradiated with the ultraviolet rays is located on the side of the top surface of the light emitting element 110A (step S244 in FIG. 36). In this example, as schematically shown in FIG. 37, the first resin material 130r is put on the wavelength converting layer 120V, and the light emitting element 110A is located on the first resin material 130r. At this point, the light emitting element 110A is located on the first resin material 130r such that the top surface 111a of the main body 111 faces the stack sheet piece 170V. As a result, the first resin material 130r is located on at least a part of the side surface 111c of the main body 111. The first resin material 130r is cured, and as a result, as shown in FIG. 38, the light guide member 130A is formed, and thus the above-described light-transmissive sheet is located as the light-transmissive layer 140V on the side of the top surface of the light emitting element 110A. FIG. 37 and FIG. 38 each show one light emitting element 110A. Alternatively, a plurality of the light emitting elements 110A may be located on the stack sheet piece 170V, as in the example shown in FIG. 31, in which the plurality of light emitting elements 110A are located on the resin layer 170.

Figure 39:
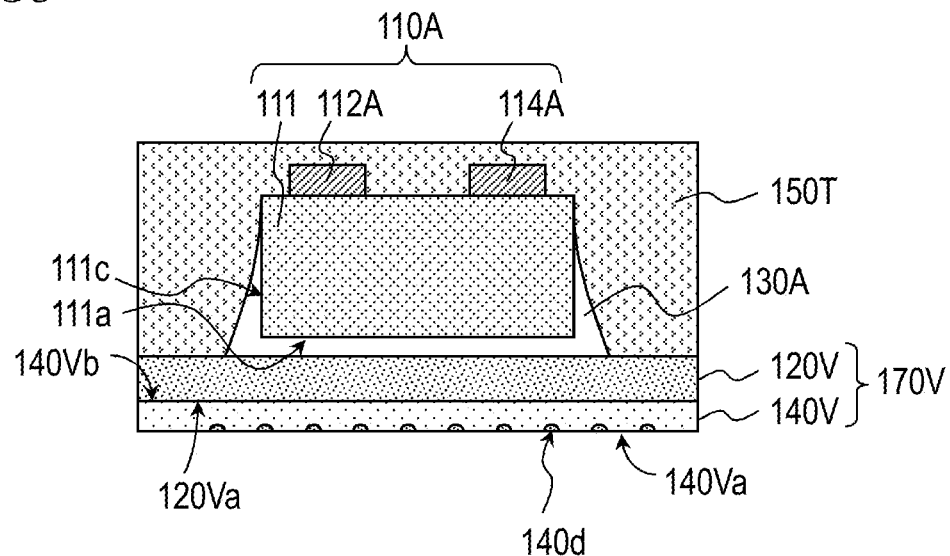
FIG. 39 is a schematic cross-sectional view showing the still another example of method for producing the light emitting device in embodiment 2.

Next, for example, the third resin material is put on the stack sheet piece 170V to cover the components on the stack sheet piece 170V with the third resin material, and the third resin material is cured. As a result of the third resin material being cured, as shown in FIG. 39, the light-reflective resin layer 150T covering the light emitting element 110A and the light guide member 130A is formed. The light-reflective resin layer 150T is formed by, for example, transfer molding. In the case in which the silicone resin in the light-transmissive resin layer 140V is in a B-staged state, the silicone resin in in the light-transmissive layer 140V may be cured in the step of forming the light-reflective resin layer 150T.

Figure 40:
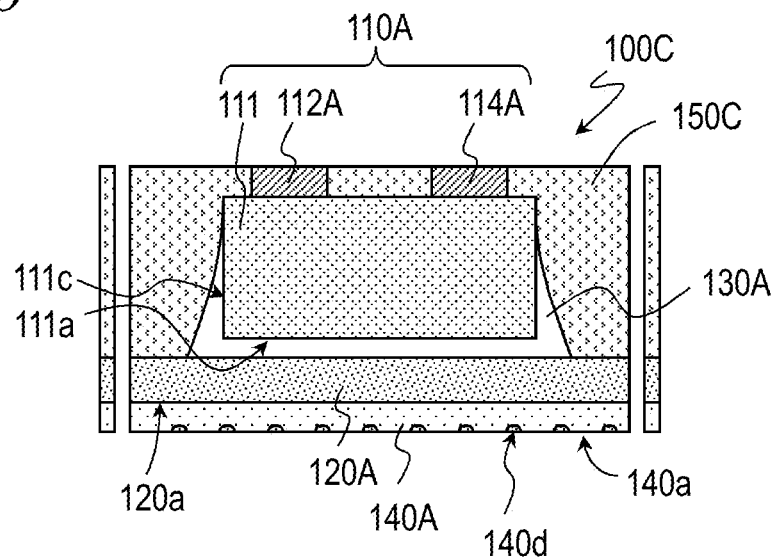
FIG. 40 is a schematic cross-sectional view showing the still another example of method for producing the light emitting device in embodiment 2.

Then, the light-reflective resin layer 150T is, for example, ground to expose the positive electrode 112A and the negative electrode 114A from the ground surface, and as shown in FIG. 40, the stack sheet piece 170V and the light-reflective resin layer 150T are cut into a desired shape by a dicing saw or the like. As a result of the above-described steps, the light-transmissive member 140A and the wavelength converting member 120A are formed of the stack sheet piece 170V, and the light-reflective member 150C is formed of the light-reflective resin layer 150T. As a result, the light emitting device 100C shown in FIG. 35 is produced. The light-transmissive sheet in this example includes the plurality of concave portions 140d at the light-transmissive layer 140V, among the wavelength converting layer 120V and the light-transmissive layer 140V of the stack sheet piece 170V. The light emitting device 100C is not limited to this, and a phosphor sheet including a plurality of concave portions formed by substantially the same technique as described above with reference to FIG. 4 through FIG. 6 may be used as the wavelength converting layer 120V. In this case, the light-transmissive layer 140V may be omitted, and the light-transmissive member located above the top surface of the light emitting element 110A may be formed of the wavelength converting layer 120V.

In this embodiment, an example in which the principal surface 140a at which the concave portions 140d are formed is the top surface (surface) of the light emitting device is shown. It should be noted that the concave portions 140d do not need to be formed at the surface of the light emitting device. For example, the principal surface 140a at which the concave portions 140d are formed may be located to face the top surface of the light emitting element or the light emitting body. Alternatively, the principal surface 140a and the principal surface 140b opposite to the principal surface 140a may both be provided with the concave and convex pattern. The inside of the concave portions 140d may be filled with the air or a material having a refractive index different from that of the material used to form the light-transmissive member 140A. In either case, it is common to the above-described examples that the concave and convex pattern is formed at the surface of the light-transmissive member 140A.

Embodiment 3

Figure 41:
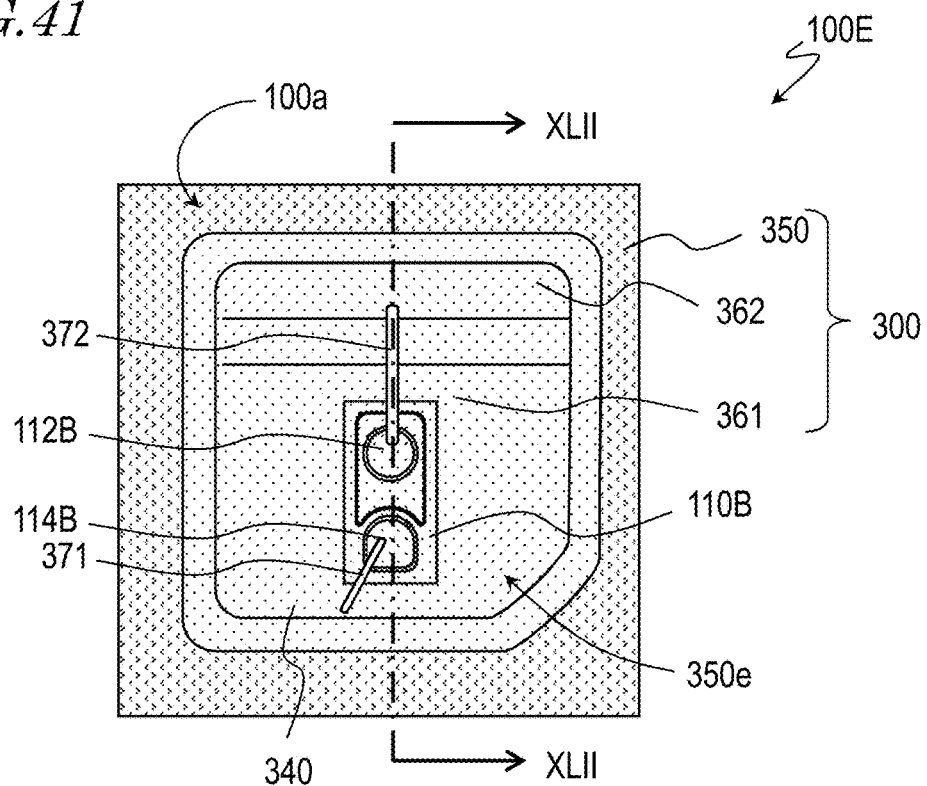
FIG. 41 is a plan view schematically showing an external appearance of an illustrative light emitting device produced by a production method in embodiment 3 according to the present disclosure.
Figure 42:
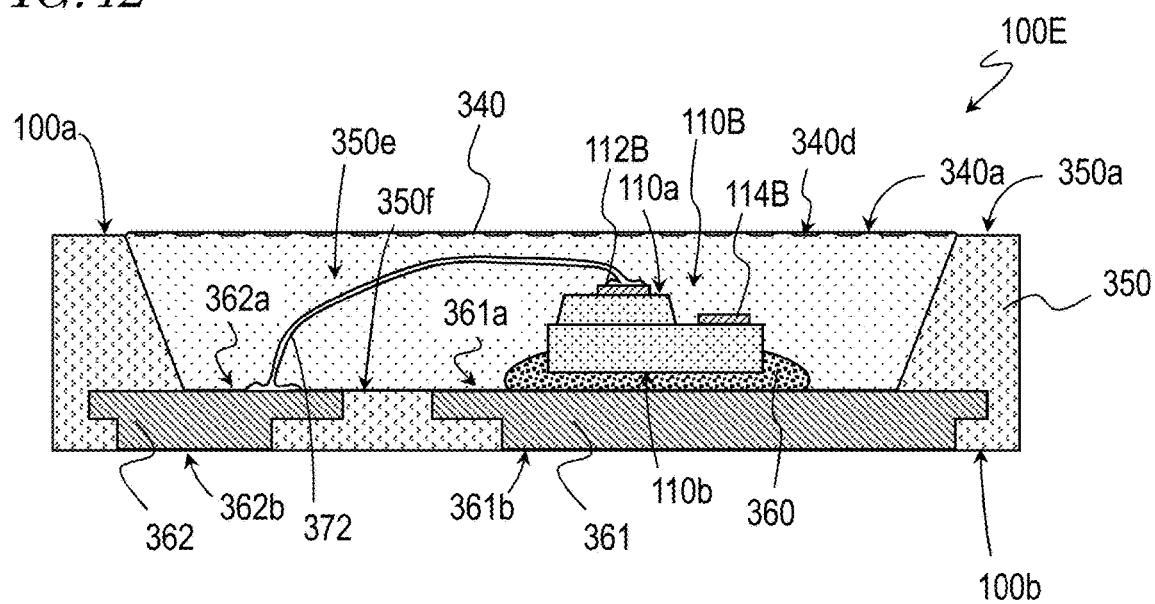
FIG. 42 is a cross-sectional view schematically showing a structure of the illustrative light emitting device produced by the production method in embodiment 3.

FIG. 41 and FIG. 42 show an example of light emitting device produced by a production method in embodiment 3. FIG. 41 shows an illustrative external appearance of a light emitting device 100E as seen in a plan view, and FIG. 42 is a cross-sectional view of the light emitting device 100E taken along line XLII-XLII in FIG. 41.

The light emitting device 100E shown in FIG. 41 and FIG. 42 generally includes a light emitting element 110B and a package 300. The package 300 includes a resin portion 350 enclosing the light emitting element 110B and a pair of leads 361 and 362. A concave portion 350e is provided at a center of the resin portion 350 of the package 300, and the light emitting element 110B is located inside the concave portion 350e. The resin portion 350 is formed of, for example, the third resin material having particles of a light-reflective filler dispersed therein, like the light-reflective members 150A through 150C described above, and has a function of reflecting light emitted from the light emitting element 110B to output the light outside from a top surface 100a of the light emitting device 100E. The "package" in this embodiment may be a resin package described above including the resin portion containing a resin, which is an insulating material, as a matrix and a conductive lead, or a known package for electronic components such as a ceramic package using a ceramic material, a metal package, or the like.

As shown in FIG. 42, a part of a top surface 361a of the lead 361 and a part of a top surface 362a of the lead 362 form a part of a bottom surface 350f of the concave portion 350e, and a bottom surface 361b of the lead 361 and a bottom surface 362b of the lead 362 are exposed from a bottom surface 100b of the light emitting device 100E. In this example, the light emitting element 110B is secured to the lead 361 by a joining member 360. The joining member 360 is formed of an insulating material such as a resin material or the like, for example, epoxy resin or silicone resin or a conductive material such as an Ag paste or the like.

In the structure shown in FIG. 41 and FIG. 42, the light emitting element 110B includes a positive electrode 112B and a negative electrode 114B on a top surface 110a opposite to a bottom surface 110b. The positive electrode 112B and the negative electrode 114B are respectively connected with conductive wires 372 and 371 formed of Au, Ag, Al, Cu or the like. In this example, the positive electrode 112B is electrically connected with the lead 362 via the wire 372, and the negative electrode 114B is electrically connected with the lead 361 via the wire 371.

The light emitting device 100E further includes a light-transmissive member 340 located inside the concave portion 350e. As schematically shown in FIG. 42, the light-transmissive member 340 covers the light emitting element 110B and the wires 372 and 371. As schematically shown in FIG. 42, the light-transmissive member 340 includes a plurality of concave portions 340d located, for example, two-dimensionally at a top surface 340a located above the top surface 110a of the light emitting element 110B. In this example, the top surface 340a of the light-transmissive member 340 is generally aligned positionally with a top surface 350a of the resin portion 350, and forms the top surface 100a of the light emitting device 100E together with the top surface 350a of the light-transmissive member 340.

Figure 43:
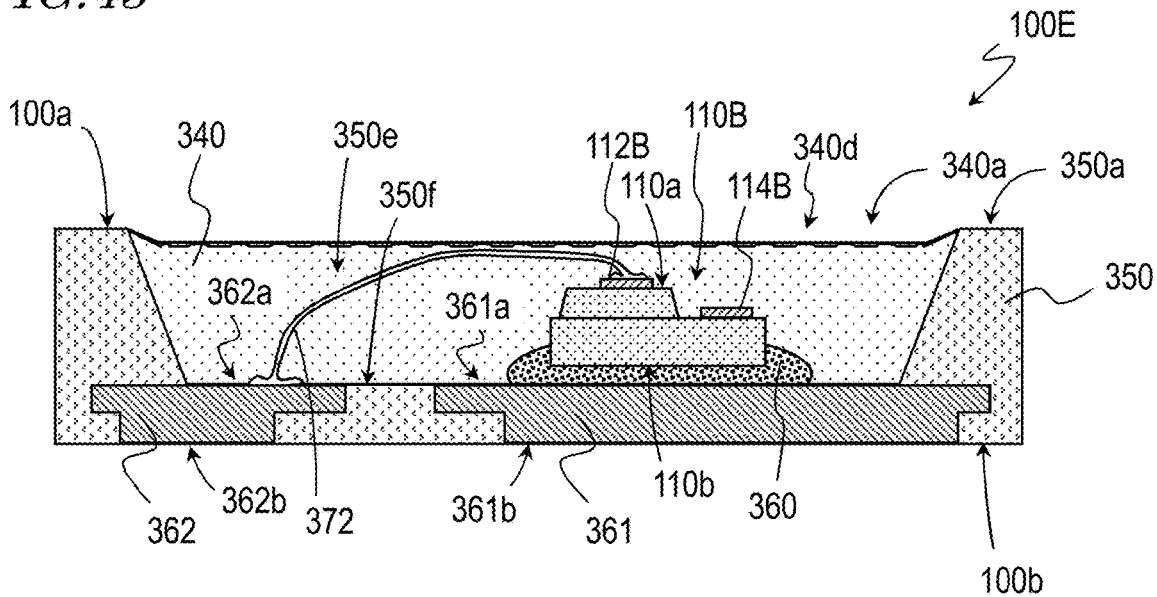
FIG. 43 is a cross-sectional view schematically showing another example of light emitting device produced by the production method in embodiment 3.

It is not indispensable that the top surface 340a of the light-transmissive member 340 is generally aligned positionally with the top surface 350a of the resin portion 350. As schematically shown in FIG. 43, the top surface 340a of the light-transmissive member 340 may have a shape having a recess at a center thereof as compared with a periphery thereof. Although not shown, the top surface 340a of the light-transmissive member 340 may have a shape protruding at the center thereof.

Figure 44:
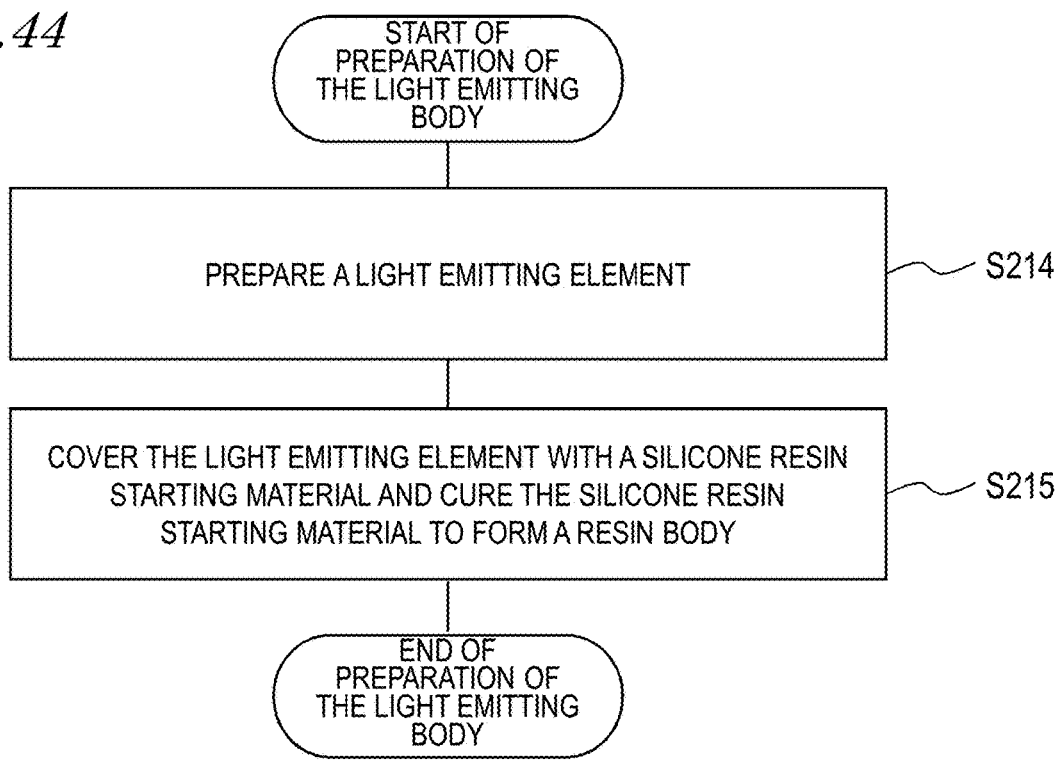
FIG. 44 shows another example of steps that may be included in step S21 shown in FIG. 9.

Hereinafter, an illustrative method for producing the light emitting device 100E will be described. The light emitting device 100E shown in FIG. 41 and FIG. 42 may be produced generally by substantially the same steps as shown in the flowchart of FIG. 9. In this example, however, as shown in FIG. 44, the step of preparing a light emitting body includes a step of preparing a light emitting element having a top surface (step S214) and a step of covering the light emitting element with a silicone resin starting material and curing the silicone resin starting material to form a resin body (step S215). The step of forming the light-transmissive member may be substantially the same as described above with reference to FIG. 10.

Figure 45:
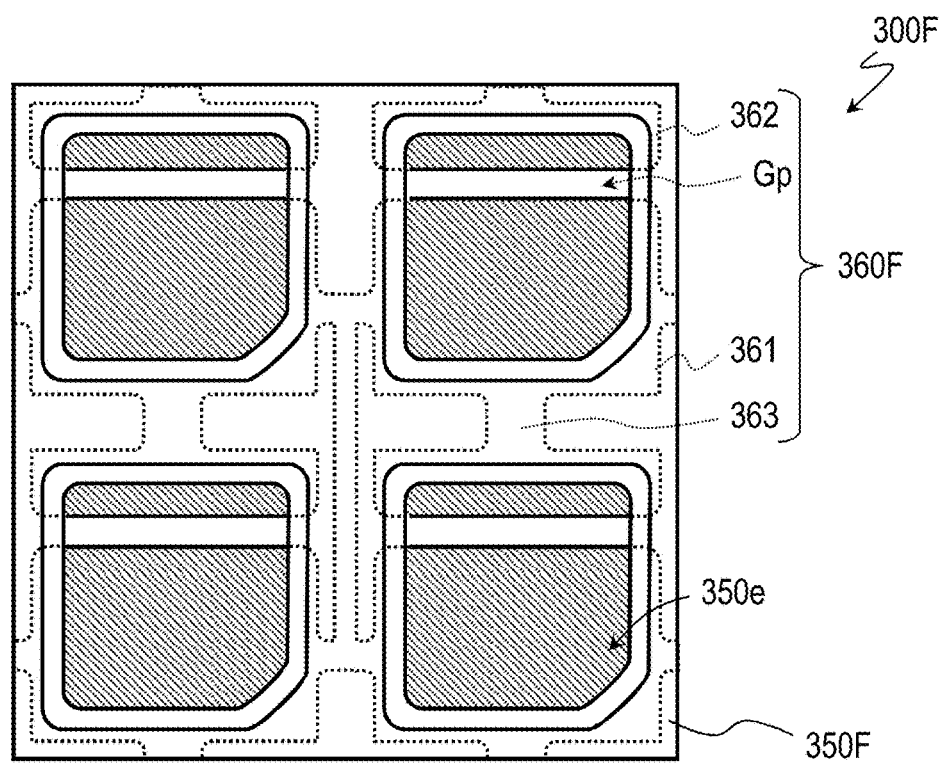
FIG. 45 is a schematic plan view showing an example of composite substrate 300F.

The light emitting body is prepared as follows (step 21 in FIG. 9). First, the light emitting element 110B and the package 300 are prepared (step S214 in FIG. 44). The package 300 may be prepared in the form of a composite substrate including a plurality of units each forming the package 300. FIG. 45 shows an example of composite substrate. A composite substrate 300F shown in FIG. 45 includes a conductive lead frame 360F and a resin portion 350F including a plurality of the concave portions 350e. FIG. 45 shows four of the plurality of units each including one concave portion 350e.

As schematically shown in FIG. 45, the lead frame 360F includes a plurality of sets of conductive leads each including the lead 361 as a first conductive member and the lead 362 as a second conductive member, and a plurality of coupling portions 363 each located between, and connecting, two sets of the plurality of sets adjacent to each other. The leads 361 and 362 may include, for example, a base plate formed of Cu and a metal layer covering the base plate. The metal layer covering the base plate is, for example, a plated layer containing Ag, Al, Ni, Pd, Rh, Au, Cu, an alloy thereof, or the like. The metal layer covering the base plate may have a stack structure including layers each containing at least one of these metal materials.

A part of the lead 361 and a part of the lead 362 are exposed at the bottom of each of the concave portion 350e of the resin portion 350F. Each set of the lead 361 and the lead 362 facing each other in the concave portion 350e has a gap Gp formed by the lead 361 and the lead 362 being spatially separated from each other. The composite substrate 300F may be formed as follows. The resin portion 350F is formed by transfer molding or the like so as to be integral with the lead frame 350F. The gap Gp is filled with a material used to form the resin portion 350F.

Figure 46:
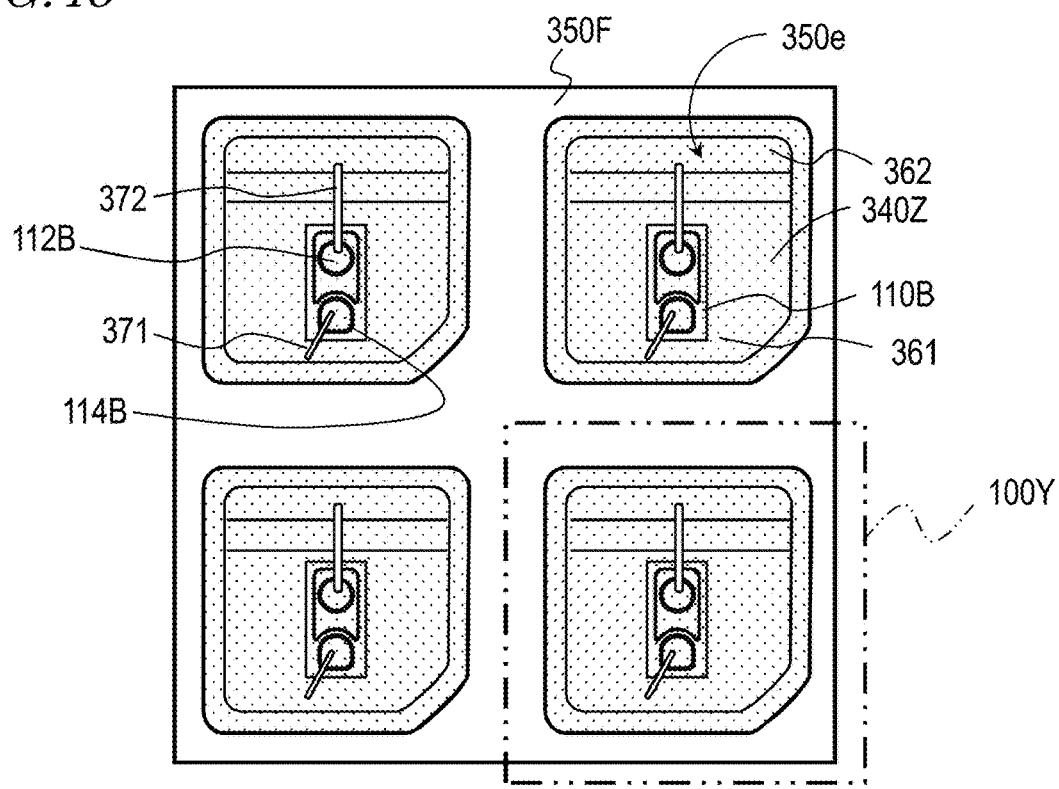
FIG. 46 is a schematic plan view showing a method for producing the light emitting device in embodiment 3.

Next, as shown in FIG. 46, the light emitting element 110B is located in each concave portion 350e, and the positive electrode 112B and the negative electrode 114B are respectively electrically connected with the leads 362 and 361 via the wires 372 and 371.

The concave portions 350e are filled with a silicone resin starting material containing an uncured silicone resin, and the silicone resin starting material is cured to form a light-transmissive resin body 340Z covering the light emitting element 110B (step S215 in FIG. 44). The silicone resin starting material used to form the resin body 340Z may be substantially the same as the material of the resin body 140X described above. Namely, the silicone resin in the resin body 340Z typically contains an organic polysiloxane including at least one phenyl group in a molecule and/or an organic polysiloxane including a D unit, in which two methyl groups are bonded with a silicon atom. The silicone resin starting material may further have particles of a light-scattering filler dispersed therein.

As a result of the above-described steps, a structure including a plurality of light emitting bodies 100Y in a repeated manner is formed as shown in FIG. 46. The light emitting bodies 100Y each include the light emitting element 110B and the light-transmissive resin body 340Z. In this example, a concave and convex pattern is formed at the top surface of the resin body 340Z in substantially the same manner as in the example described above with reference to FIG. 19 or FIG. 23.

Figure 47:
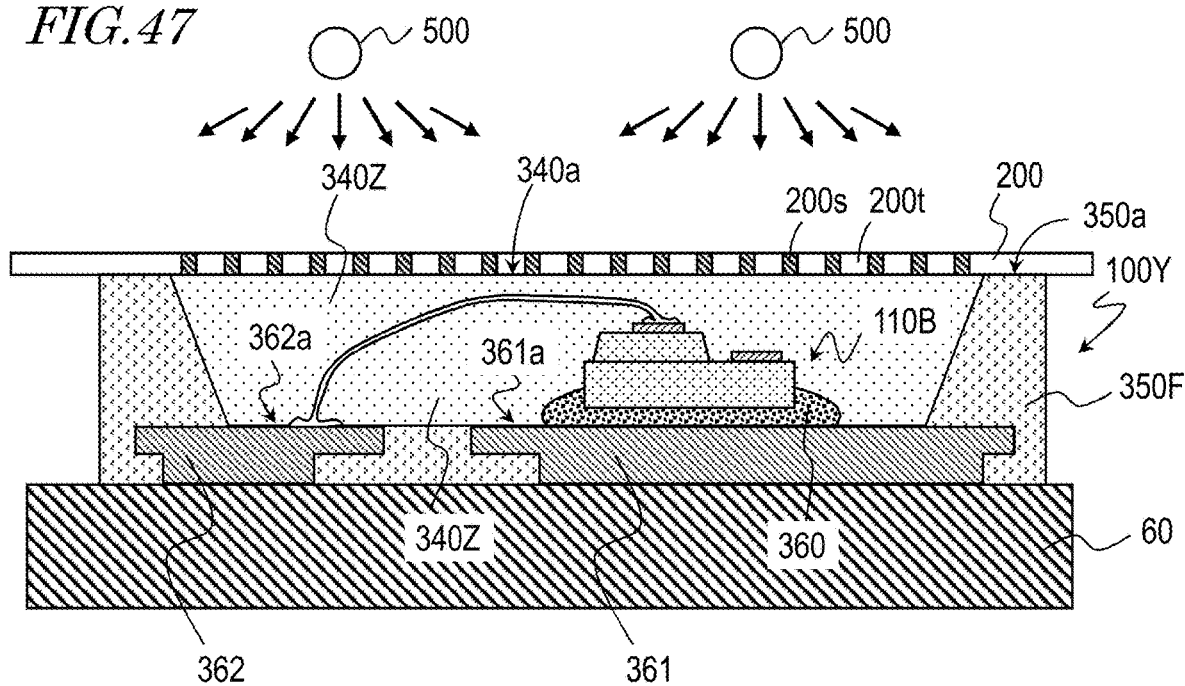
FIG. 47 is a schematic cross-sectional view showing the method for producing the light emitting device in embodiment 3.
Figure 48:
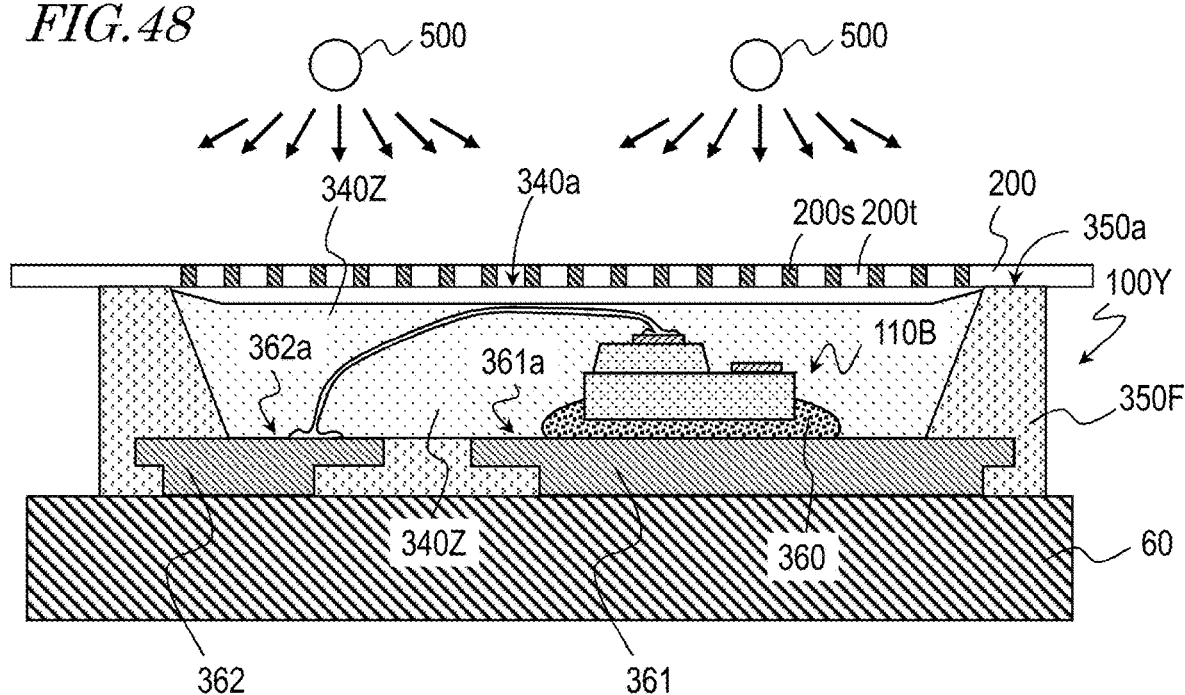
FIG. 48 is a schematic cross-sectional view showing the method for producing the light emitting device in embodiment 3.

For example, as schematically shown in FIG. 47, the light emitting body 100Y is located on the support body 60, and the photomask 200 is located on the side of an opening of the concave portion 350e. In this step, as shown in FIG. 47, the photomask 200 may be in contact with the resin body 340Z. In the case in which the top surface of the resin body 340Z has a shape having a recess, the photomask 200 may be located, as shown in FIG. 48, in contact with the resin portion 350F but not in contact with the resin body 340Z.

Figure 49:
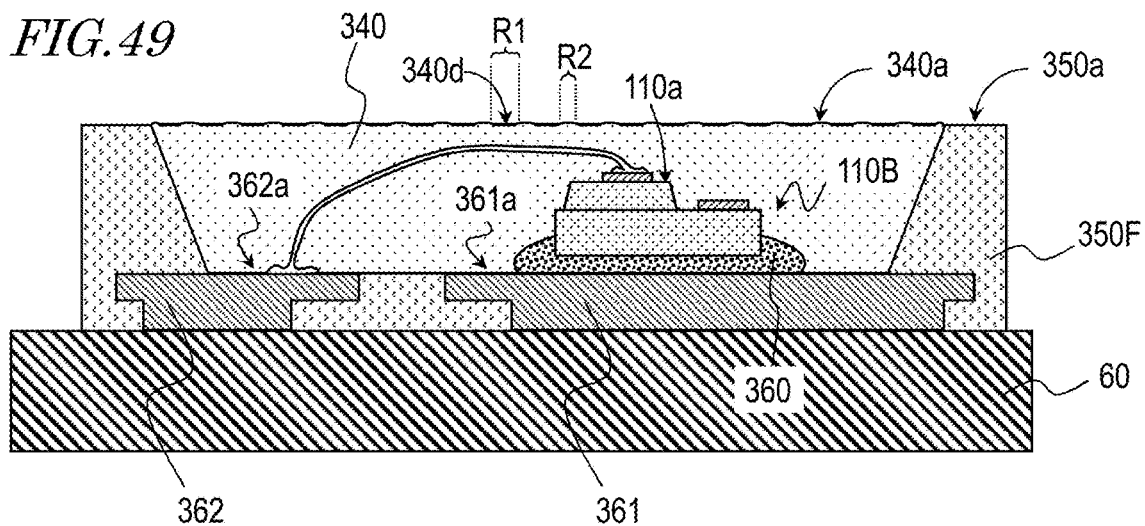
FIG. 49 is a schematic cross-sectional view showing the method for producing the light emitting device in embodiment 3.

The top surface 340a of the resin body 340Z (corresponding to, for example, the top surface 140a of the resin body 140U shown in FIG. 19 or FIG. 23) is irradiated with ultraviolet rays through the photomask 200 by, for example, the ultraviolet ray irradiation device 500 (step S221 in FIG. 10). As a result of the irradiation with the ultraviolet rays, as schematically shown in FIG. 49, the height of the first regions R1, of the top surface 340a, that correspond to the light-blocking regions 200s of the photomask 200, and the height of the second region(s) R2, of the top surface 340a, that correspond to the light-transmissive region(s) 200t of the photomask 200, are made different from each other. Thus, the light-transmissive member 340 covering the top surface 110a of the light emitting element 110B and including the plurality of concave portions 340d at the top surface 340a is formed of the resin body 340Z. Then, the resin portion 350F and the coupling portion 363 of the lead frame 360F are cut at position between two light emitting bodies 100Y adjacent to each other by a dicing saw or the like. As a result, a plurality of the light emitting devices 100E are produced.

Before the resin body 340Z is formed, a wavelength converting member that covers the light emitting element 110B may be formed. For example, the second resin material, which is a resin material containing a phosphor, is put inside each concave portion 350e to cover the light emitting element 110B and is cured to form a wavelength converting member. Then, the resin body 340Z is formed on the wavelength converting member.

Figure 50:
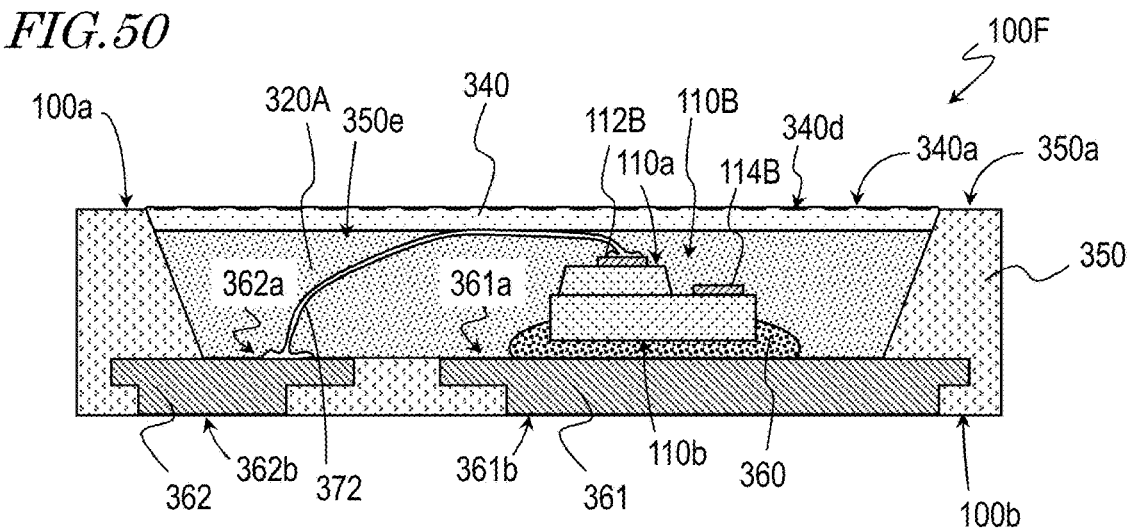
FIG. 50 is a cross-sectional view schematically showing a structure of another illustrative light emitting device produced by the production method in embodiment 3.
Figure 51:
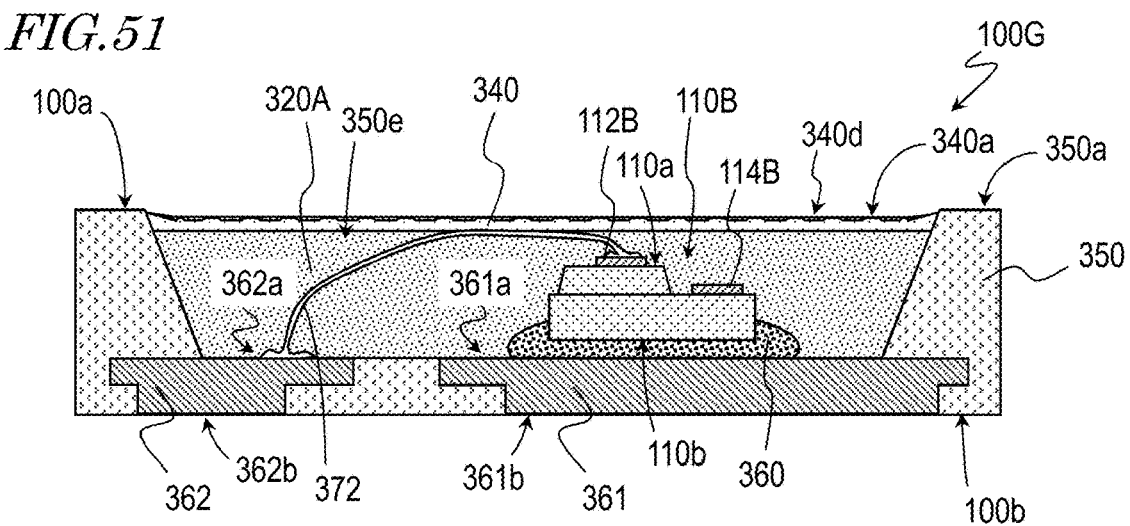
FIG. 51 is a cross-sectional view schematically showing a structure of still another illustrative light emitting device produced by the production method in embodiment 3.

Then, the steps described above with reference to FIG. 47 and FIG. 48 are performed to produce a light emitting device 100F shown in FIG. 50 or a light emitting device 100G shown in FIG. 51. The light emitting device 100F and the light emitting device 100G each include the wavelength converting member 320A covering the light emitting element 110B and the light-transmissive member 340 covering the wavelength converting member 320A both inside the concave portion 350e. Either in the light emitting device 100F or the light emitting device 100G, the light-transmissive member 340 includes the plurality of concave portions 340d at the top surface 340a thereof. In the example shown in FIG. 51, unlike in the example shown in FIG. 50, the top surface 340a of the light-transmissive member 340 has a shape recessed at the center thereof, and the top surface top surface 340a is mostly lower than the top surface 350a of the resin portion 350.

Figure 52:
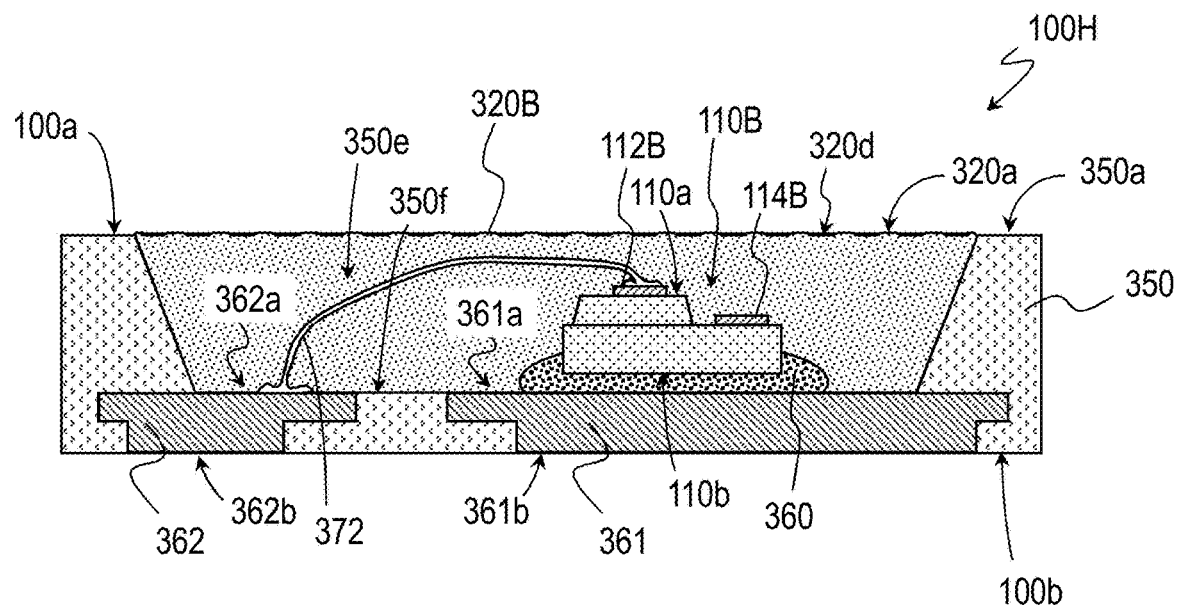
FIG. 52 is a cross-sectional view schematically showing a structure of yet another illustrative light emitting device produced by the production method in embodiment 3.
Figure 53:
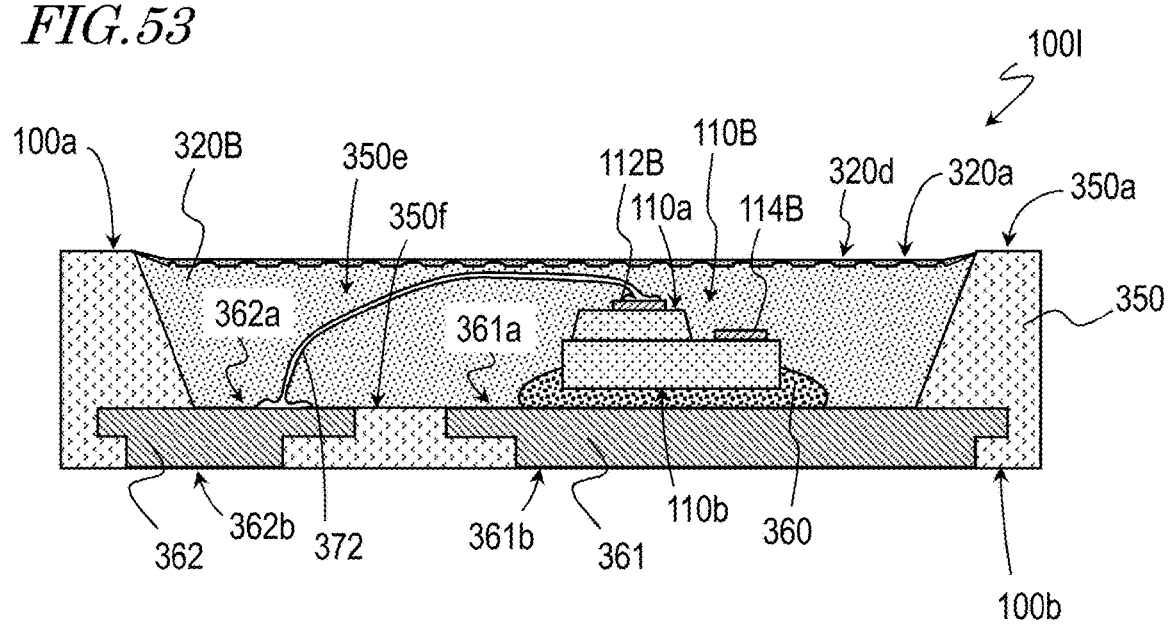
FIG. 53 is a cross-sectional view schematically showing a structure of the yet another illustrative light emitting device produced by the production method in embodiment 3.

Alternatively, the second resin material containing a silicone resin may be used as a silicone resin starting material to fill each concave portion 350e. The second resin material inside the concave portion 350e is cured to form a light emitting body, and substantially the same steps as described above with reference to FIG. 47 and FIG. 48 are performed. Thus, a light emitting device 100H shown in FIG. 52 or a light emitting device 100I shown in FIG. 53 is produced. The light emitting device 100H and the light emitting device 100I each include a wavelength converting member 320B covering the light emitting element 110B inside the concave portion 350e. As schematically shown in FIG. 52 and FIG. 53, the wavelength converting member 320B includes a plurality of concave portions 320d at a top surface 320a thereof. In the same manner as described above regarding FIG. 50 and FIG. 51, in the example shown in FIG. 53, unlike in the example shown in FIG. 52, the top surface 320a of the light-transmissive member 320 has a shape recessed at a center thereof, and the top surface 320a is mostly lower than the top surface 350a of the resin portion 350. As can be seen, the plurality of concave portions 320d may be formed at the wavelength converting member 320B as a light-transmissive member by irradiating a part of the wavelength converting member 320B with ultraviolet rays.

In embodiment 3 according to the present disclosure, like in embodiment 2, the surface of the light-transmissive resin body covering the light emitting element may be provided with a microscopic concave and convex pattern. This is expected to improve the light extraction efficiency. In embodiment 3, after the light emitting element is encapsulated with a resin, a concave and convex pattern may be formed at the surface of the light-transmissive member covering the light emitting element basically in a non-contact manner. In this embodiment also, after the light-transmissive member is provided with the concave and convex pattern, the resin forming the light-transmissive member is in a cured state. Therefore, even if a process performed at a high temperature such as reflow or the like is performed, the shape of concave and convex pattern at the surface of the light-transmissive member can be maintained.

As described above, according to the embodiments of the present disclosure, after the light emitting element is encapsulated, the surface of the light-transmissive component covering the light emitting element may be provided with a microscopic concave and convex pattern basically in a non-contact manner. As can be seen from the examples described above with reference to FIG. 41 through FIG. 49, the target to be provided with such a pattern or shape by being irradiated with ultraviolet rays is not limited to a plate-like member. The target to be provided with such a pattern or shape by being the irradiated with the ultraviolet rays may have a shape having a curved surface, for example, a dome shape or the like. According to the embodiments of the present disclosure, after the light-transmissive component covering a light emitting element is formed by potting, compression molding or the like, the surface of the component may be provided with a microscopic concave and convex pattern.

EXAMPLES

Example 1-1

A samples of each of example 1-1 through example 1-3 was produced in accordance with the following procedure. The shape of the surface of each of the samples before the irradiation with the ultraviolet rays was compared against the shape after the irradiation with the ultraviolet rays.

First, a light-transmissive sheet formed by preliminarily curing a silicone resin containing an organic polysiloxane including a phenyl group in a molecule was prepared. In this example, a silicone resin commercially available from Shin-Etsu Chemical Co., Ltd. (KE-1011) was shaped into a sheet by screen printing. Then, the sheet was heated at a temperature of 150° C. for 0.5 hours to preliminarily cure the silicone resin. Thus, a light-transmissive sheet having a thickness of 100 µm was formed. Separately, a photomask including a plurality of light-blocking regions formed of chromium was prepared. The light-blocking regions were circles having a diameter of 9 µm. The light-blocking regions were arrayed in a principal surface of the photomask such that centers thereof were located at lattice points of a triangular lattice. The distance between the centers of two light-blocking regions adjacent to each other was 15 µm.

Next, the photomask was located on one of principal surfaces of the light-transmissive sheet, and the principal surface of the light-transmissive sheet was irradiated with ultraviolet rays through the photomask by an ultraviolet ray irradiation device including an ultraviolet light source that emits light having a highest peak wavelength of 365 nm. The ultraviolet rays used had a spectrum expanding over a wavelength range of UVA to UVC. The amount of the ultraviolet rays used for the irradiation was 210 J/cm$^2$, and the irradiation time was about 300 seconds.

Figure 54:
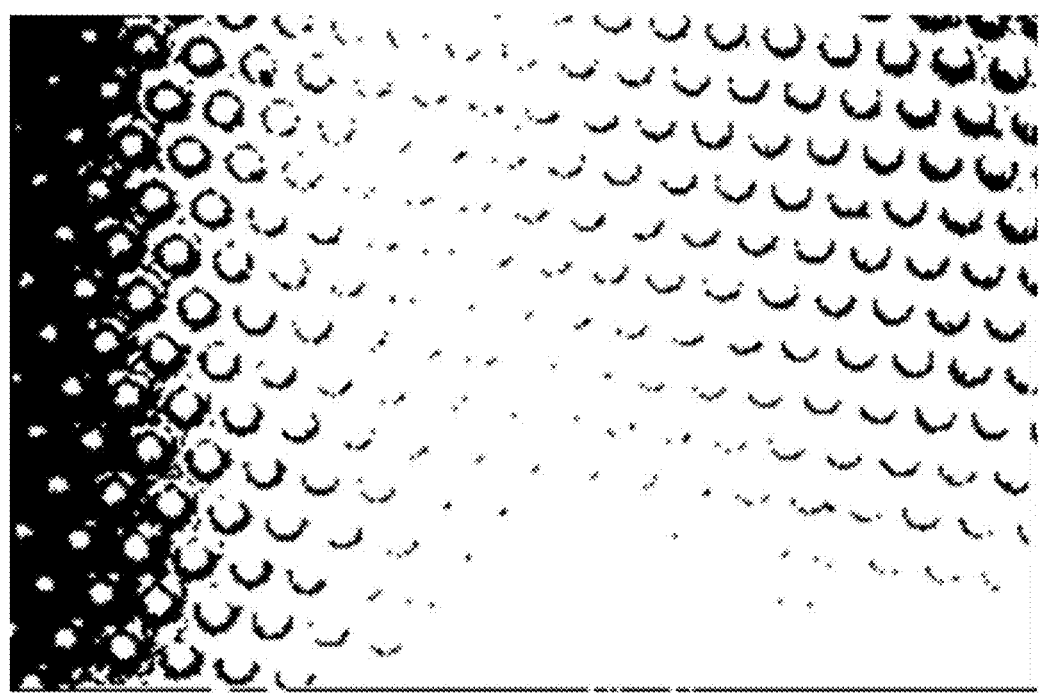
FIG. 54 shows a surface of a sample of example 1-1 in enlargement.
Figure 55:
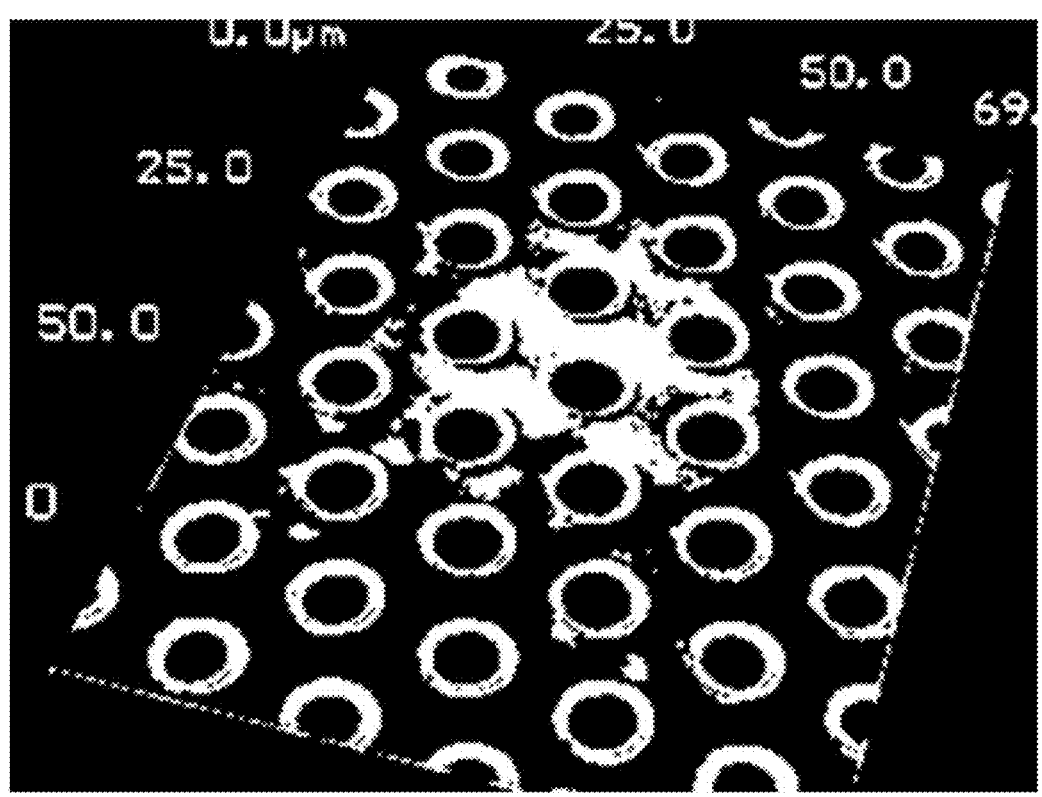
FIG. 55 shows a surface shape of the sample of example 1-1.
Figure 56:
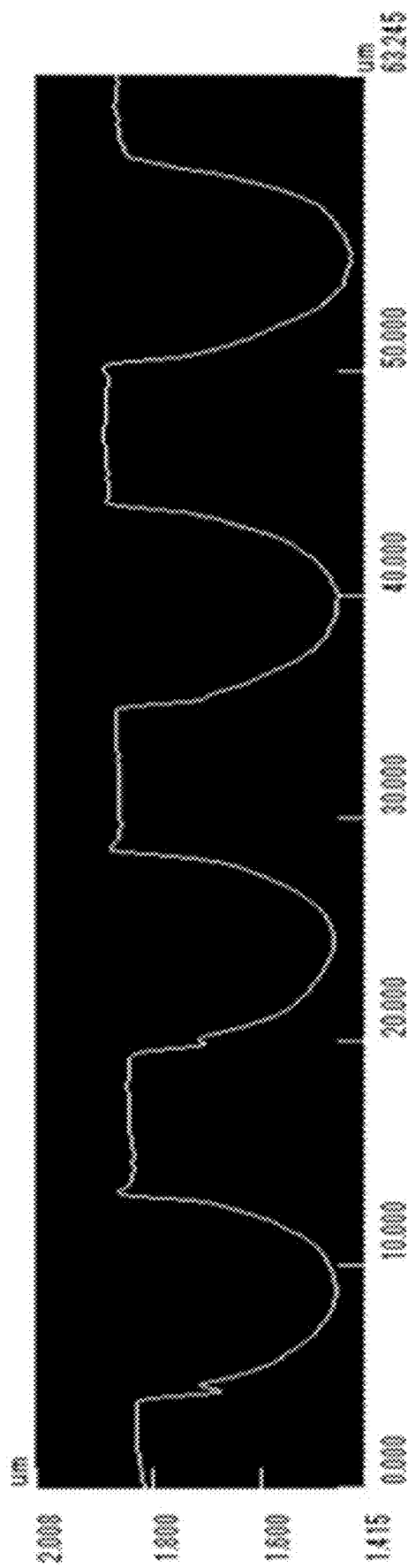
FIG. 56 shows a cross-sectional profile of the sample of example 1-1.

FIG. 54 is a microscopic image showing, in enlargement, a surface of the light-transmissive sheet irradiated with the ultraviolet rays. FIG. 55 and FIG. 56 are each an image, obtained by a laser microscope, showing the surface shape of the light-transmissive sheet irradiated with the ultraviolet rays. FIG. 56 shows a cross-sectional profile of the light-transmissive sheet.

The present inventors examined these results and have found that the surface of the region irradiated with the ultraviolet rays through the photomask is swollen although no detailed mechanism is known. As a result of the surface of the region irradiated with the ultraviolet rays being swollen, as shown in FIG. 54 and FIG. 55, a plurality of concave portions corresponding to the pattern of the light-blocking regions of the photomask are formed at the principal surface of the light-transmissive sheet. It has been found from FIG. 56 that the surface of the light-transmissive sheet is generally flat except for the concave portions and that the concave portions are generally formed of a smooth curved surface. Edges are formed at shoulders connecting the relatively high portions and the concave portions of the surface of the light-transmissive sheet. The concave portions at the surface of the light-transmissive sheet irradiated with the ultraviolet rays had a depth in the range of about 0.24 µm to about 0.43 µm.

Example 1-2

The sample of example 1-2 was produced in substantially the same manner as the sample of example 1-1 except that an uncured silicone resin starting material containing an organic polysiloxane including a D unit (LPS-3541 produced by Shin-Etsu Chemical Co., Ltd.) was used. LPS-3541 contains an organic polysiloxane including a phenyl group in a molecule, like KE-1011 mentioned above. The light-transmissive sheet formed in this example had a thickness of about 100 µm.

Figure 57:
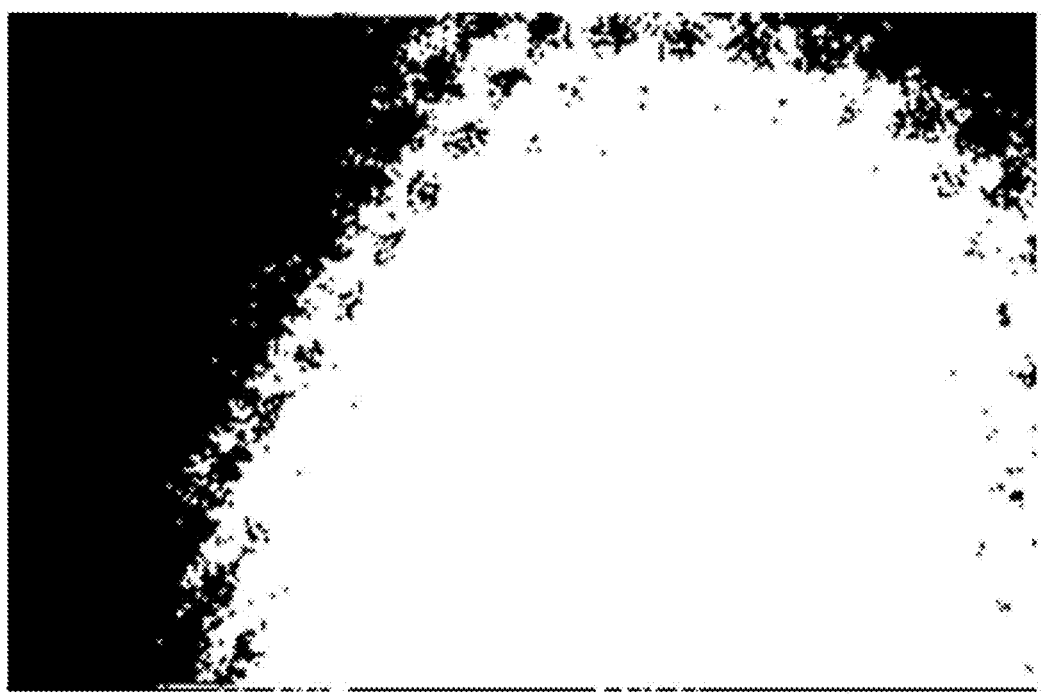
FIG. 57 shows a surface of a sample of example 1-2 in enlargement.
Figure 58:
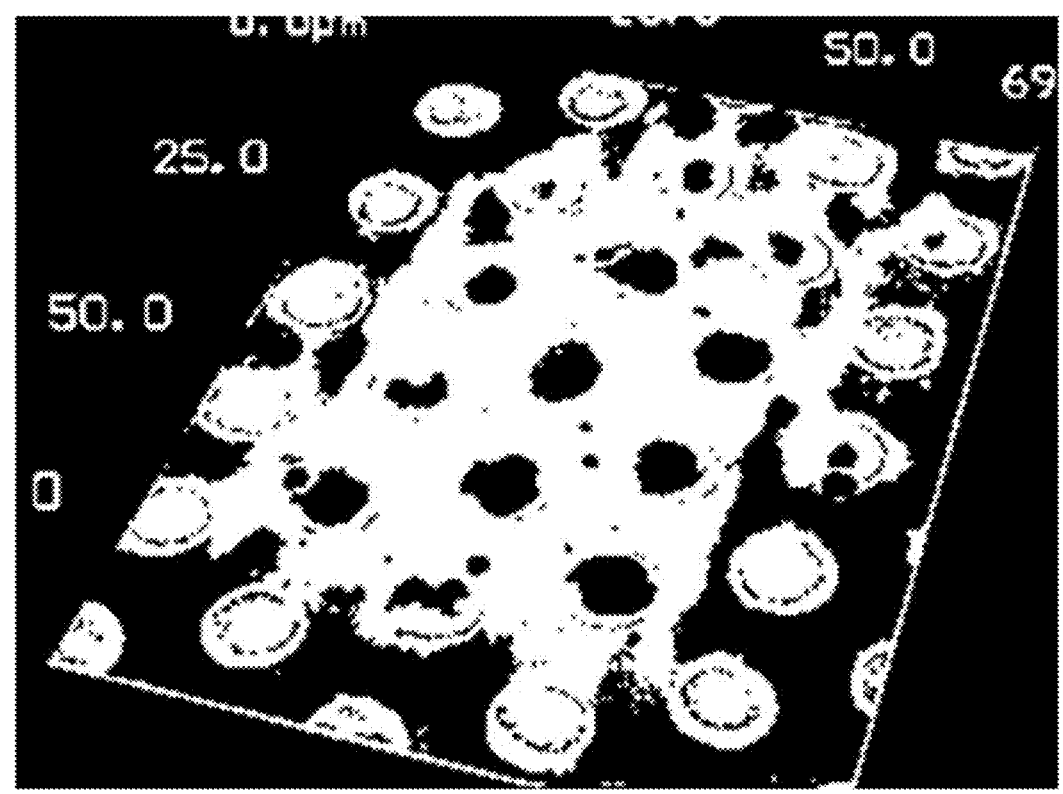
FIG. 58 shows a surface shape of the sample of example 1-2.

FIG. 57 shows a surface of the sample of example 1-2 in enlargement. FIG. 58 shows an image, obtained by a laser microscope, showing the surface shape of the sample of example 1-2. It has been found from FIG. 57 and FIG. 58 that concave portions are formed at positions corresponding to the light-blocking regions of the photomask by irradiating a part of the light-transmissive sheet with the ultraviolet rays, like in the sample of example 1-1. The concave portions at the surface of the light-transmissive sheet irradiated with the ultraviolet rays had a depth in the range of about 0.10 µm to about 0.12 µm.

Example 1-3

YAG phosphor powder (average particle size: 10.5 µm) was mixed into a silicone resin, so that a silicone resin starting material having the YAG phosphor powder dispersed therein was prepared. As the silicone resin, LPS-3541 mentioned above was used. The content of the YAG phosphor powder in the silicone resin starting material was 46% by mass. The sample of example 1-3 was produced in substantially the same manner as the sample of example 1-1 except that the silicone resin starting material having the YAG phosphor powder dispersed therein was shaped into a sheet and preliminarily cured to form a light-transmissive sheet. The light-transmissive sheet formed in this example had a thickness of about 100 µm.

Figure 59:
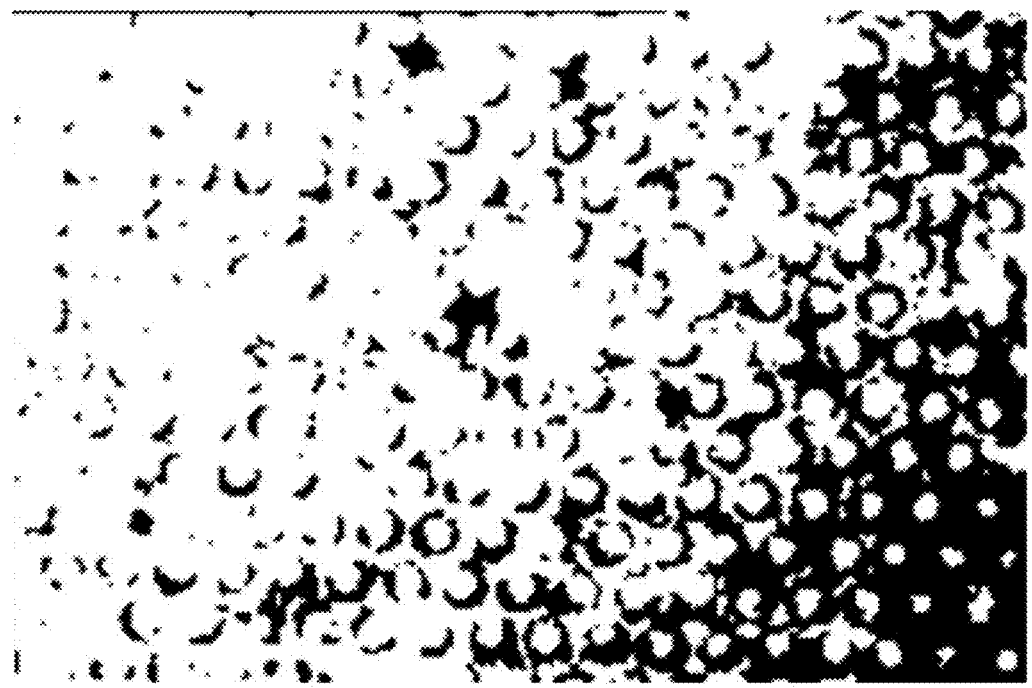
FIG. 59 shows a surface of a sample of example 1-3 in enlargement.
Figure 60:
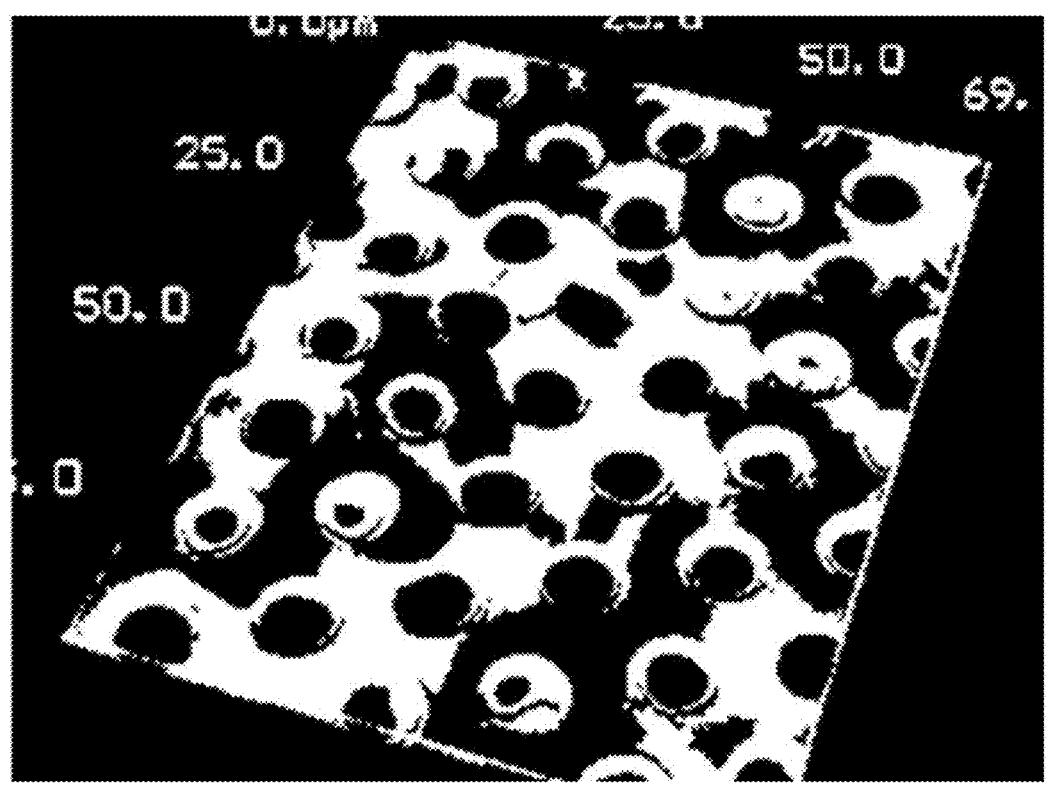
FIG. 60 shows a surface shape of the sample of example 1-3.

FIG. 59 shows a surface of the sample of example 1-3 in enlargement. FIG. 60 shows an image, obtained by a laser microscope, showing the surface shape of the sample of example 1-3. It has been found from FIG. 59 and FIG. 60 that even in the case in which the light-transmissive sheet is formed of a material having the phosphor powder dispersed therein, concave portions are formed at positions corresponding to the light-blocking regions of the photomask by irradiating a part of the light-transmissive sheet with the ultraviolet rays, like in the sample of example 1-1 and the sample of example 1-2. The concave portions at the surface of the light-transmissive sheet irradiated with the ultraviolet rays had a depth in the range of about 0.45 µm to about 0.92 µm.

Next, the influence of heat on the shape at the surface of the resin sheet was investigated by the following procedure.

Reference Example 2-1, Reference Example 2-2

First, silicone resin LPS-3541 mentioned above was shaped into a sheet by screen printing, and was heated at a temperature of 150° C. for 4 hours to form a resin sheet having a thickness of 150 µm. Next, a die having a plurality of protrusions at a surface thereof was prepared. One principal surface of the resin sheet and the surface of the die provided with the protrusions were located to face each other, and the die was pressed onto the principal surface of the resin sheet at a pressure of 5 MPa by use of a heat press device in a state in which the ambient temperature was raised to 300° C. As a result, a plurality of concave portions were formed at the principal surface of the resin sheet. The die used in this example had conical protrusions having a height of 1.5 µm arrayed two-dimensionally. These protrusions were arrayed two-dimensionally on the surface of the die such that apexes thereof were located at lattice points of a triangular lattice. The distance between the apexes of two protrusions adjacent to each other was 3 µm.

Figure 61:
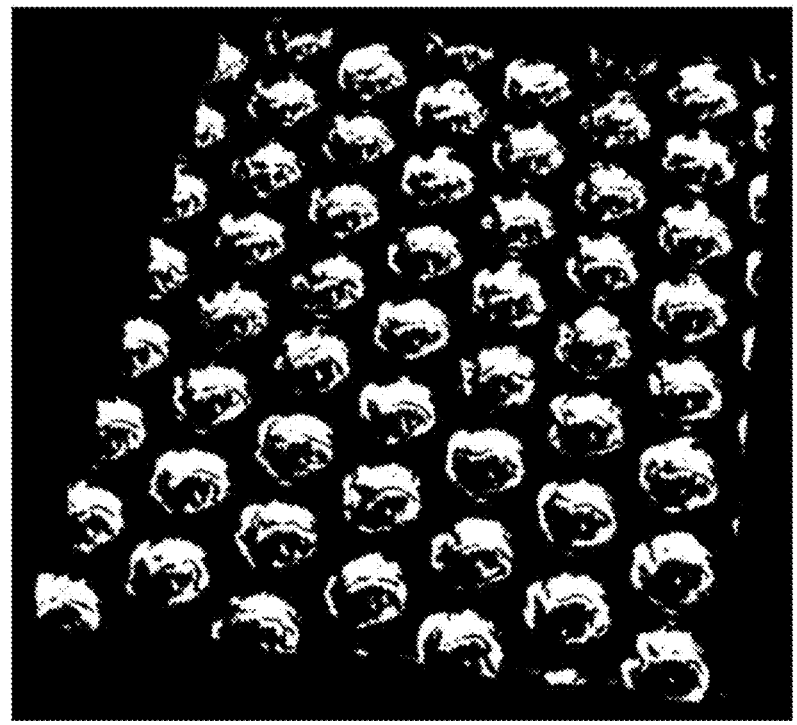
FIG. 61 shows a surface shape of a resin sheet after a die is separated therefrom.

FIG. 61 shows a surface shape of the resin sheet after the die was separated therefrom. The concave portions formed at the surface of the resin sheet had a depth in the range of about 0.9 µm to about 1.1 µm. Next, the resin sheet was cut into two sheets. Regarding one of the two sheets, the surface provided with the concave portions was irradiated with ultraviolet rays by use of the ultraviolet ray irradiation device used to form the sample of example 1-1, with an irradiation amount of 22.4 J/cm$^2$ for an irradiation time of about 30 seconds. The other sheet was not irradiated with ultraviolet rays after the concave portions were formed.

The two sheets were placed in an electric furnace, and kept at a temperature of 300° C. for 40 minutes. Then, the two sheets were removed from the electric furnace, and were cooled down to room temperature by natural air. The sheet irradiated with the ultraviolet rays by use of the ultraviolet ray irradiation device was set as a sample of reference example 2-1, and the sheet not irradiated with the ultraviolet rays by use of the ultraviolet ray irradiation device was set as a sample of reference example 2-2.

Figure 62:
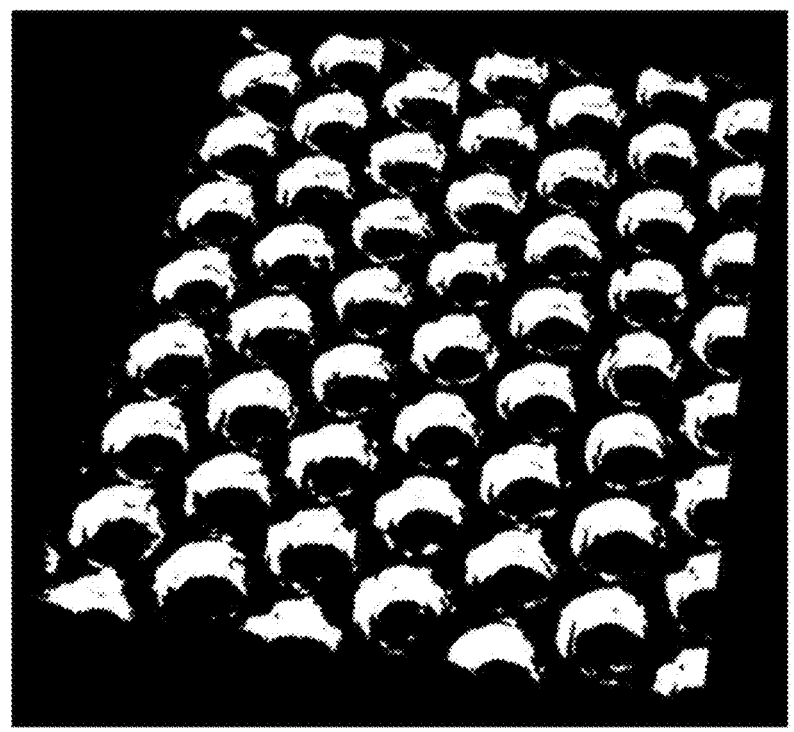
FIG. 62 shows a surface shape of a sample of reference example 2-1.

FIG. 62 shows a surface shape of the sample of reference example 2-1. It has been found from a comparison between FIG. 61 and FIG. 62 that in the case in which the surface, provided with the concave portions as a result of the die being pressed, is irradiated with the ultraviolet rays, the shape of the concave portions is maintained even after the heating is performed at about 300° C. The depth of the concave portions formed at the surface of the sample of reference example 2-1 was in the range of about 0.9 µm to about 1.1 µm. In other words, the change in the depth was about 25% or lower after the heating.

Figure 63:
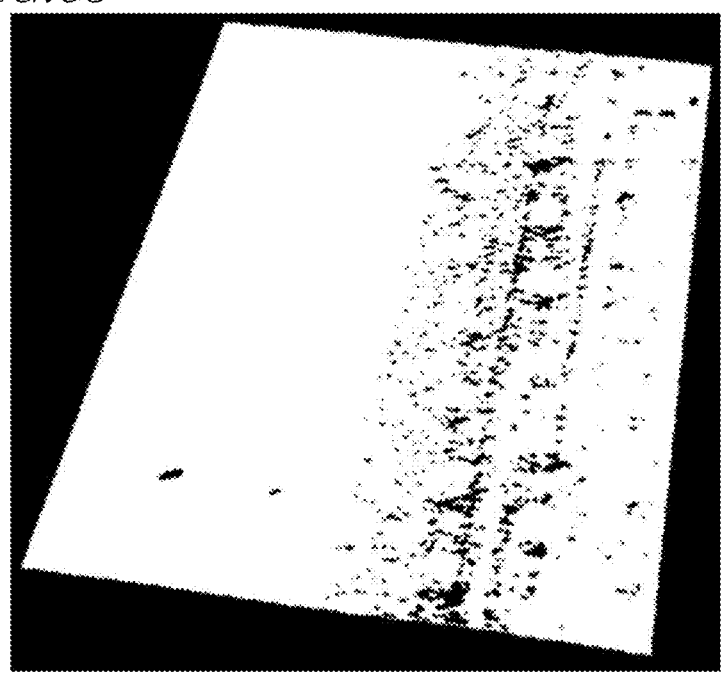
FIG. 63 shows a surface shape of a sample of reference example 2-2.

FIG. 63 shows a surface shape of the sample of reference example 2-2. It has been found from FIG. 63 that in the case in which the irradiation with the ultraviolet rays is not performed, the concave portions formed at the surface by the die being pressed are mostly lost after being heated. The depth of the concave portions left at the surface of the sample of reference example 2-2 was merely about 0.03 µm.

As can be seen from a comparison between FIG. 62 and FIG. 63, in the case in which a surface, having concave portions, of a resin sheet is irradiated with ultraviolet rays of an amount of about 20 J/cm$^2$ or greater, the shape of the concave portions may be maintained even if the resin sheet is exposed to a high temperature (e.g., glass transition point or higher). This is presumed to be caused by a change occurring at the surface or in the vicinity thereof irradiated with the ultraviolet rays.

Reference Example 3

A sample of reference example 3, in which the resin sheet was partially irradiated with ultraviolet rays, was produced. The spectrum of the portion irradiated with the ultraviolet rays and the spectrum of the portion not irradiated with the ultraviolet rays were compared with each other by infrared spectroscopy. The sample of reference example 3 was produced as follows. Silicone resin LPS-3541 mentioned above was preliminarily cured to form a light-transmissive sheet having a thickness of 150 µm, and a part of the light-transmissive sheet was irradiated with ultraviolet rays to produce the sample. Then, the silicone resin in the light-transmissive sheet was fully cured.

Figure 64:
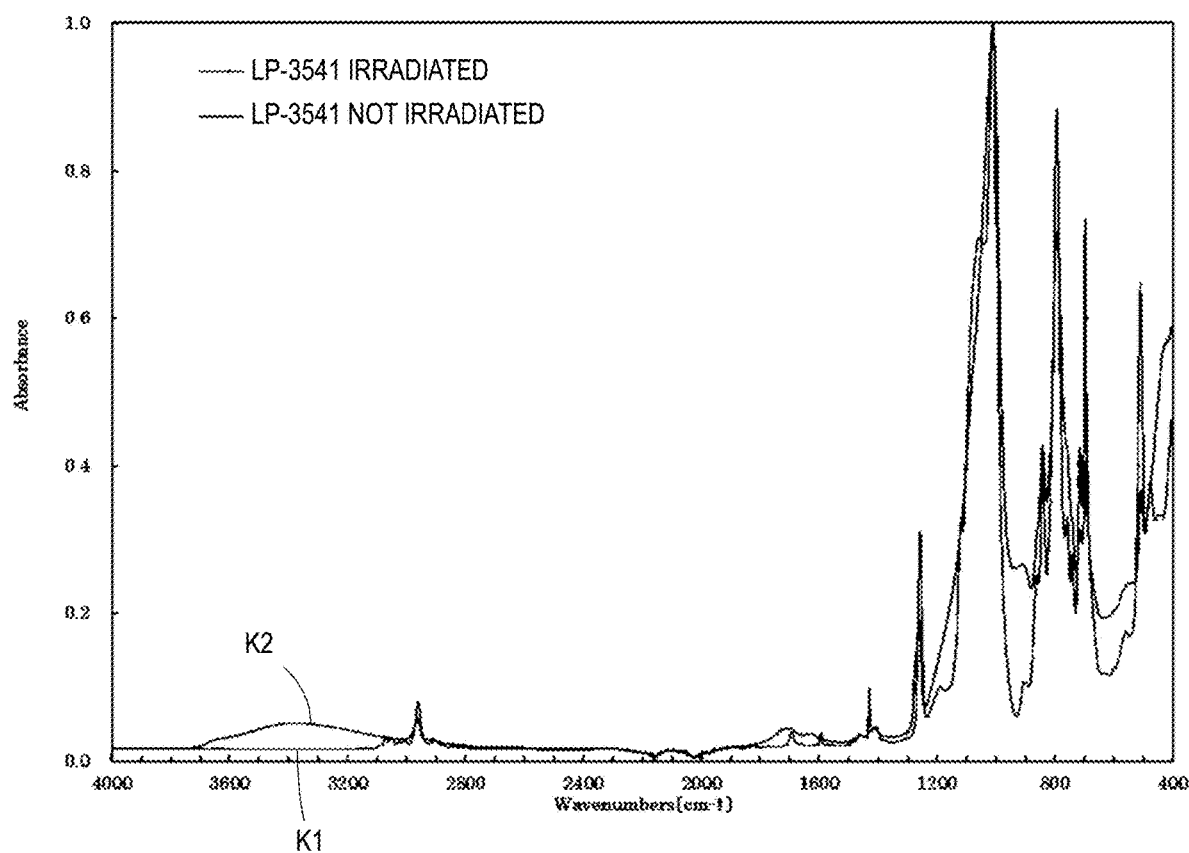
FIG. 64 shows infrared spectra of transmitted light in samples of reference example 3, obtained by use of a Fourier-transform infrared (FT-IR) spectrometer.
Figure 65:
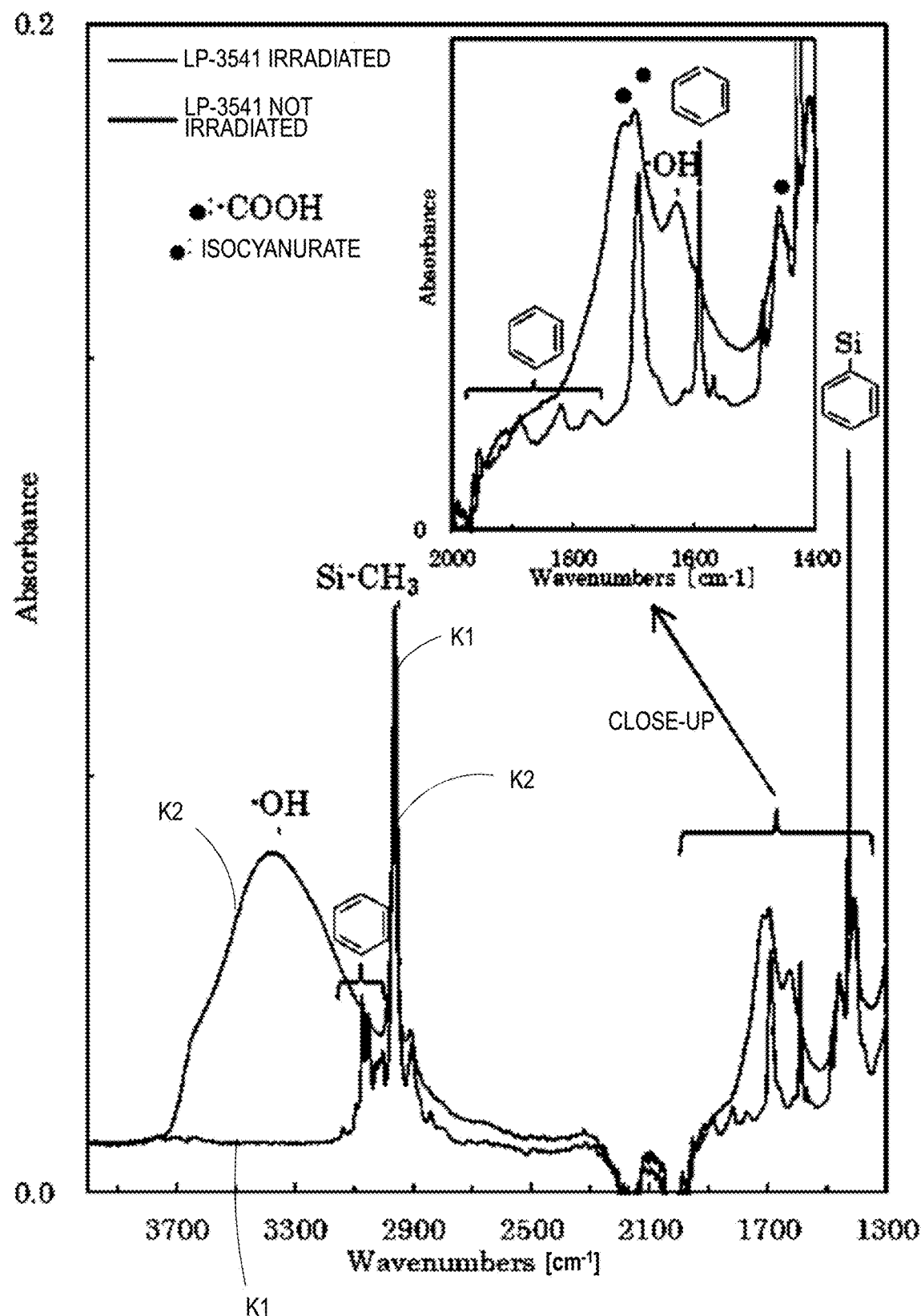
FIG. 65 is a partial enlarged view of FIG. 64 that shows the infrared spectra of transmitted light regarding the sample of reference example 3.
Figure 66:
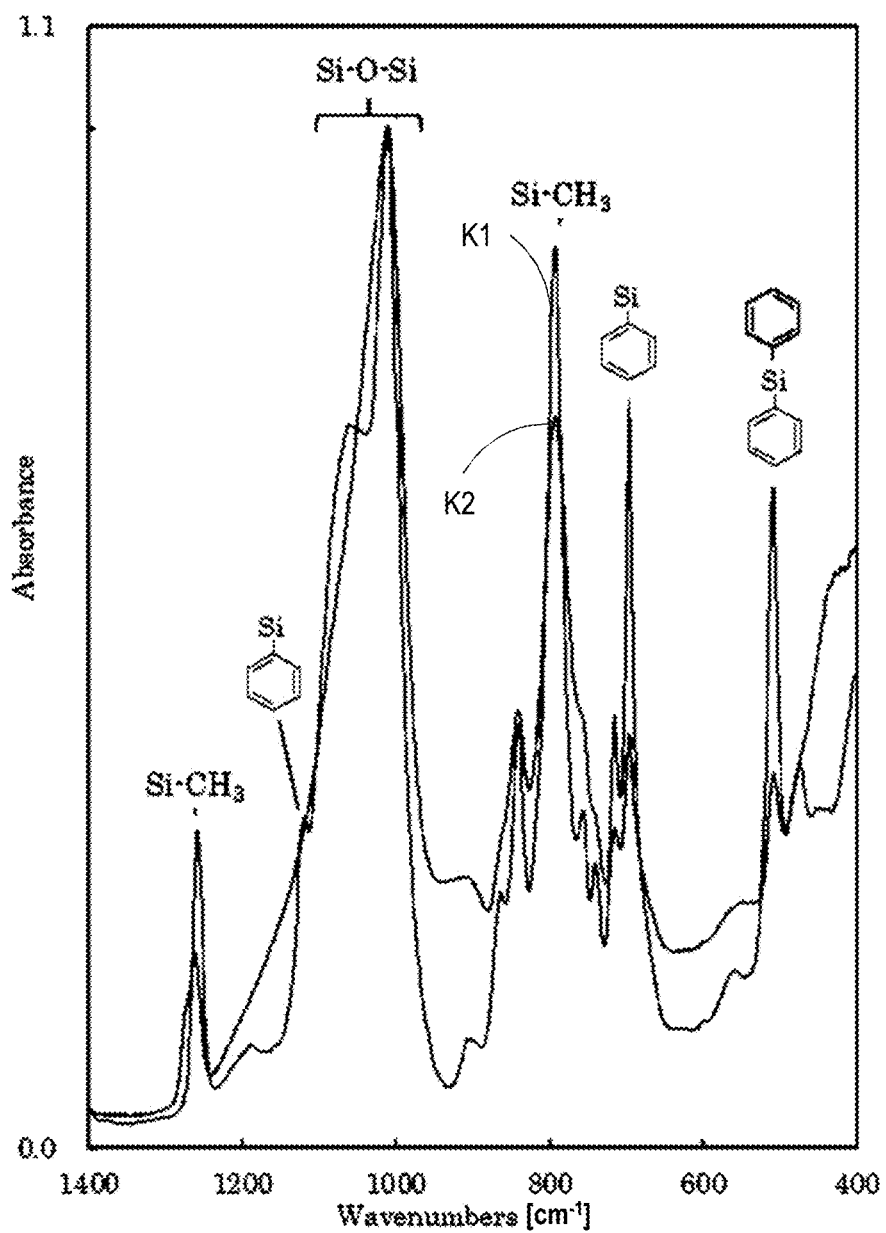
FIG. 66 is a partial enlarged view of FIG. 64 that shows the infrared spectra of transmitted light regarding the sample of reference example 3.

FIG. 64 through FIG. 66 each show infrared spectra of transmitted light in the sample of reference example 3, obtained by use of a Fourier-transform infrared (FT-IR) spectrometer. In FIG. 64 through FIG. 66, curve K1 represents a spectrum in the portion for which the intentional irradiation with the ultraviolet rays was avoided. Curve K2 represents a spectrum in the portion irradiated with the ultraviolet rays intentionally. In this example, a Nicolet iS50 module commercially available from Thermo Fisher Scientific K.K. was used to obtain the infrared spectra.

Now, FIG. 65 will be referred to. FIG. 65 shows, in enlargement, the spectra in the wave number range of 4000 to 1300 cm$^{-1}$ in the spectra of FIG. 64. FIG. 65 also shows, in further enlargement, the spectra in the wave number range of 2000 to 1400 cm$^{-1}$. In the spectra shown in FIG. 65, the wave number range of 3700 to 3000 cm$^{-1}$, which relates to absorption derived from Si—OH, is now paid attention to. As can be seen, an absorption peak appears at a wave number of 3400 cm$^{-1}$ or in the vicinity thereof as a result of the irradiation with the ultraviolet rays, and the absorption in the wave number range of 3700 to 3000 cm$^{-1}$ is increased.

FIG. 66 will be referred to. FIG. 66 shows, in enlargement, the spectra in the wave number range of 1400 to 400 cm$^{-1}$ in the spectra of FIG. 64. An absorption peak at a wave number of 2960 cm$^{-1}$ or the vicinity thereof and an absorption peak at a wave number of 800 cm$^{-1}$ or in the vicinity thereof, which relate to absorption derived from Si—CH$_3$, are now paid attention. As can be seen from FIG. 65 and FIG. 66, these peaks are lowered as a result of the irradiation with the ultraviolet rays. Namely, in a light emitting device in an embodiment according to the present disclosure, the absorption of infrared by the light-transmissive member is basically larger in the wave number range greater than 3700 cm$^{-1}$ and less than 3000 cm$^{-1}$ and is smaller at a wave number of 2960 cm$^{-1}$ and in the vicinity thereof and at a wave number of 800 cm$^{-1}$ and in the vicinity thereof, as compared with the absorption of infrared by the silicone resin for which the intentional irradiation with the ultraviolet rays of an amount of 20 J/cm$^2$ or greater is avoided. Based on this, it is presumed that a change occurs to a very shallow region of the surface of the light-transmissive sheet irradiated with the ultraviolet rays to increase the hardness of a part of the light-transmissive sheet, and as a result, the shape of the concave portions is suppressed from being changed due to the high temperature.

Next, a plurality of samples different in the irradiation amount with ultraviolet rays were produced, and an influence of the irradiation with ultraviolet rays on the tacky property of the surface of the samples was investigated. In this specification, the term "tackiness" is used as not being distinguished from the term "tacky property", and these terms are used as having the same meaning. In this specification, the "tacky property" and the "tackiness" refer to a value obtained by a measurement performed by use of a probe method described below.

First, a resin block having a thickness of 3 mm is formed, and one resin block is cut to prepare a plurality of resin block test pieces having a diameter of 16 mm. A probe is put into contact with a surface of each of these resin blocks by use of a 5966 Dual Column Tabletop Model testing system commercially available from Instron Japan Co. Ltd. Then, the probe is moved at a constant rate, and a force required to separate the probe from the surface of each of the resin blocks is measured. For the measurement, a stainless steel probe including a planar tip and a tip area size of 1800 mm$^2$ is used. The time of contact of the probe with the surface of the resin block is 1 second, and the jog speed of the probe is 9 mm/min. The average of the measurement values obtained for three resin block test pieces prepared as a result of cutting one sheet is set as the measurement value of the tackiness.

Reference Example 3-1

Samples of reference example 3-1 and reference example 3-2 were produced by the following procedure. Silicone LPS-3541 produced by Shin-Etsu Chemical Co., Ltd. was formed into a sheet by screen printing, and was heated at a temperature of 150° C. for 4 hours to form a resin sheet having a thickness of 150 μm in substantially the same manner as in reference example 2-1. In this example, the die was not pressed and thus the resin sheet was not provided with any shape. The resin sheet was cut into a plurality of resin sheet pieces. Among these resin sheet pieces, three resin sheet pieces were extracted randomly. One principal surface of each of the three resin sheet pieces was irradiated with ultraviolet rays of an amount of 240 J/cm$^2$ for an irradiation time of about 30 seconds, like the sample of reference example 2-1. After being irradiated with the ultraviolet rays, the resin sheet pieces were located in an electric furnace and kept at a temperature of 300° C. for 40 minutes. Then, the resin sheet pieces was removed from the electric furnace and cooled down to room temperature by natural air. The resultant resin sheet pieces were set as the samples of reference example 3-1.

Reference Example 3-2

Samples of reference example 3-2 were produced in substantially the same manner as the samples of reference example 3-1 except that the irradiation amount of the ultraviolet rays was 22.4 J/cm$^2$.

Comparative Example

Samples of a comparative example were produced in substantially the same manner as the samples of reference example 3-1 except that the irradiation with the ultraviolet rays was not performed.

Figure 67:
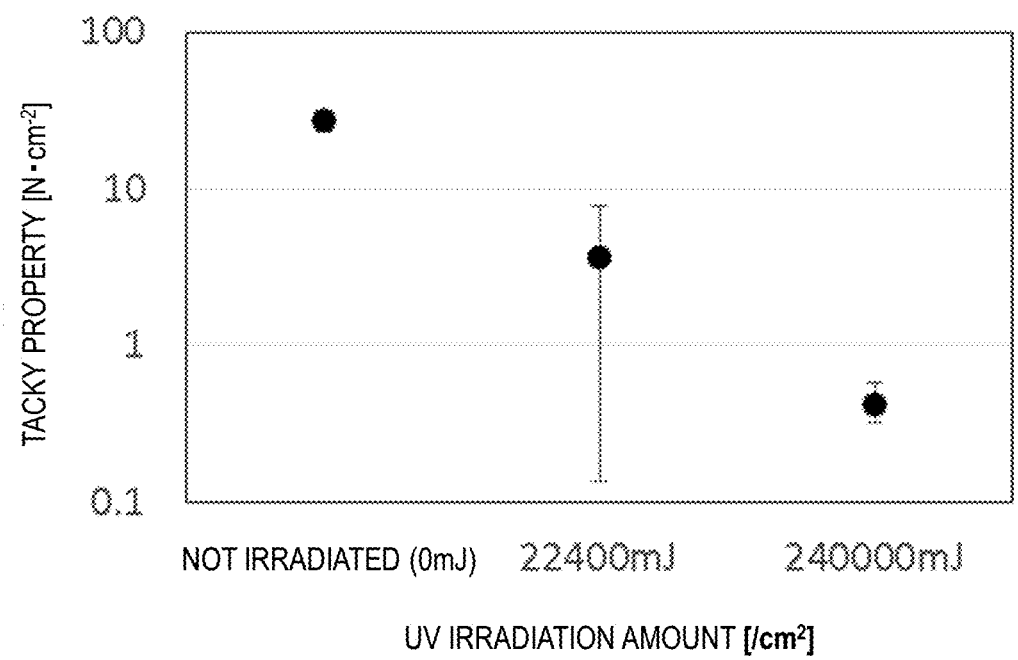
FIG. 67 shows measurement results on tacky property of surfaces of samples of reference example 3-1, reference example 3-2 and the comparative example.

FIG. 67 shows measurement results on the tackiness of the surface of each of the samples of reference example 3-1, reference example 3-2 and comparative example. In FIG. 67, the right plot shows the measurement value of the samples of reference example 3-1, the central plot shows the measurement value of the samples of reference example 3-2, and the left plot shows the measurement value of the samples of the comparative example.

As shown in FIG. 67, the measurement value of tackiness of the surface of the samples of comparative example was approximately in the range of 23 to 32 N·cm$^2$. The samples of reference example 3-2, irradiated with the ultraviolet rays of the amount of 22.4 J/cm$^2$, exhibited a measurement value of tackiness of about 0.1 to about 8 N·cm$^2$. The samples of reference example 3-1, irradiated with the ultraviolet rays of the amount of 240 J/cm$^2$, exhibited a measurement value of tackiness of about 0.3 to about 0.6 N·cm$^2$. Based on this, it is presumed that some change occurred to the surface and/or the vicinity of the surface of the resin sheet formed of a silicone resin as a result the intentional irradiation with the ultraviolet rays. It is presumed that the tackiness of the surface of the resin was decreased by the intentional irradiation with the ultraviolet rays. Based on the results shown in FIG. 67, it has been found that, for example, the tacky property of the surface of a resin body containing a silicone resin, when being irradiated with ultraviolet rays of an amount of about 20 J/cm$^2$ or greater, may be decreased to, for example, 50% of lower of the tacky property of the surface of a silicone resin for which the intentional irradiation with the ultraviolet rays was avoided.

An embodiment according to the present disclosure is applicable to produce an optical element that is, for example, located on or above a front surface of a light source and transmits at least a part of incident light. An embodiment according to the present disclosure is especially useful for producing a light emitting device including a light-transmissive member covering a light emitting element such as an LED or the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for forming a light-transmissive member, the method comprising:
irradiating a principal surface of a cured resin body containing a silicone resin with ultraviolet rays through a photomask comprising one or more light-blocking regions and one or more light-transmissive regions, so as to cause a height of one or more first regions of the principal surface, which correspond to the one or more light-blocking regions of the photomask, to be different than a height of one or more second regions of the principal surface, which correspond to the one or more light-transmissive regions of the photomask,
wherein, in the step of irradiating the principle surface, an irradiation amount of the ultraviolet rays is 20 J/cm$^2$ or greater.

2. The method of claim 1, wherein, after the step of irradiating the principal surface, a difference between the height of the one or more second regions and the height of the one or more first regions is 0.1 μm or greater.

3. The method of claim 1, wherein the silicone resin comprises an organic polysiloxane comprising at least one phenyl group in a molecule.

4. The method of claim 1, wherein the silicone resin comprises an organic polysiloxane comprising a D unit, in which two methyl groups are bonded to a silicon atom.

5. A method for producing a light emitting device, the method comprising:
- a step (a) comprising preparing a light emitting body comprising:
- a light emitting element having a top surface, and
- a light-transmissive resin body formed by curing an uncured silicone resin starting material through heating, the light-transmissive resin body having a principal surface and covering at least the top surface of the light emitting element; and
- a step (b) comprising forming, from the light-transmissive resin body, a light-transmissive member covering at least the top surface of the light emitting element, the light-transmissive member comprising concave and convex pattern at a surface thereof,
- wherein the step (b) comprises a step (b1) comprising irradiating the principal surface of the light-transmissive resin body with ultraviolet rays through a photomask comprising one or more light-blocking regions and one or more light-transmissive regions, so as to cause a height of one or more first regions of the principal surface, which correspond to the one or more light-blocking regions of the photomask, to be different than a height of one or more second regions of the principal surface, which correspond to the one or more light-transmissive regions of the photomask, and
- wherein, in the step (b1), an irradiation amount of the ultraviolet rays is 20 J/cm$^2$ or greater.

6. The method of claim 5, wherein the step (a) comprises:
- a step (a1) comprising preparing the light emitting element, the light emitting element comprising a positive electrode and a negative electrode, both located at a side of the light emitting element opposite the top surface,
- a step (a2) comprising applying an uncured light-transmissive resin material on the top surface of the light emitting element or a surface of the light-transmissive resin body, and
- a step (a3) comprising curing the light-transmissive resin material to locate the light-transmissive resin body above the top surface of the light emitting element.

7. The method of claim 5,
wherein the step (a) comprises:
- a step (a1) comprising preparing the light emitting element; and
- a step (a2) comprising covering the light emitting element with an uncured silicone resin starting material, and curing the silicone resin starting material to form the resin body.

8. The method of claim 5, further comprising, between step (a) and the step (b), a step (c) comprising forming a light-reflective member covering at least a side surface of the light emitting element.

9. The method of claim 5, wherein the resin body comprises an organic polysiloxane comprising at least one phenyl group in a molecule.

10. The method of claim 5, wherein the resin body comprises an organic polysiloxane comprising a D unit, in which two methyl groups are bonded to a silicon atom.

11. The method of claim 5, wherein, after the step (b1), a difference between the height of the one or more second regions and the height of the one or more first regions is 0.1 µm or greater.

12. A method for producing a light emitting device, the method comprising:
- a step (a) comprising preparing a light emitting element having a top surface, the light emitting element comprising a positive electrode and a negative electrode, both located at a side of the light emitting element opposite the top surface; and
- a step (b) comprising forming a light-transmissive member covering at least the top surface of the light emitting element, the light-transmissive member comprising a concave and convex pattern at a surface thereof,
- wherein the step (b) comprises a step (b1) of irradiating a surface of a light-transmissive resin body formed by curing an uncured silicone resin starting material by heating, with ultraviolet rays through a photomask comprising one or more light-blocking regions and one or more light-transmissive regions, so as to cause a height of one or more first regions of the surface, which correspond to the one or more light-blocking regions of the photomask, to be different from a height of one or more second regions of the surface, which correspond to the one or more light-transmissive region of the photomask, and
- wherein, in the step (b1), an irradiation amount of the ultraviolet rays is 20 J/cm$^2$ or greater.

13. The method of claim 12, further comprising, between the step (a) and the step (b), a step (c) comprising forming a light-reflective member covering at least a side surface of the light emitting element.

14. The method of claim 12, wherein the resin body comprises an organic polysiloxane comprising at least one phenyl group in a molecule.

15. The method of claim 12, wherein the resin body comprises an organic polysiloxane comprising a D unit, in which two methyl groups are bonded to a silicon atom.

16. The method of claim 12, wherein, after the step (b1), a difference between the height of the one or more second regions and the height of the one or more first regions is 0.1 µm or greater.

17. A method for producing a light emitting device, the method comprising:
- a step (a) comprising preparing a light emitting element having a top surface and comprising a positive electrode and a negative electrode, both located at a side opposite the top surface; and
- a step (b) comprising forming a light-transmissive member covering at least the top surface of the light emitting element, the light-transmissive member comprising a concave and convex pattern at a surface thereof;
- wherein the step (b) comprises:
- a step (b1) comprising irradiating a principal surface of a light-transmissive sheet formed by curing an uncured silicone resin starting material, with ultraviolet rays through a photomask comprising one or more light-blocking regions and one or more light-transmissive regions, so as to cause a height of one or more first regions of the principal surface, which corresponds to the one or more light-blocking regions of the photomask, to be different from a height of one or more second regions of the principal surface, which correspond to the one or more light-transmissive regions of the photomask; and
- a step (b2) comprising locating the light-transmissive sheet irradiated with the ultraviolet rays on a side of the top surface of the light emitting element,
- wherein, in the step (b1), an irradiation amount of the ultraviolet rays is 20 J/cm$^2$ or greater.

18. The method of claim 17, further comprising, after the step (b), a step (c) comprising, forming a light-reflective member covering at least a side surface of the light emitting element.

19. The method of claim 17, wherein the light-transmissive member comprises an organic polysiloxane comprising at least one phenyl group in a molecule.

20. The method of claim 17, wherein the light-transmissive member comprises an organic polysiloxane comprising a D unit, in which two methyl groups are bonded to a silicon atom.

21. The method of claim 17, wherein, after the step (b1), a difference between the height of the one or more second regions and the height of the one or more first regions is 0.1 μm or greater.

\* \* \* \* \*